United States Patent
Kim et al.

(10) Patent No.: US 10,871,098 B2
(45) Date of Patent: Dec. 22, 2020

(54) THERMOELECTRIC GENERATION APPARATUS, HEAT GENERATION APPARATUS FOR FUEL STORAGE TANKS, AND WASTE HEAT RECOVERY SYSTEM

(71) Applicant: SAMSUNG HEAVY IND. CO., LTD., Seoul (KR)

(72) Inventors: Jae-Gwan Kim, Gyeongsangnam-do (KR); Yong-Kyu Kim, Gyeongsangnam-do (KR); Dong-Kil Lee, Gyeongsangnam-do (KR); Ho-Ki Lee, Gyeongsangnam-do (KR)

(73) Assignee: SAMSUNG HEAVY IND. CO., LTD., Seoul (KR)

( * ) Notice: Subject to any disclaimer, the term of this patent is extended or adjusted under 35 U.S.C. 154(b) by 54 days.

(21) Appl. No.: 15/750,498

(22) PCT Filed: Aug. 6, 2015

(86) PCT No.: PCT/KR2015/008238
§ 371 (c)(1),
(2) Date: Feb. 5, 2018

(87) PCT Pub. No.: WO2017/022874
PCT Pub. Date: Feb. 9, 2017

(65) Prior Publication Data
US 2019/0024561 A1    Jan. 24, 2019

(51) Int. Cl.
*F01N 5/02* (2006.01)
*F02G 5/02* (2006.01)
(Continued)

(52) U.S. Cl.
CPC ............. *F01N 5/025* (2013.01); *F01N 5/02* (2013.01); *F02G 5/02* (2013.01); *F27D 17/004* (2013.01);
(Continued)

(58) Field of Classification Search
CPC ........ F01N 2240/02; F01N 5/02; F01N 5/025; F02G 5/02; F02G 5/00; F27D 17/004;
(Continued)

(56) References Cited

U.S. PATENT DOCUMENTS 9,003,784 B2 * 4/2015 Limbeck ................. H01L 35/30
136/201
2008/0316784 A1 * 12/2008 Cebry ................. H03K 19/0033
363/126

FOREIGN PATENT DOCUMENTS

JP          2010-242700          10/2010
KR     20100058298 A  *  6/2010
(Continued)

OTHER PUBLICATIONS

Molina et al., Application of Thermoelectric Generators in Distributed Generation, 2009, Tercer Congreso Nacional—Segundo Congreso Iberoamericano Hidrógeno y Fuentes Sustentables de Energía—HYFUSEN 2009, https://pdfs.semanticscholar.org/f39d/60f51a0b4ad565e0546a78d20c31e864a55f.pdf (Year: 2009).*
(Continued)

*Primary Examiner* — Elizabeth J Martin
*Assistant Examiner* — Chang H Park
(74) *Attorney, Agent, or Firm* — Ladas & Parry, LLP

(57) ABSTRACT

Disclosed are a thermoelectric generation apparatus, a heat generation apparatus for fuel storage tanks, and a waste heat recovery system. The thermoelectric generation apparatus according to an embodiment of this disclosure includes a first piping through which a fluid flows, a second piping through which a cooling medium of a lower temperature than the fluid flows so as to radiate the heat of the fluid, a plurality of first radiating fins having one side in contact with air of a lower temperature than the fluid so as to radiate the heat of the fluid and the other side in contact with the second piping, and a thermoelectric generation module provided (Continued)

between the first piping and the second piping to produce electricity through a temperature difference between the first piping and the second piping.

5 Claims, 44 Drawing Sheets

(51) Int. Cl.
*F27D 17/00* (2006.01)
*H01L 35/30* (2006.01)
*H01L 35/32* (2006.01)

(52) U.S. Cl.
CPC .............. *H01L 35/30* (2013.01); *H01L 35/32* (2013.01); *F01N 2240/02* (2013.01); *Y02T 10/12* (2013.01)

(58) Field of Classification Search
CPC ......... H01L 35/30; H01L 35/32; Y02T 10/16; F24D 2200/16; F24D 2200/26; F25B 27/02
See application file for complete search history.

(56) References Cited

FOREIGN PATENT DOCUMENTS

| KR | 10-2010-0120339 | | 11/2010 |
|----|----|----|----|
| KR | 10-2011-0001834 | | 1/2011 |
| KR | 10-2011-0073101 | | 6/2011 |
| KR | 10-2011-0136489 | | 12/2011 |
| KR | 20110136489 A | * | 12/2011 |
| KR | 10-2012-0039154 | | 4/2012 |
| KR | 10-1310312 | | 9/2013 |
| KR | 101310312 B1 | * | 9/2013 |
| KR | 10-2015-0107256 | | 9/2015 |
| KR | 10-2015-0109655 | | 10/2015 |
| KR | 10-2015-0109829 | | 10/2015 |

OTHER PUBLICATIONS

Dag Pike, The case for multiple engines, 2011, The Motor Ship, https://www.motorship.com/news101/engines-and-propulsion/the-case-for-multiple-engines (Year: 2011).*

Digi-Key, Thermoelectric Energy Generation Takes Flight for Aircraft and Spacecraft Monitoring, 2014, Digi-Key's European Editors, https://www.digikey.com/en/articles/techzone/2014/apr/thermoelectric-energy-generation-takes-flight-for-aircraft-and-spacecraft-monitoring (Year: 2014).*

Office Action dated Sep. 18, 2019 for Chinese Patent Application No. 201580082271.9 and its English translation provided by Applicant's foreign counsel.

International Search Report for PCT/KR2015/008238 dated May 3, 2016 and its English translation from WIPO.

Written Opinion of the International Searching Authority for PCT/KR2015/008238 dated May 3, 2016 and its English machine translation by Google Translate.

Office Action dated Dec. 28, 2018 for Chinese Patent Application No. 201580082271.9 and its English machine translation by Global Dossier.

International Preliminary Report on Patentability (Chapter I) for PCT/KR2015/008238 dated Feb. 6, 2018 and its English machine translation from WIPO.

* cited by examiner

[FIG. 1]
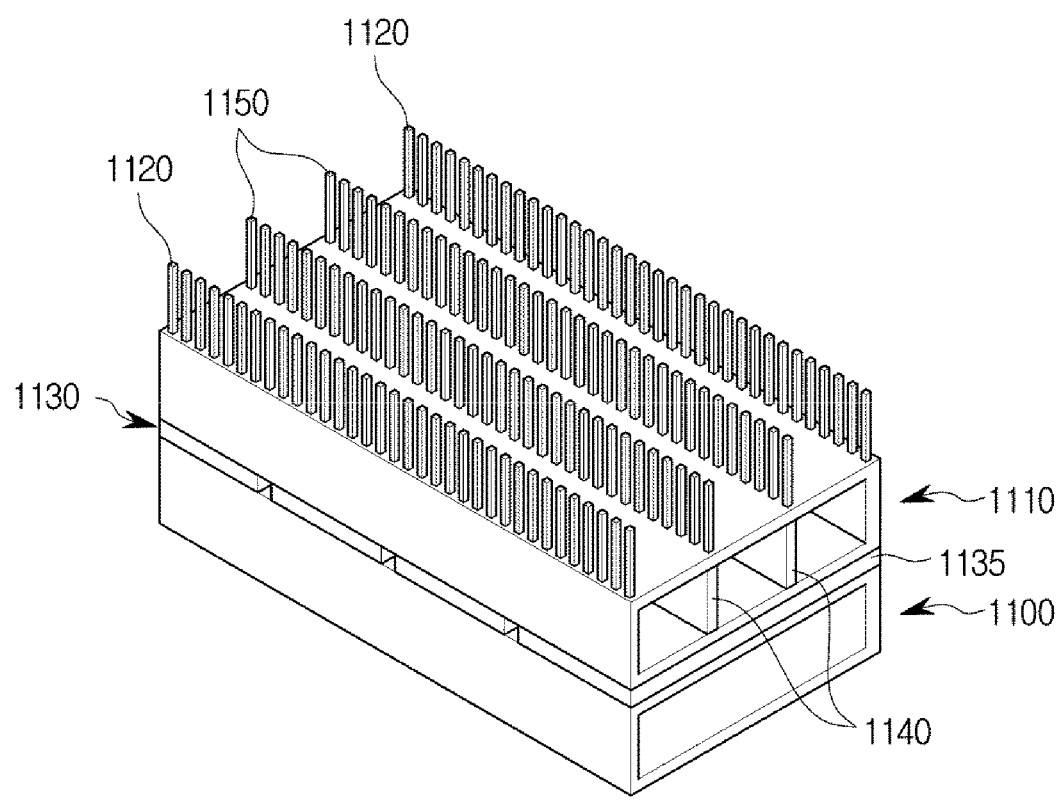

[FIG. 2]
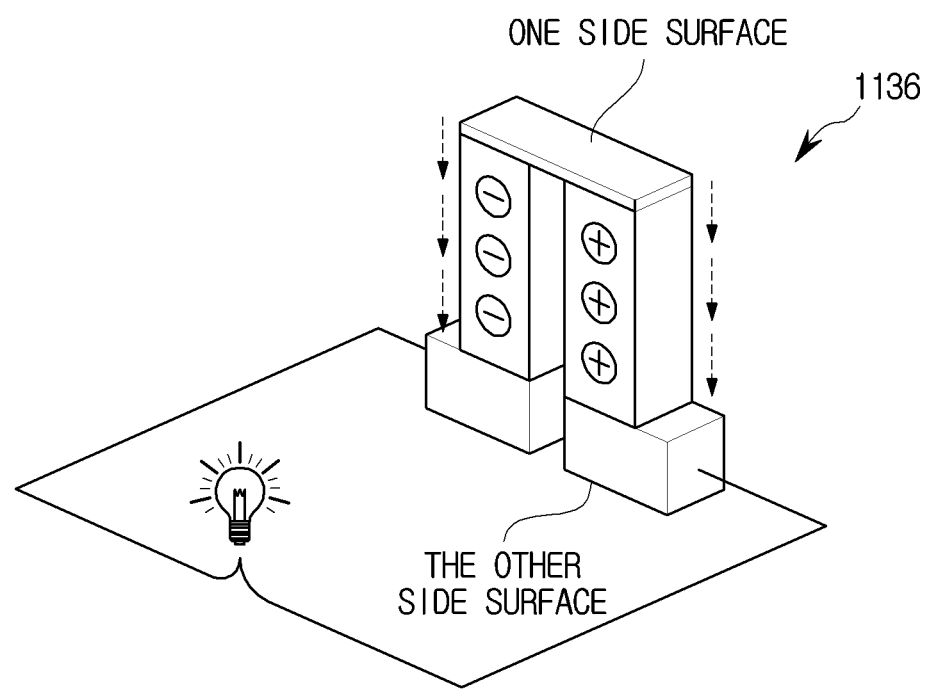

[FIG. 3]
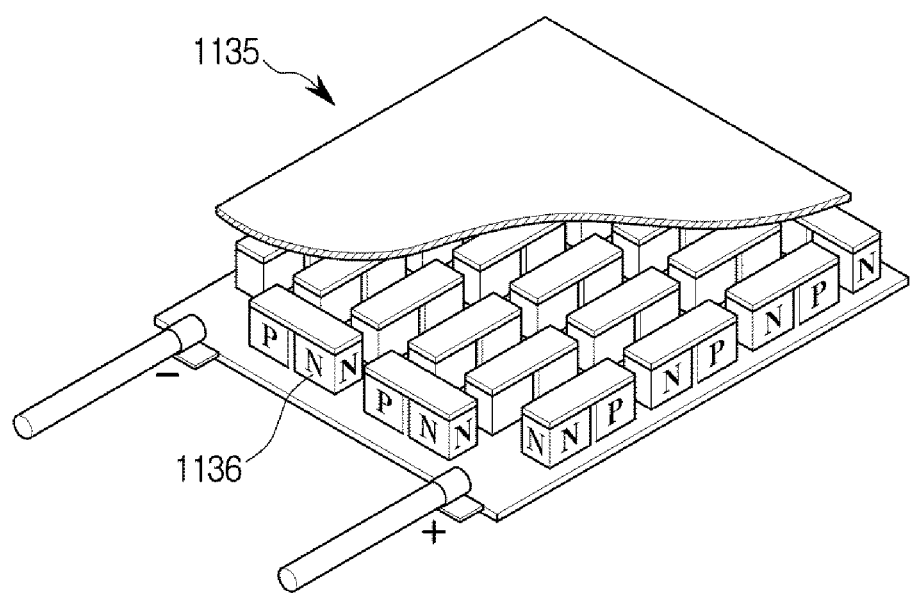

[FIG. 4]
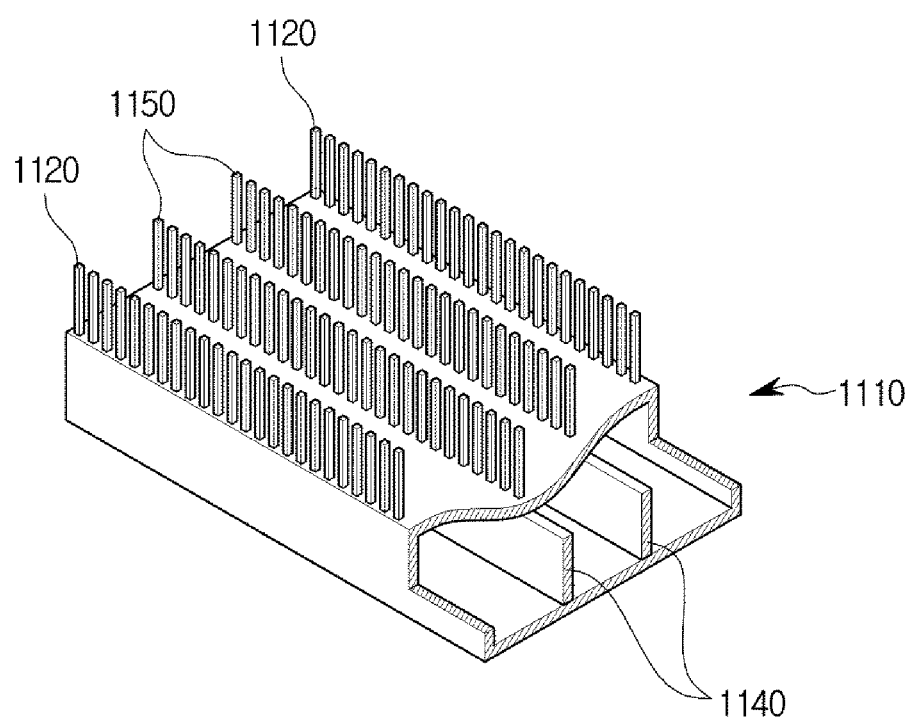

[FIG. 5]
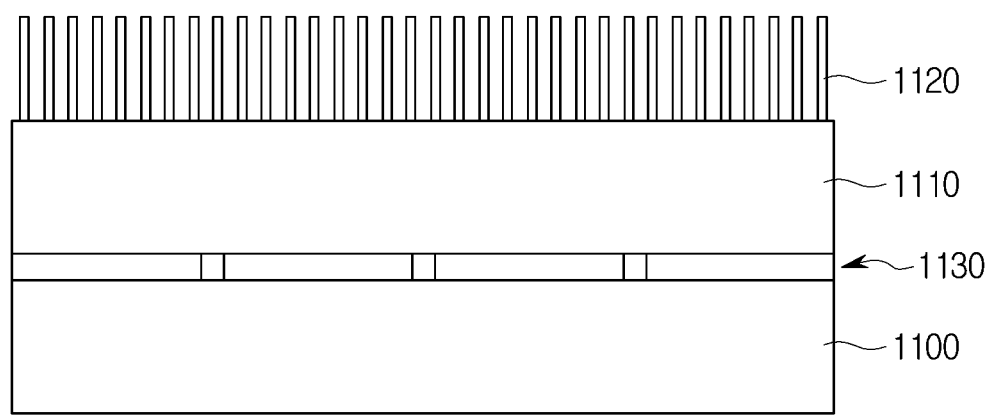

[FIG. 6]
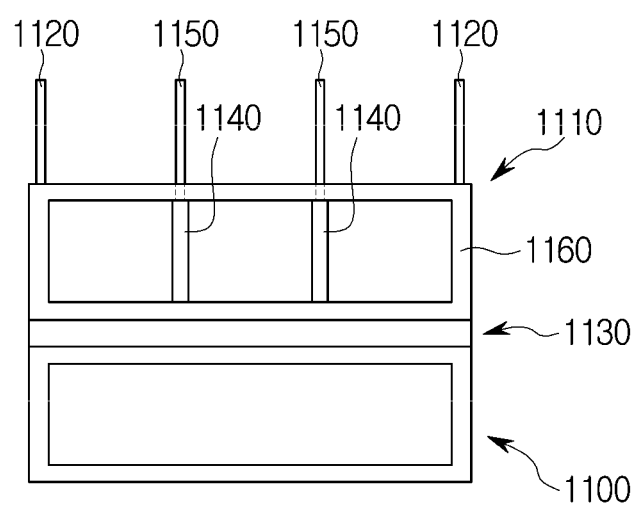

[FIG. 7]
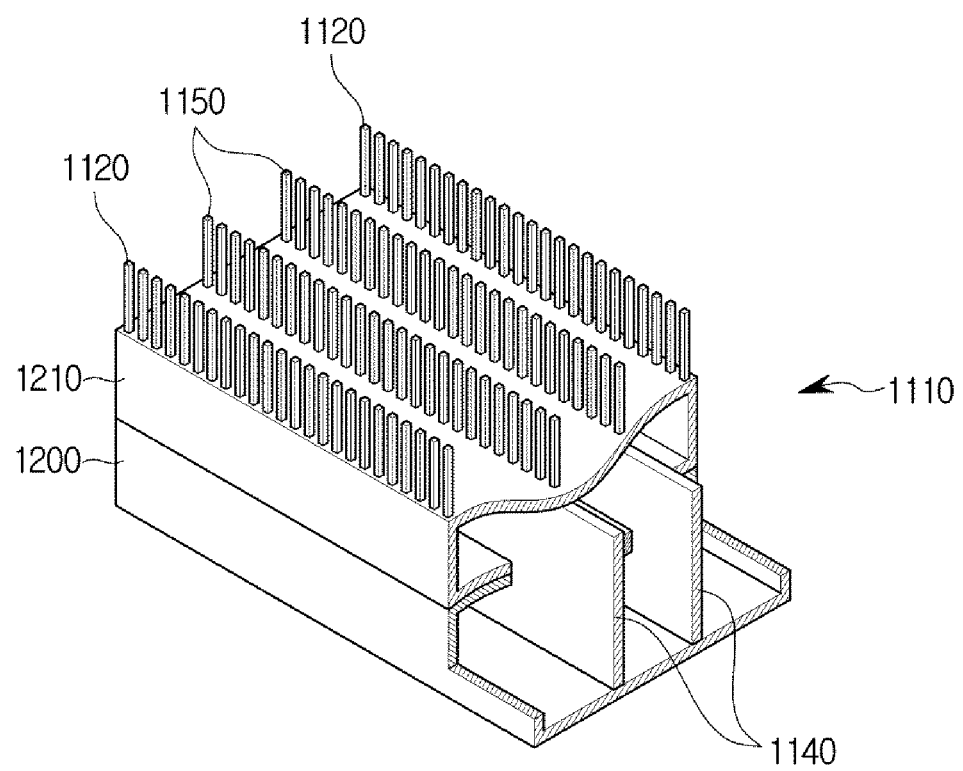

【FIG. 8】
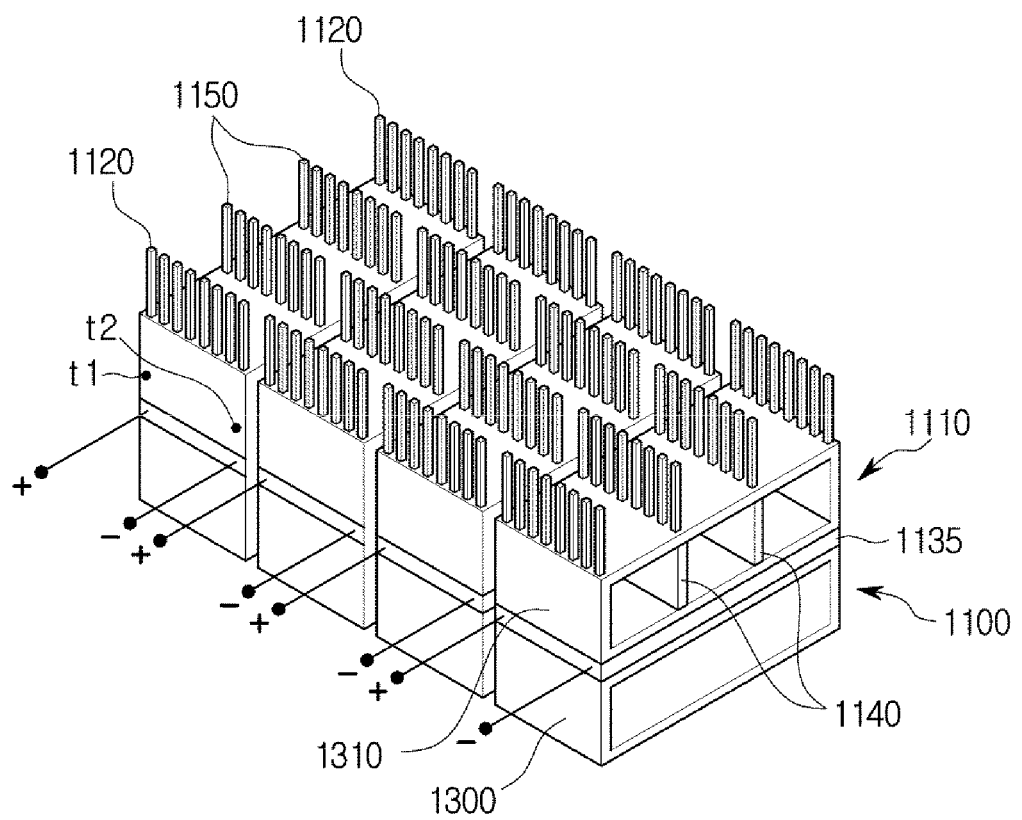

[FIG. 9]
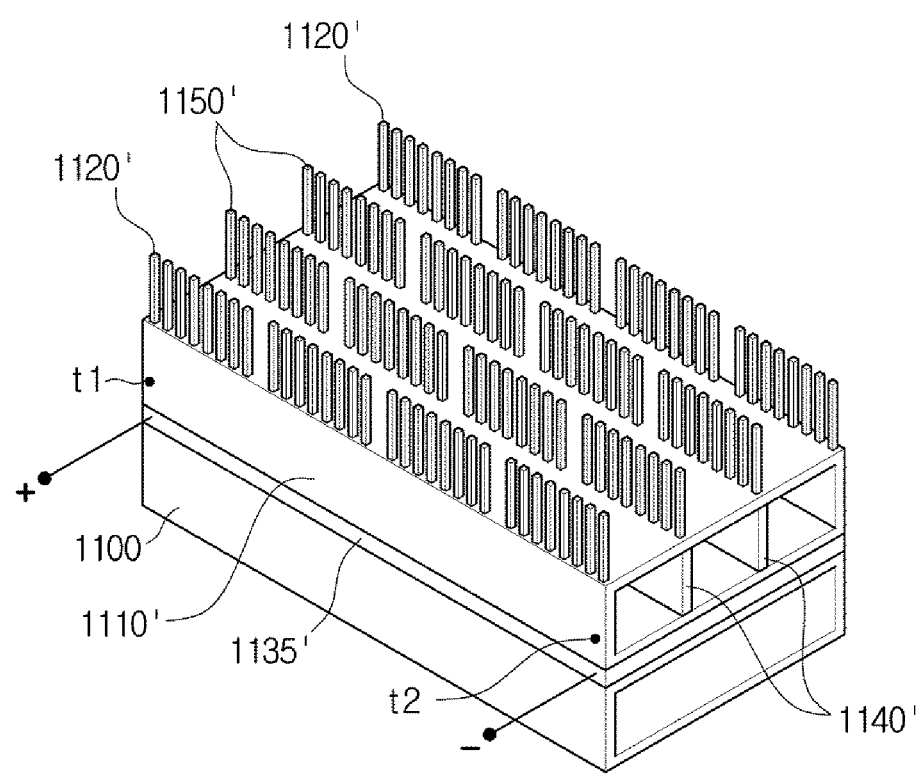

[FIG. 10]
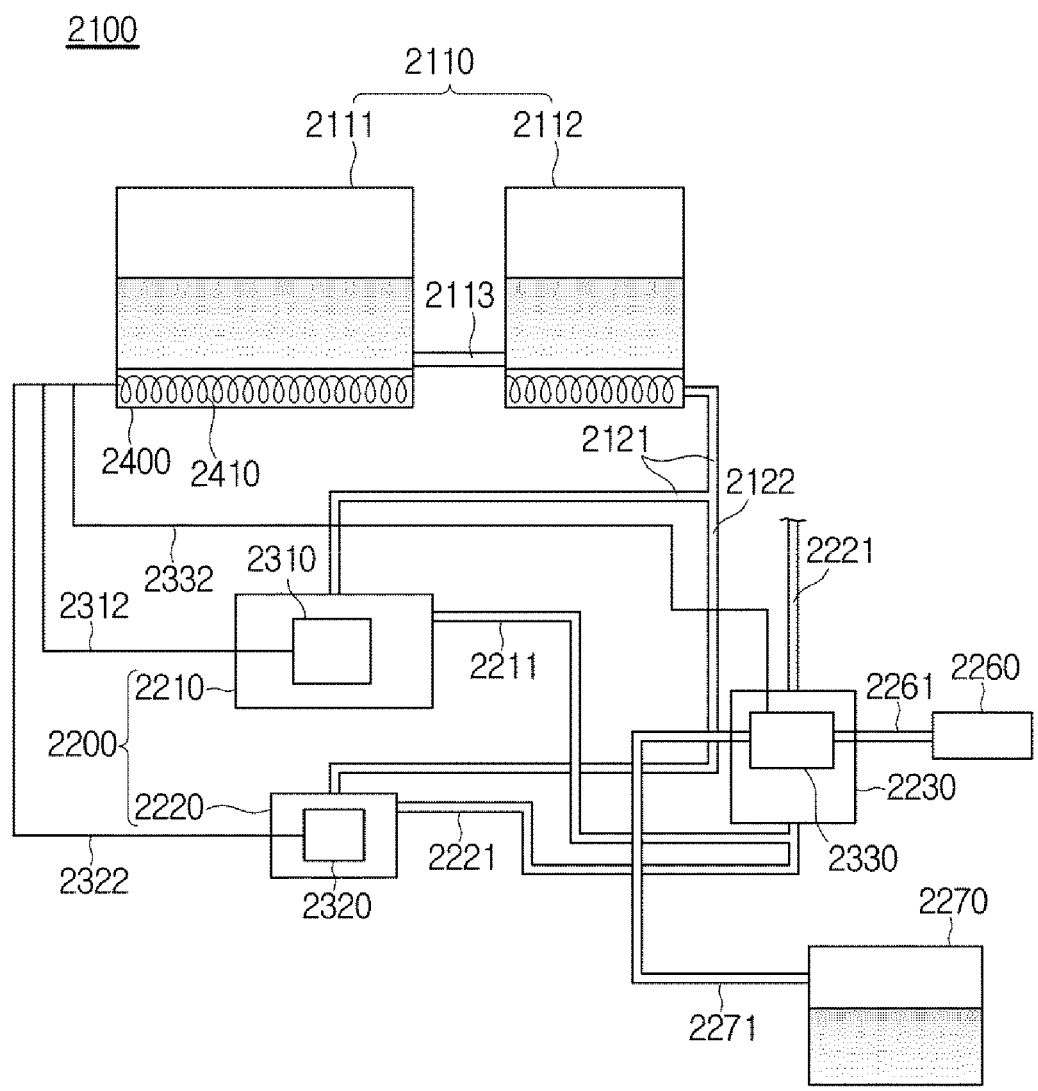

[FIG. 11]
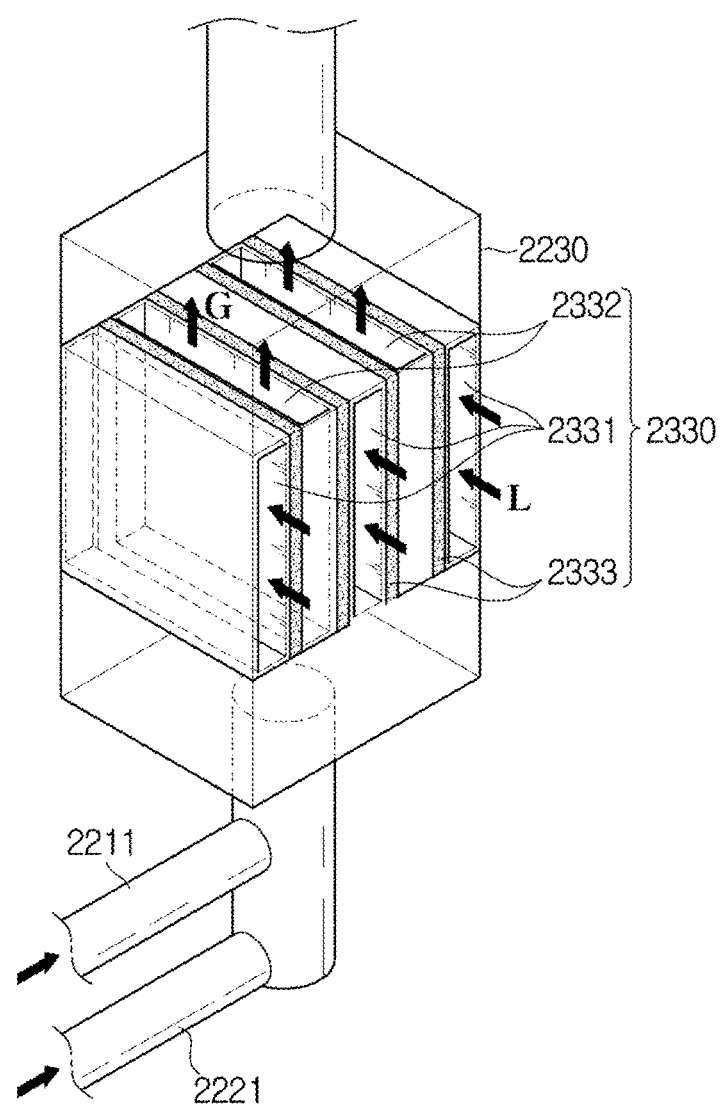

[FIG. 12]
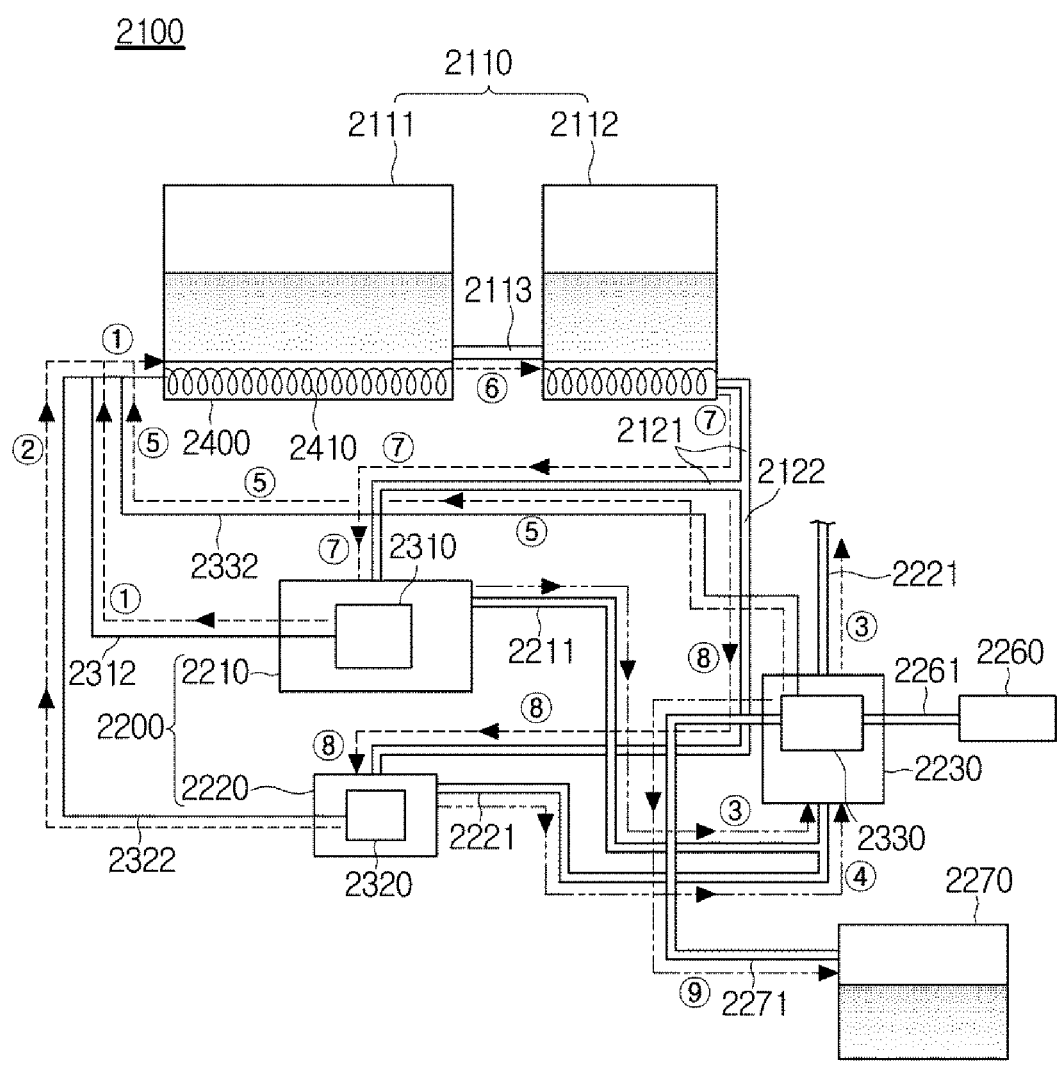

[FIG. 13]
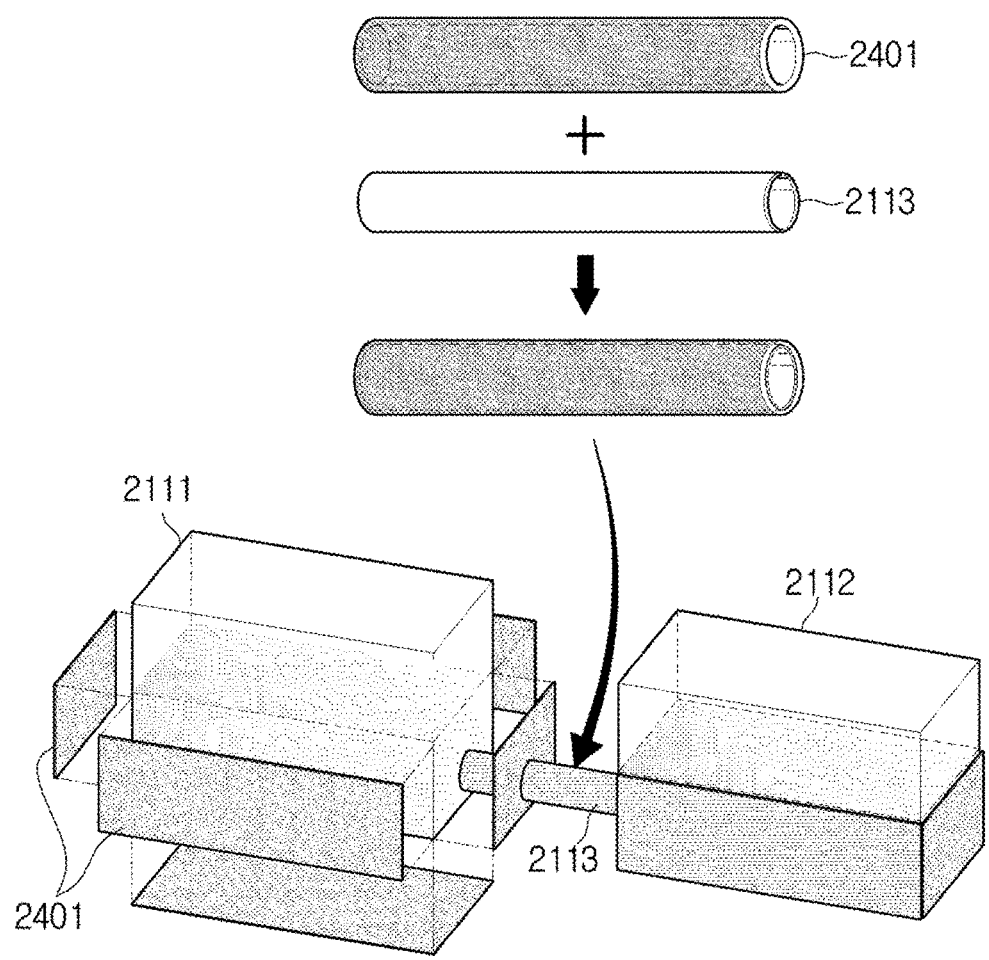

[FIG. 14]
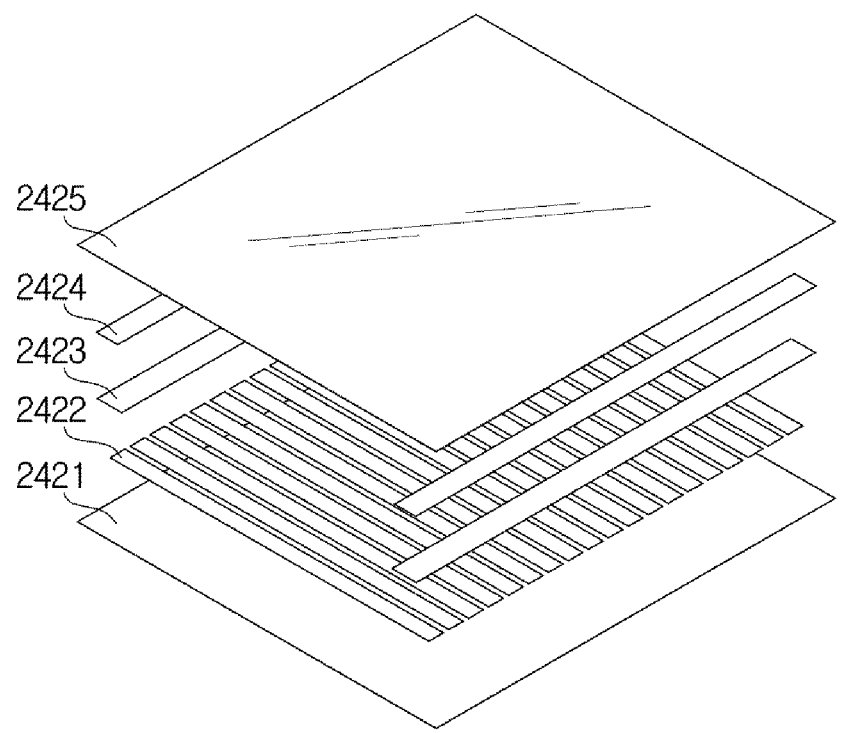

[FIG. 15]
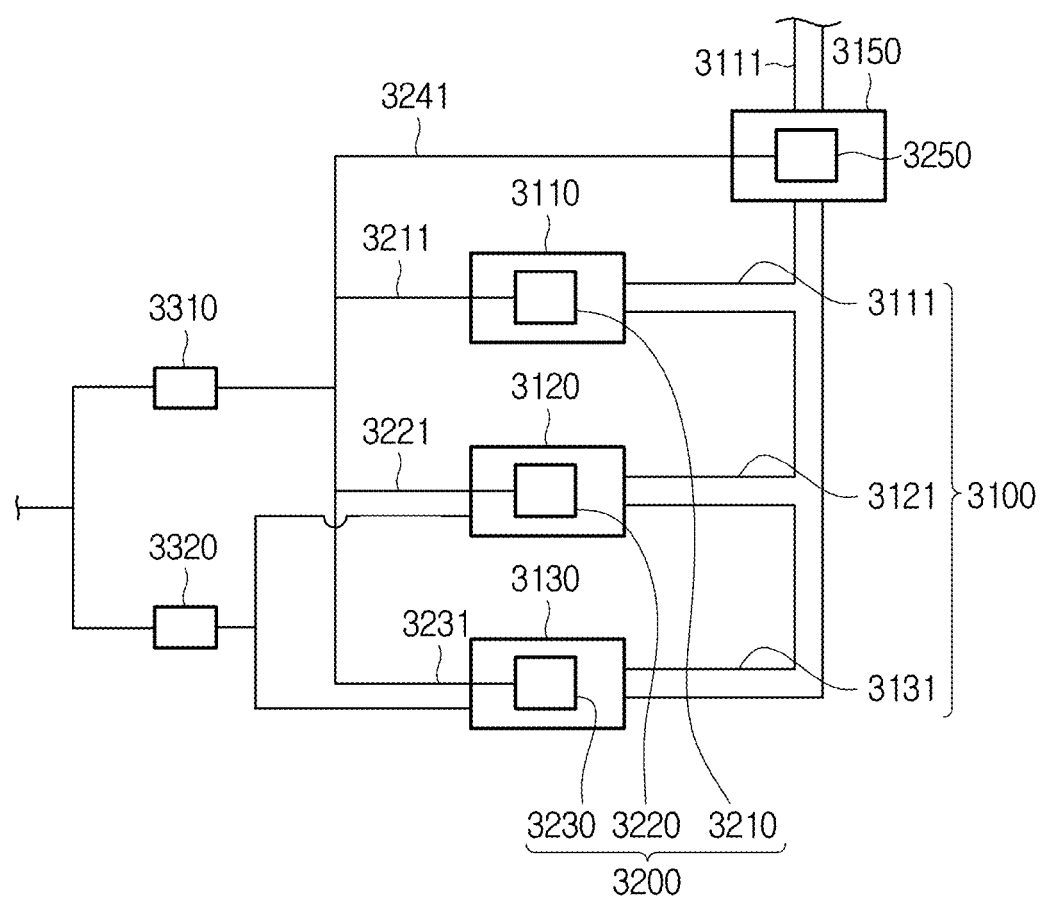

【FIG. 16】
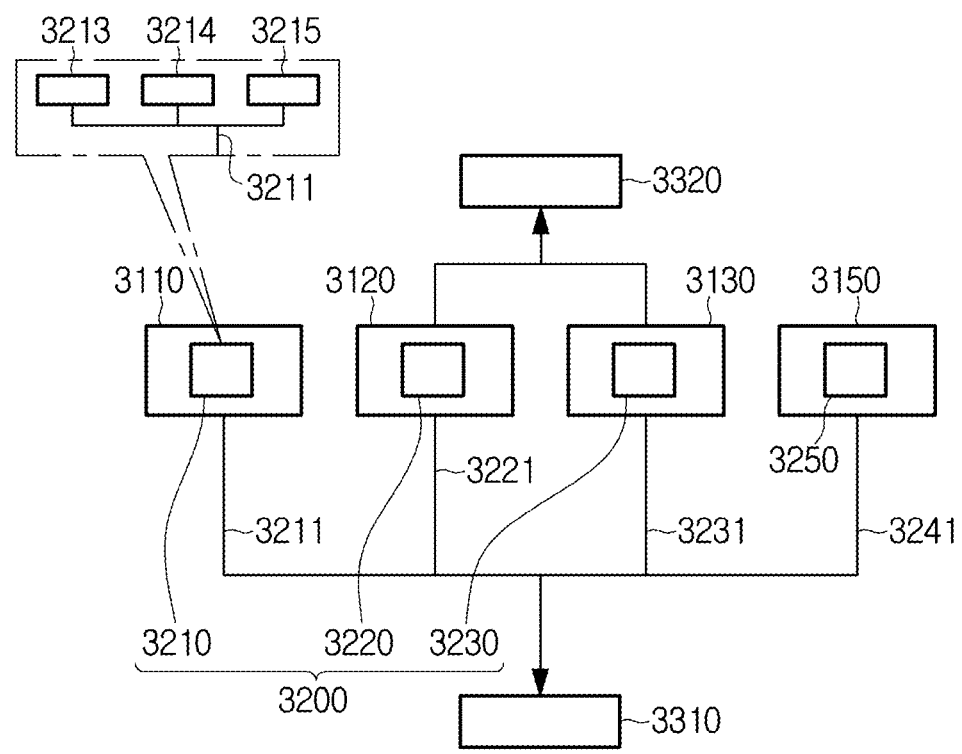

[FIG. 17]
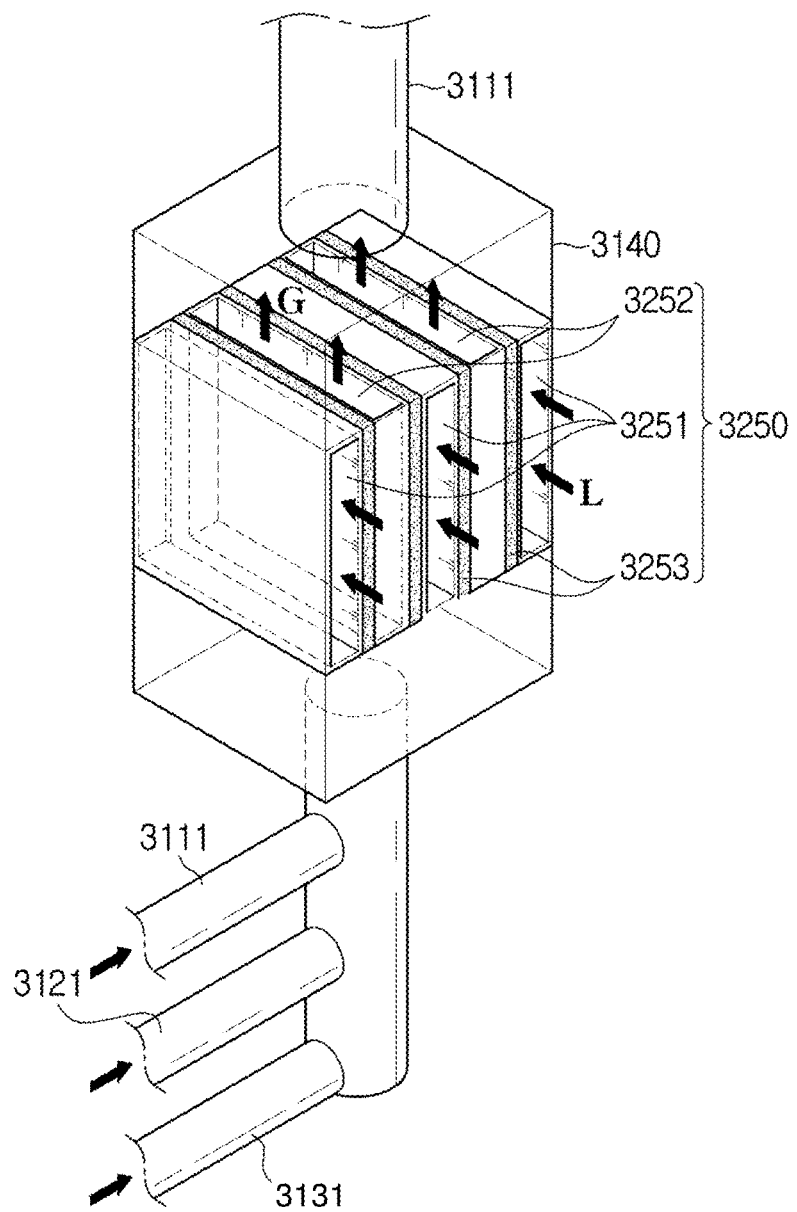

[FIG. 18]
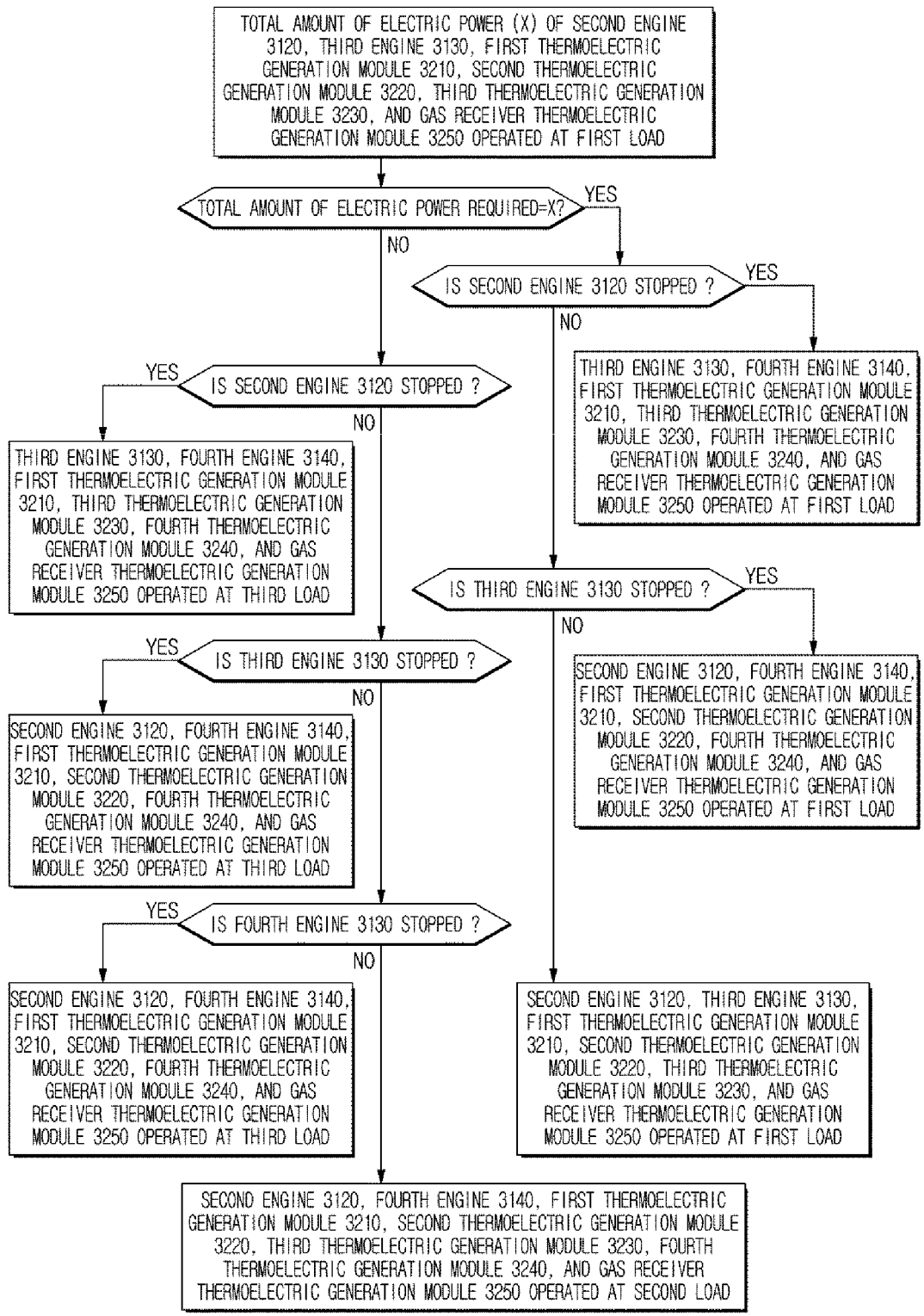

[FIG. 19]
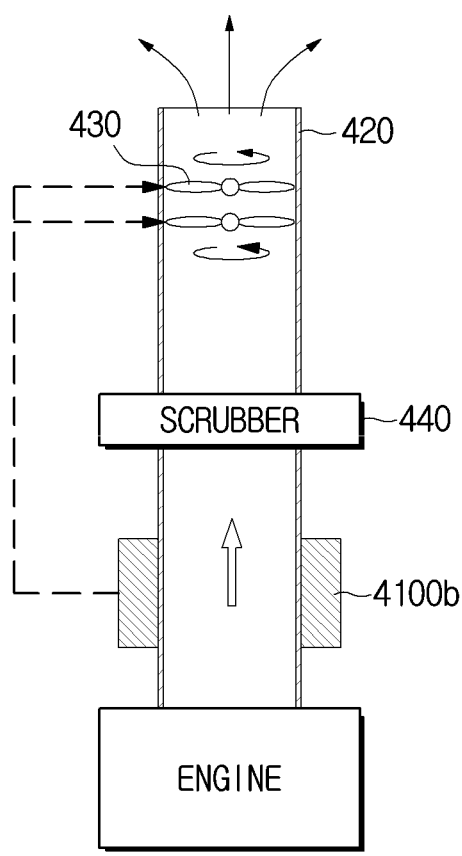

[FIG. 20]
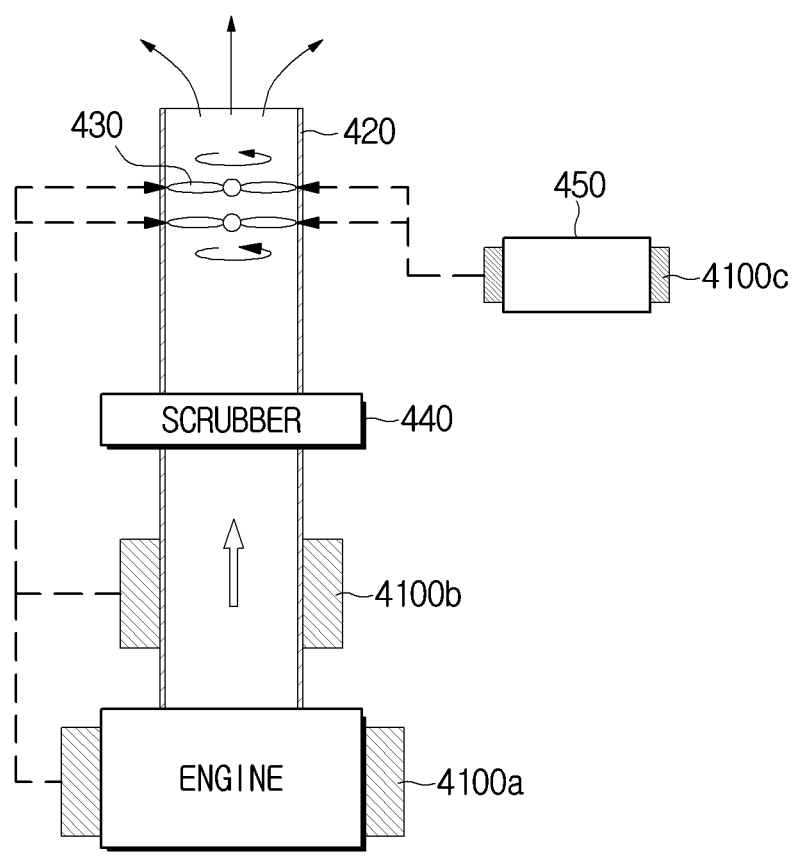

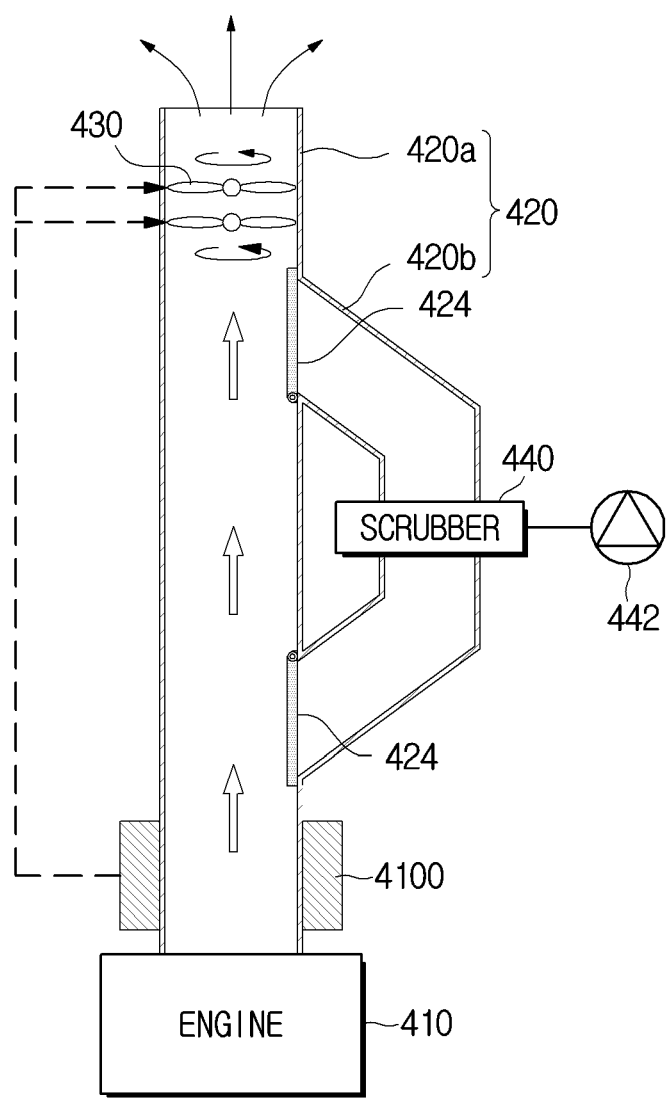
[FIG. 21]

[FIG. 22]
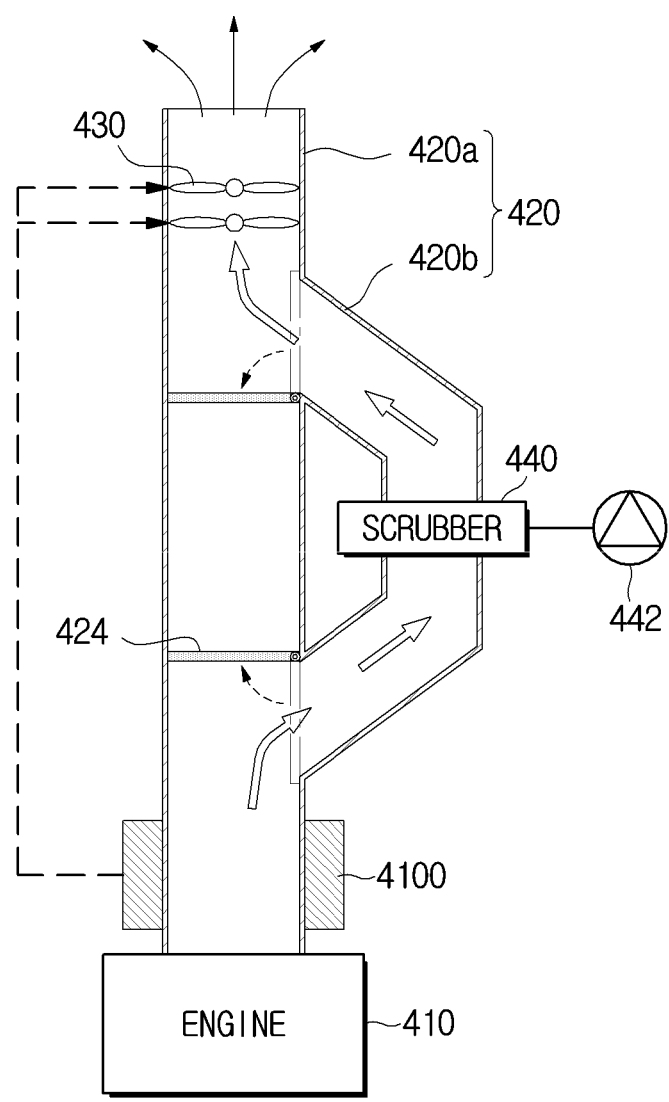

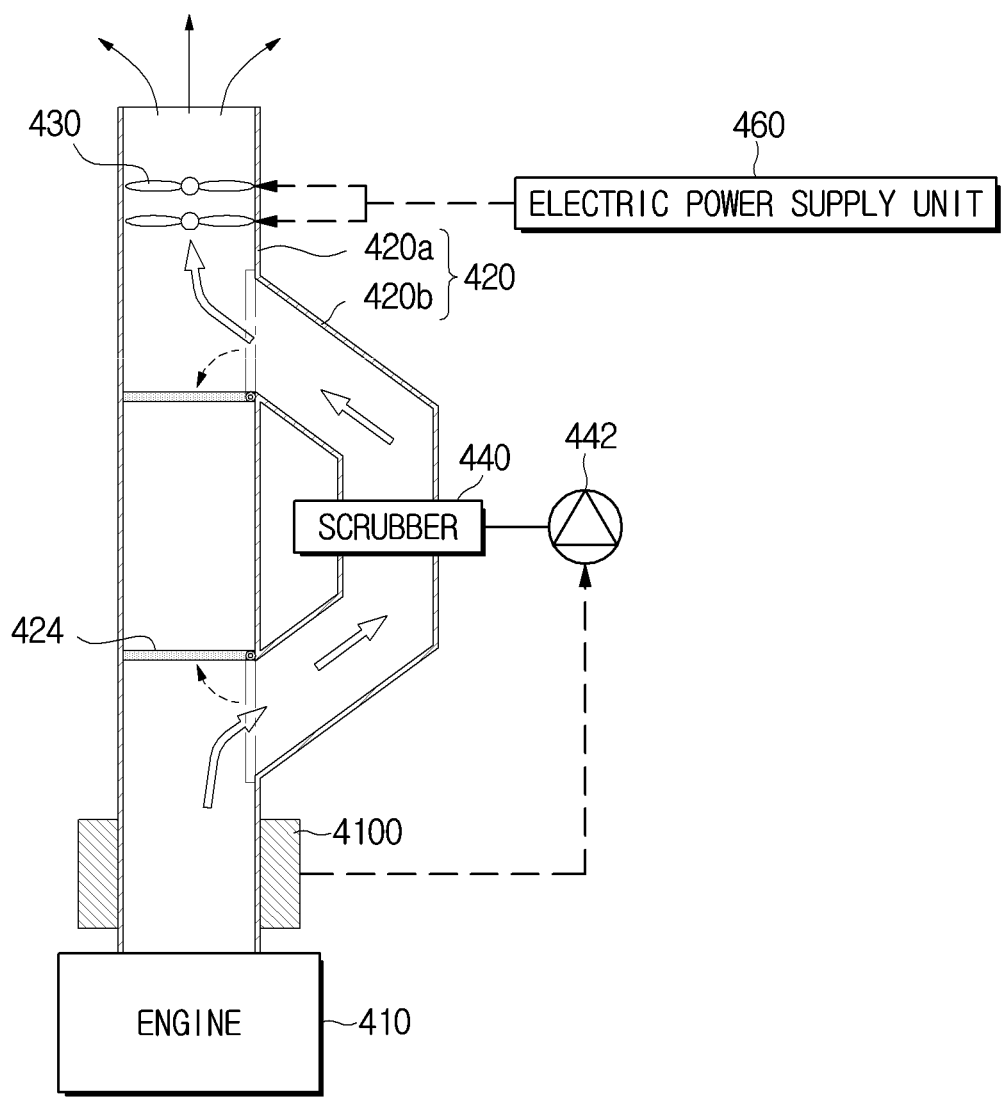
[FIG. 23]

[FIG. 24]
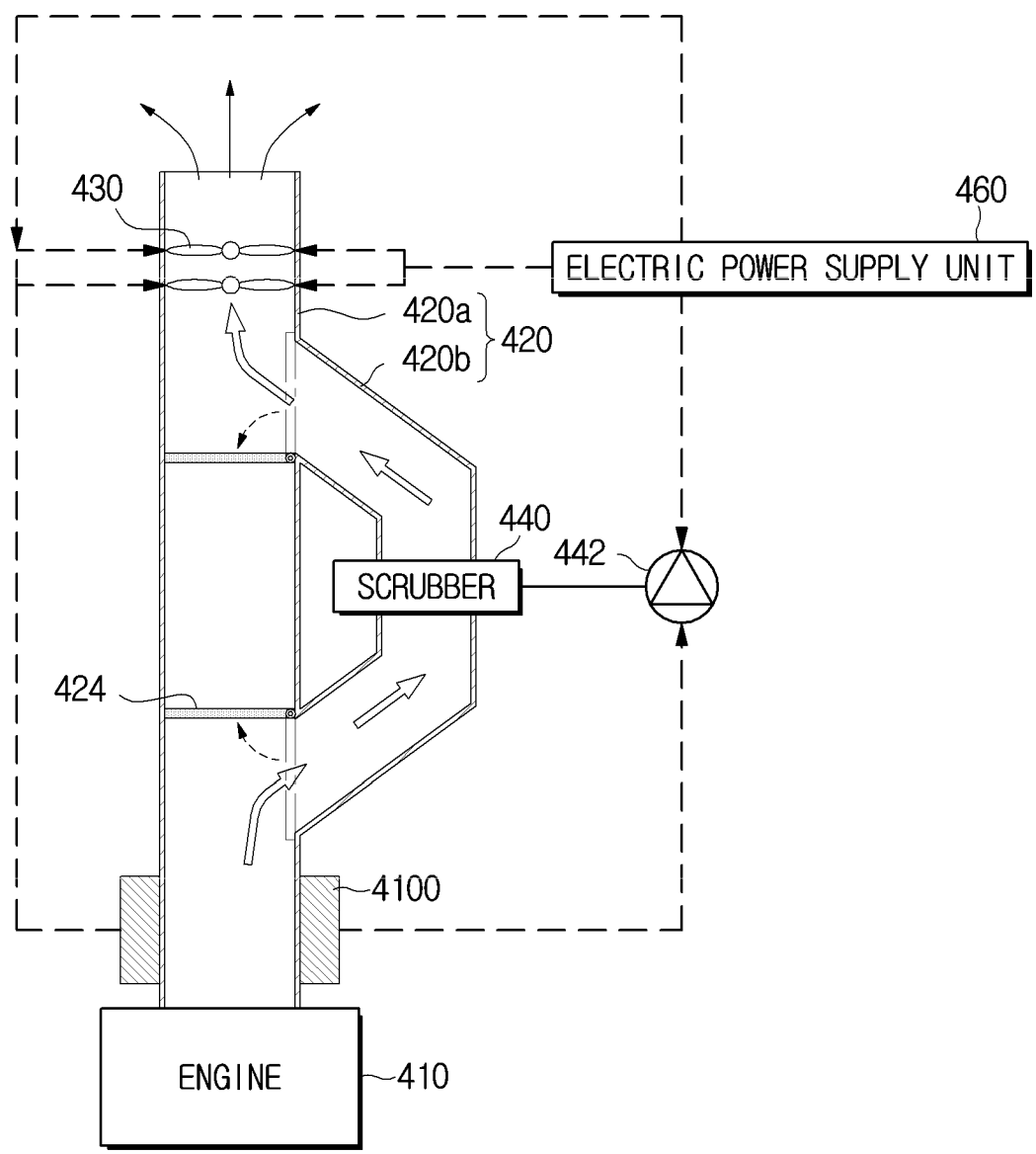

【FIG. 25】
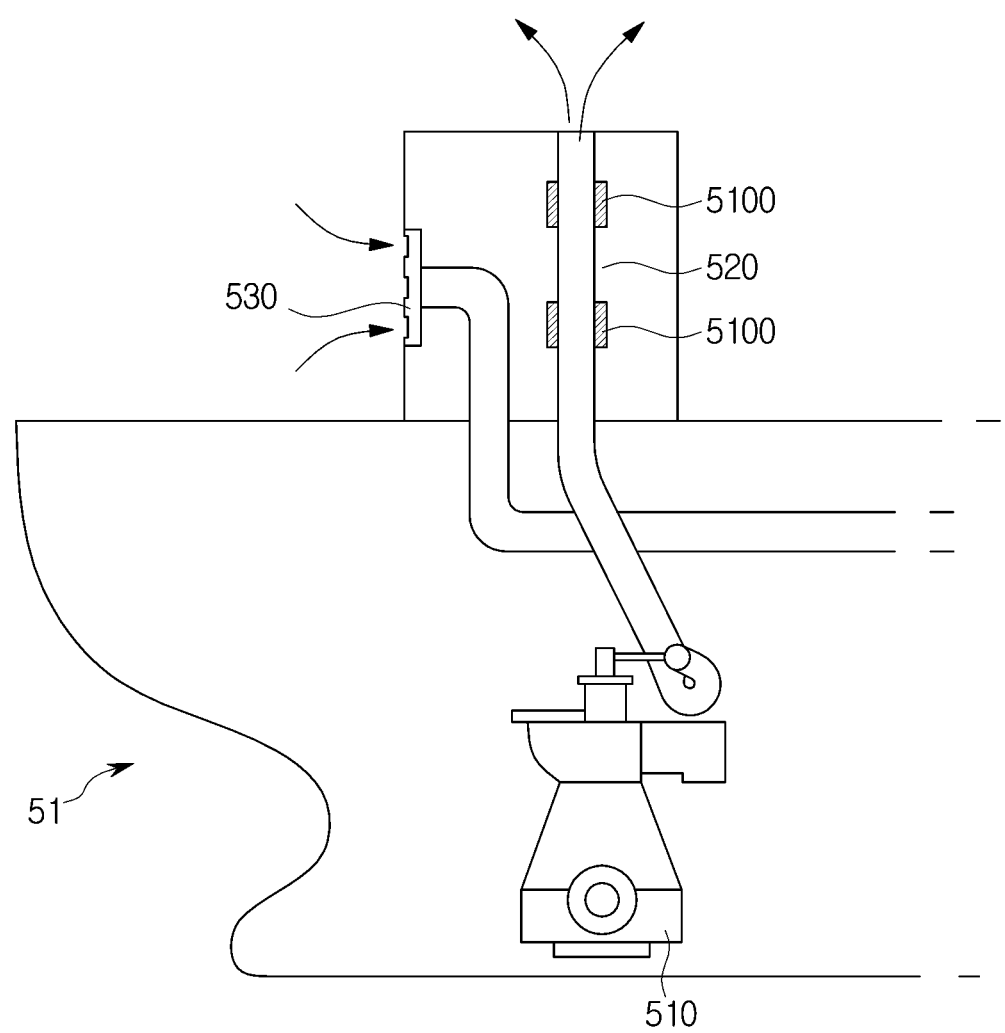

[FIG. 26]
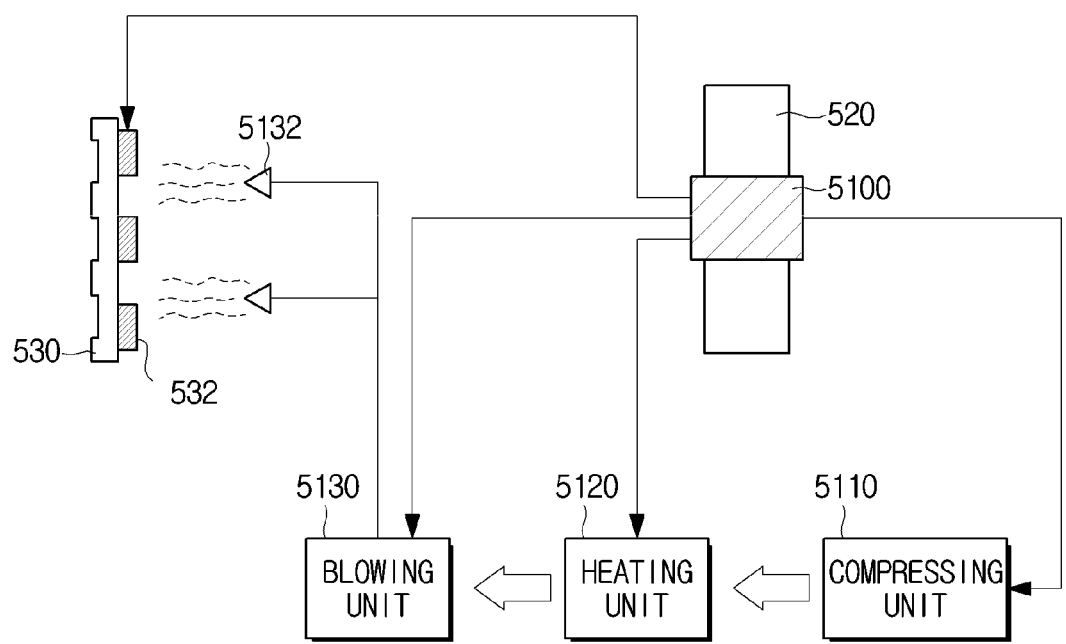

[FIG. 27]
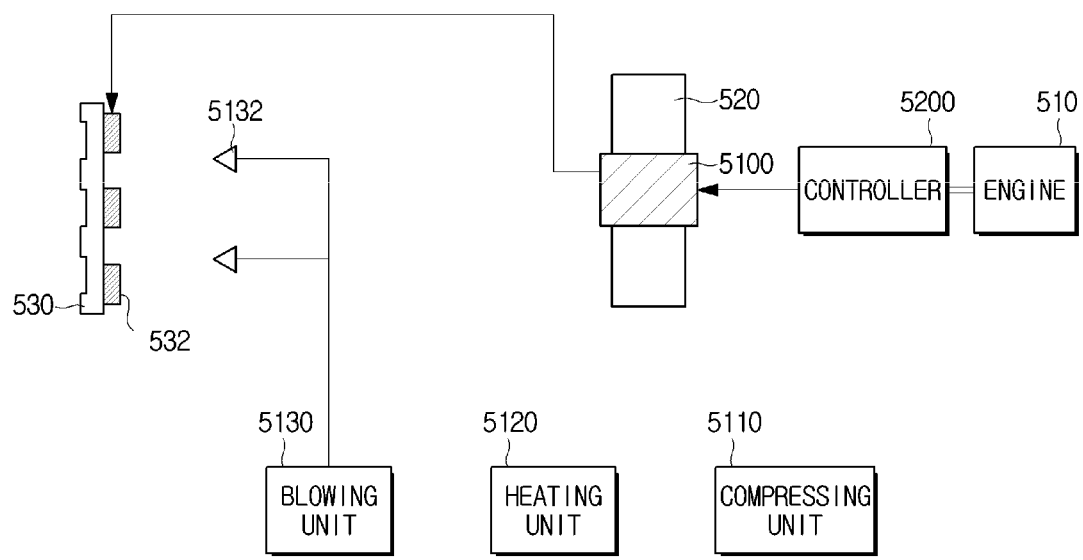

[FIG. 28]
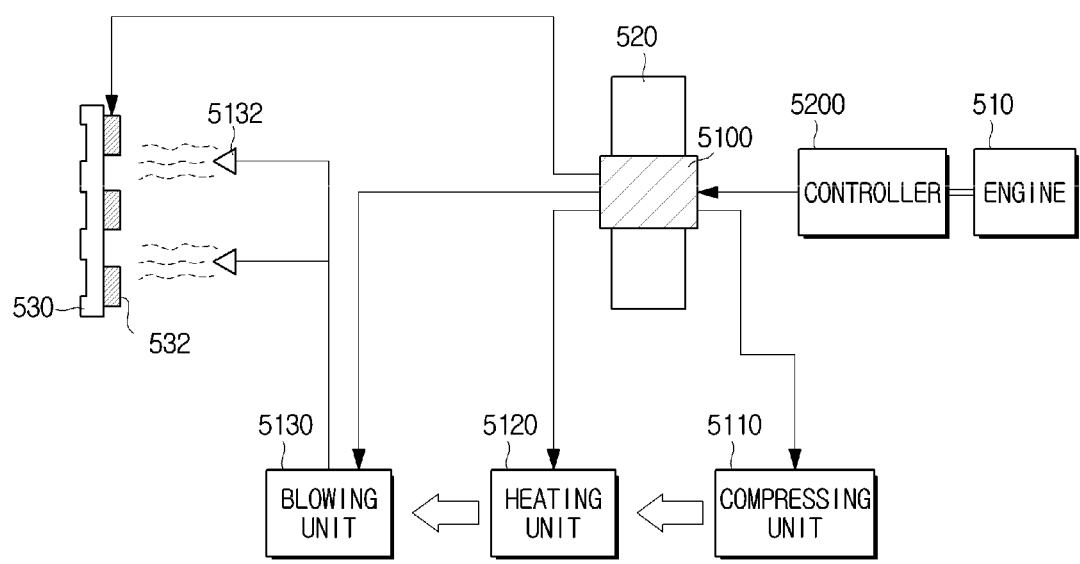

[FIG. 29]
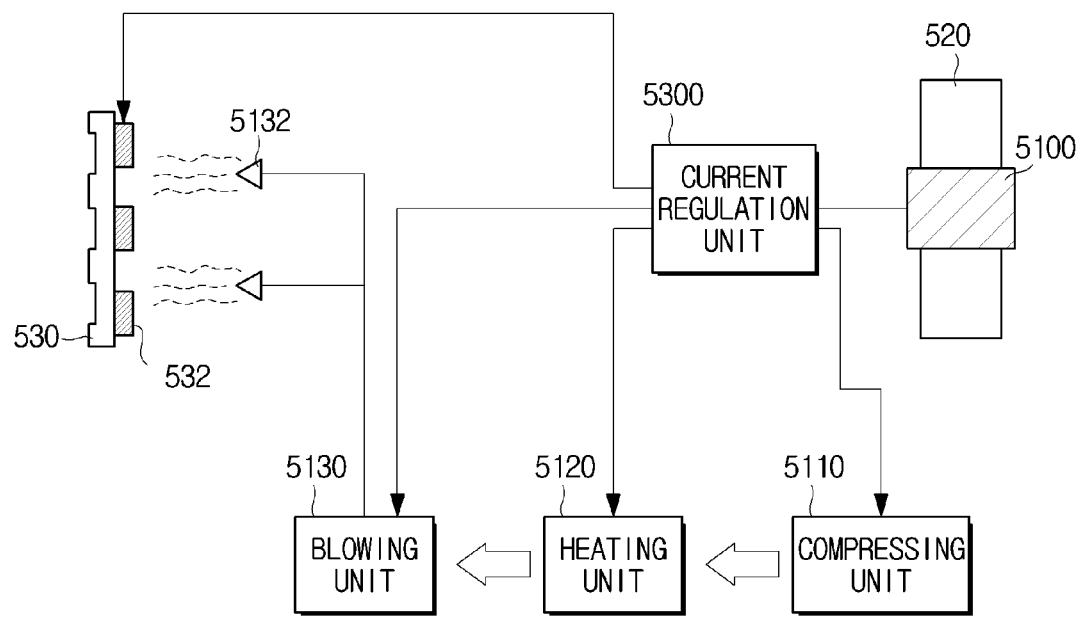

[FIG. 30]
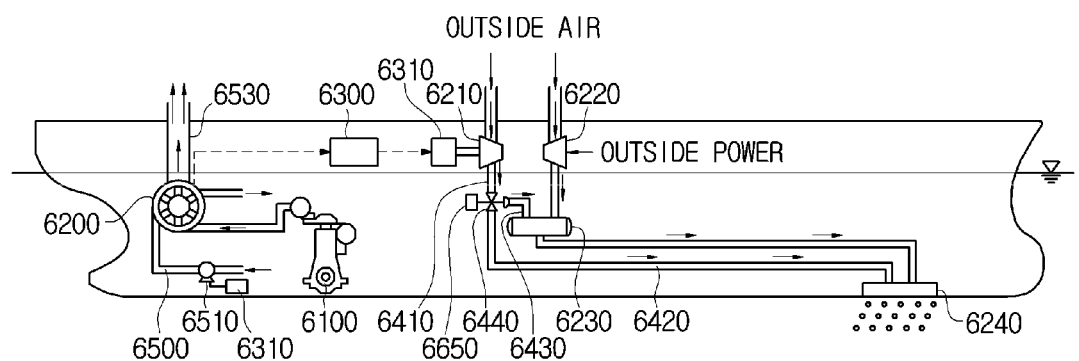

[FIG. 31]
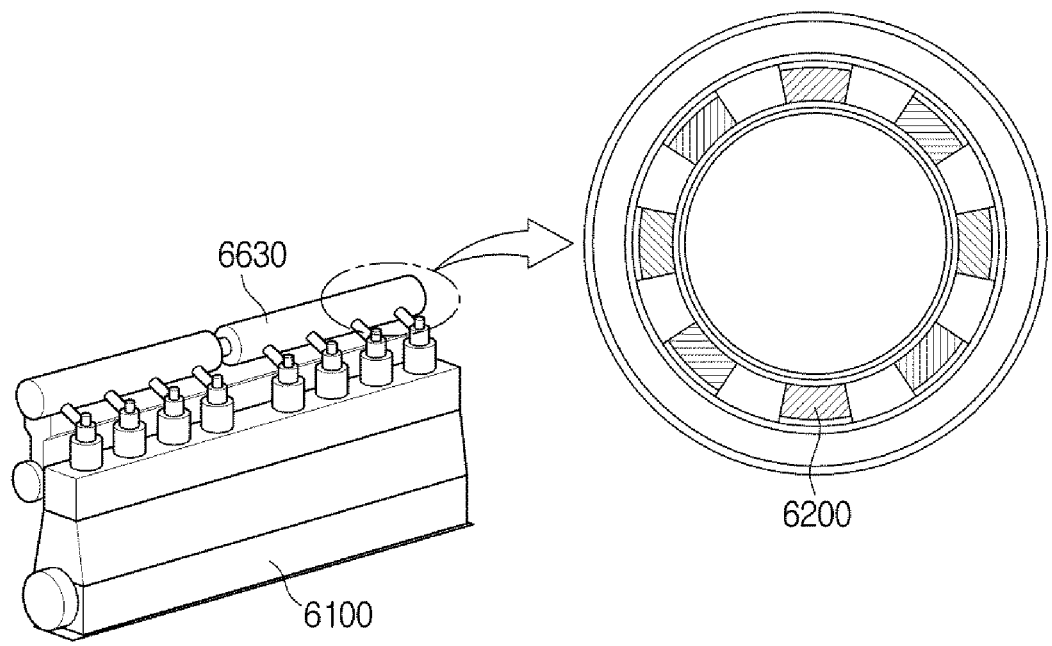

[FIG. 32]
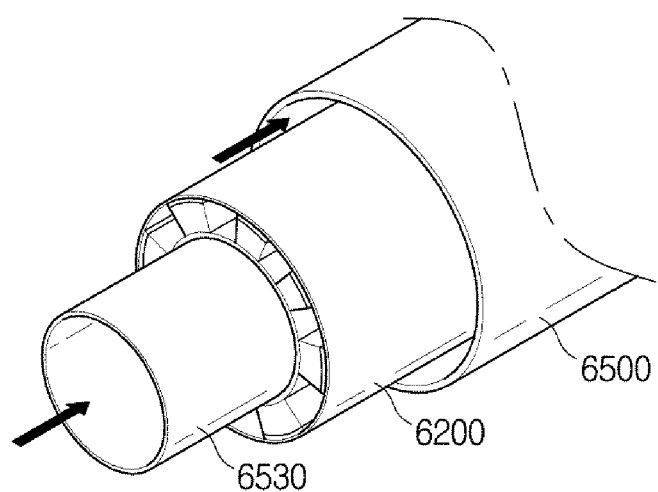

【FIG. 33】
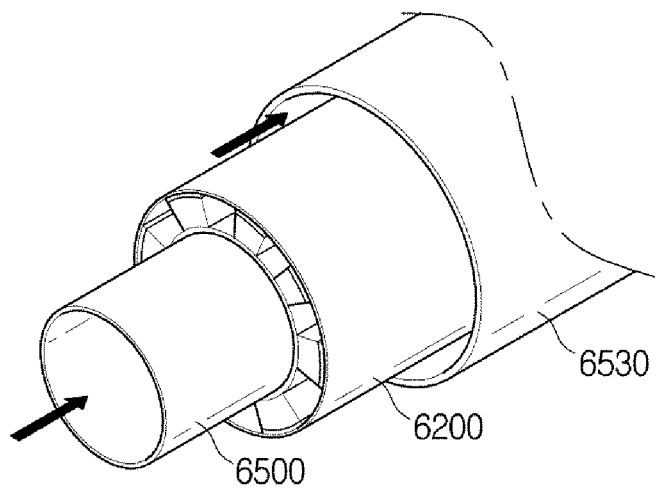

[FIG. 34]
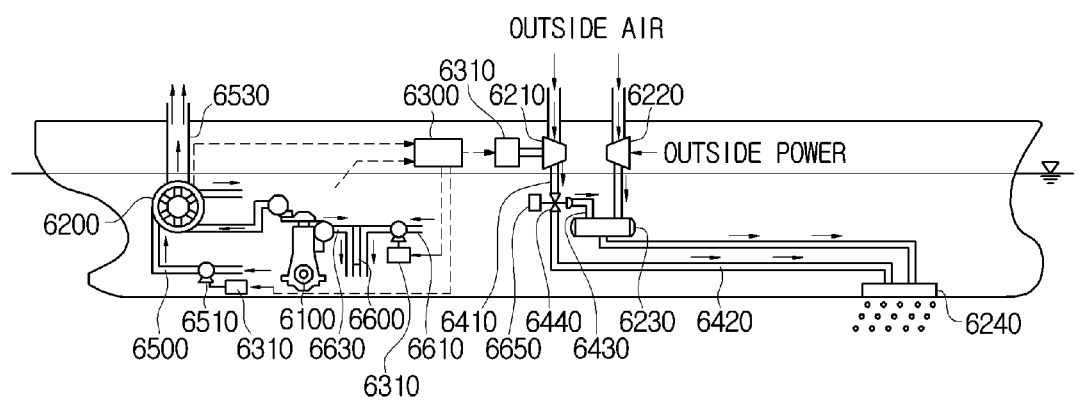

[FIG. 35]
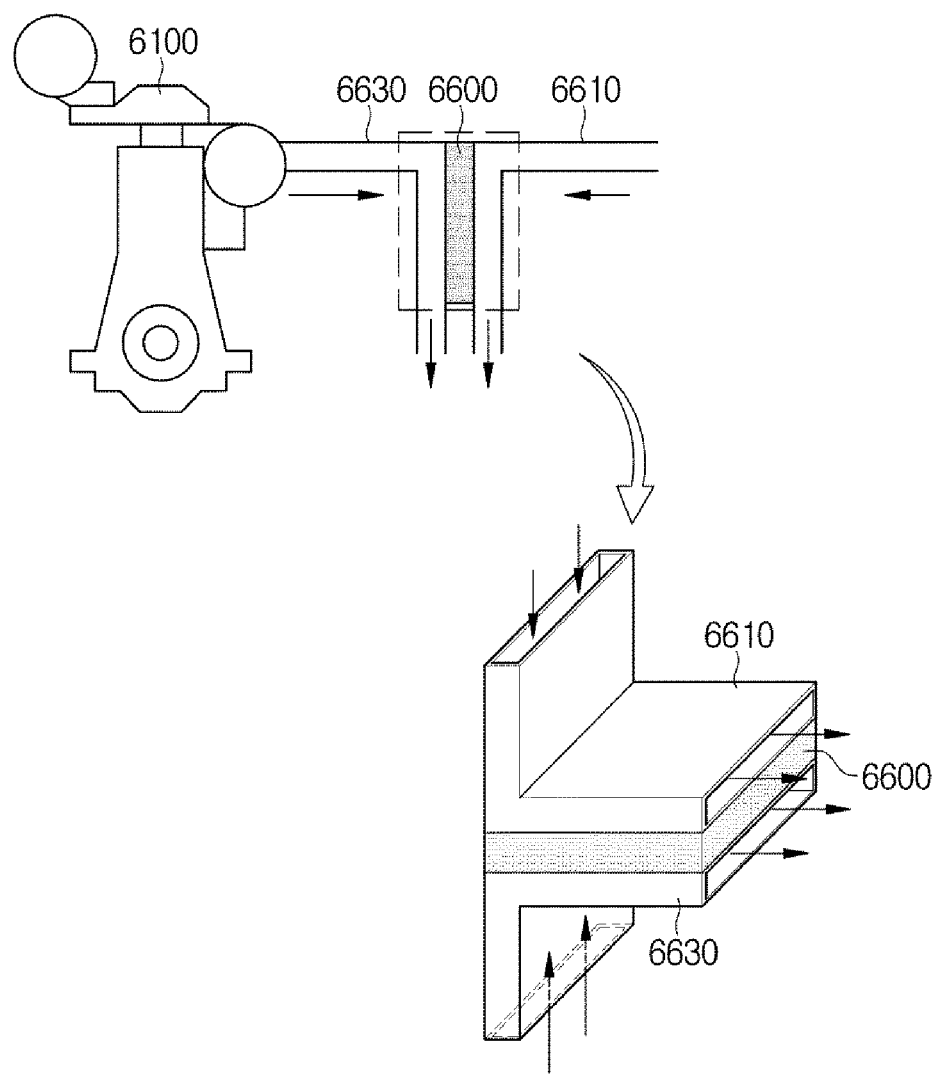

[FIG. 36]
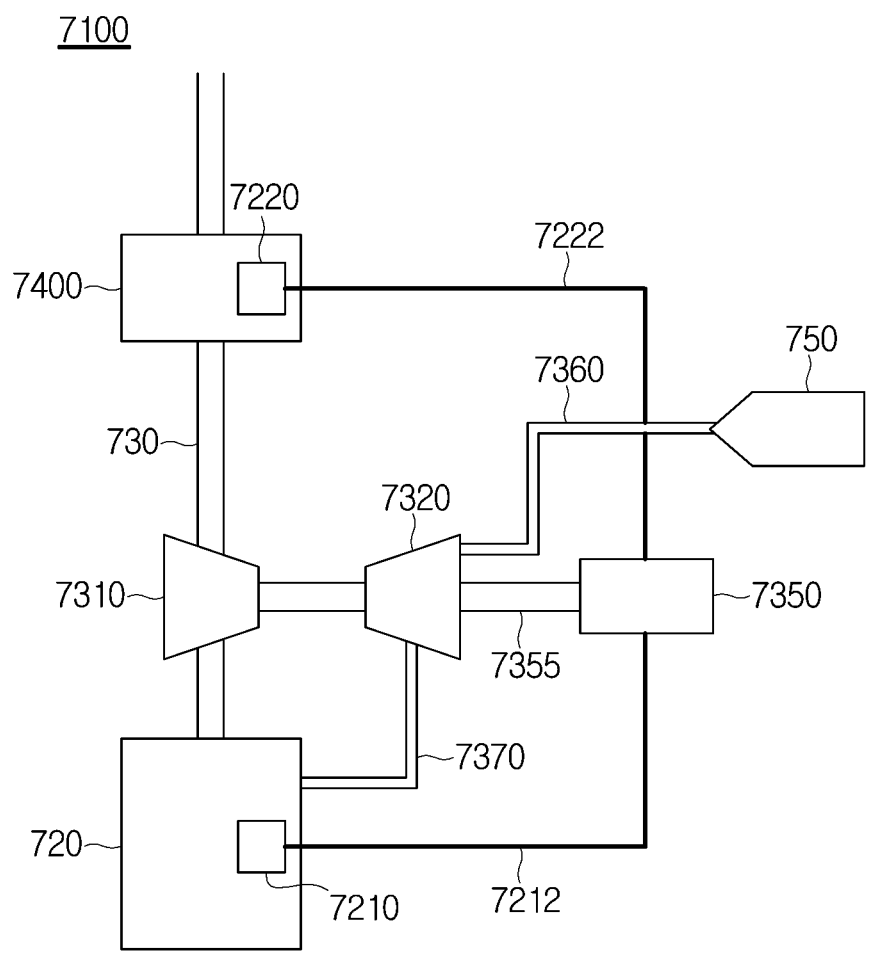

[FIG. 37]
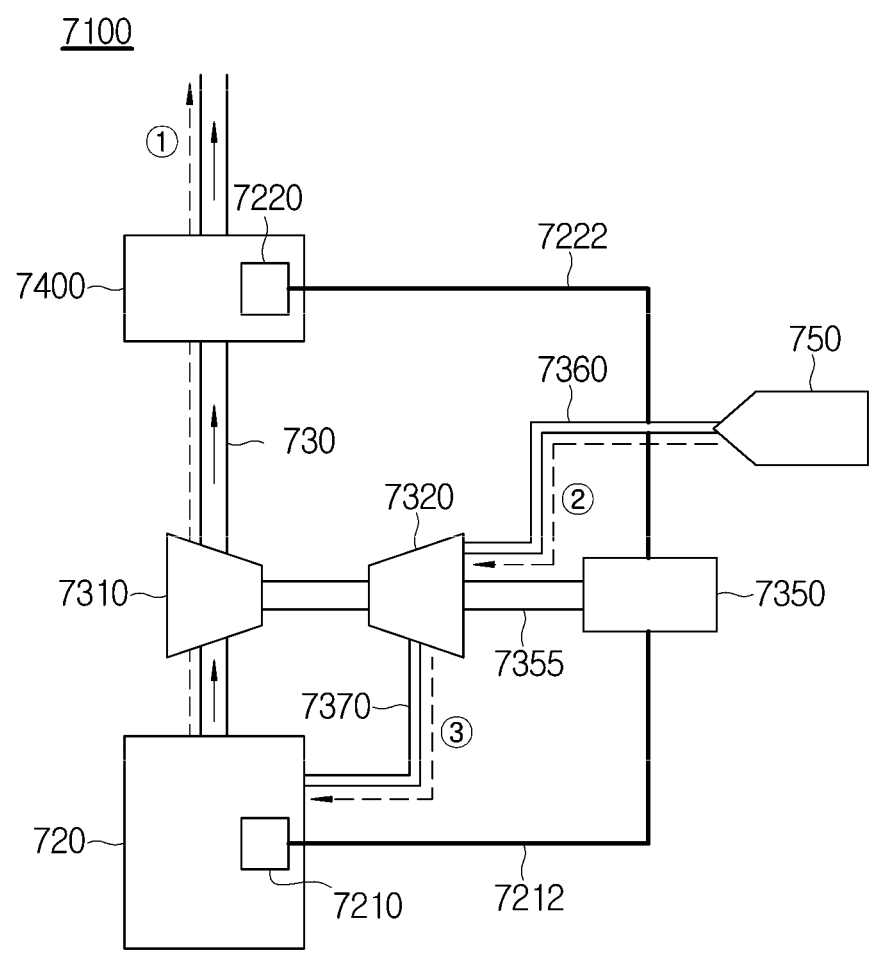

[FIG. 38]
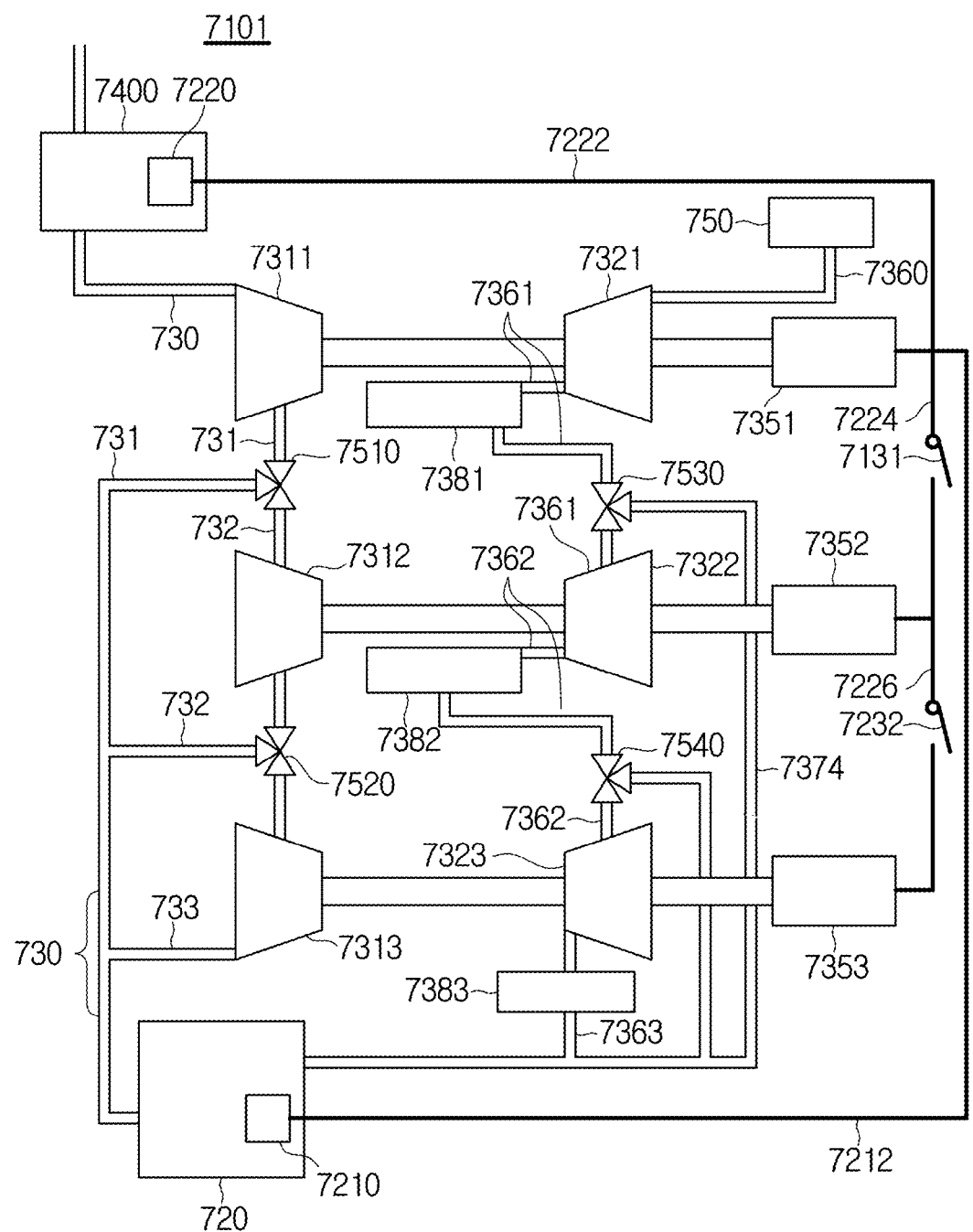

[FIG. 39]
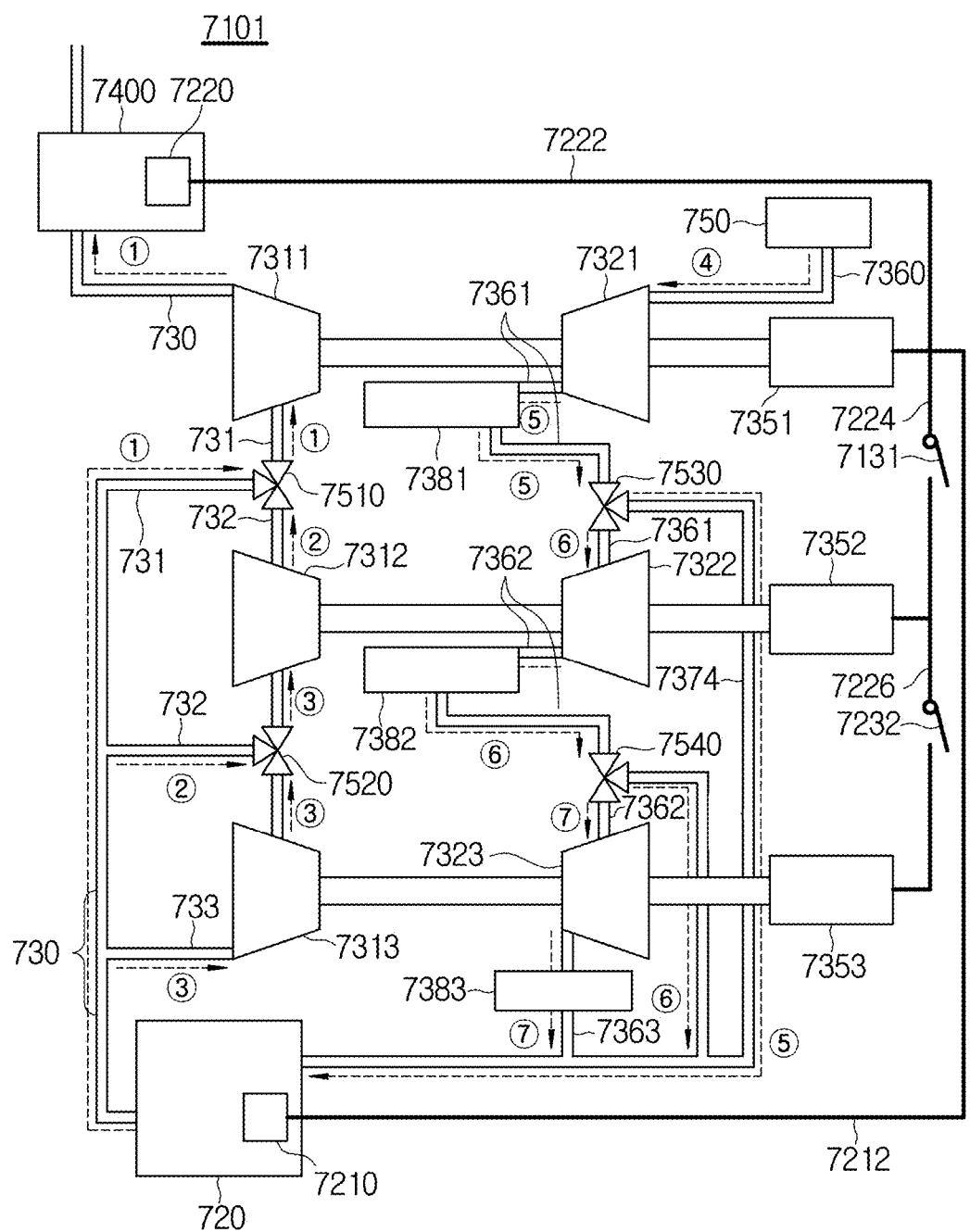

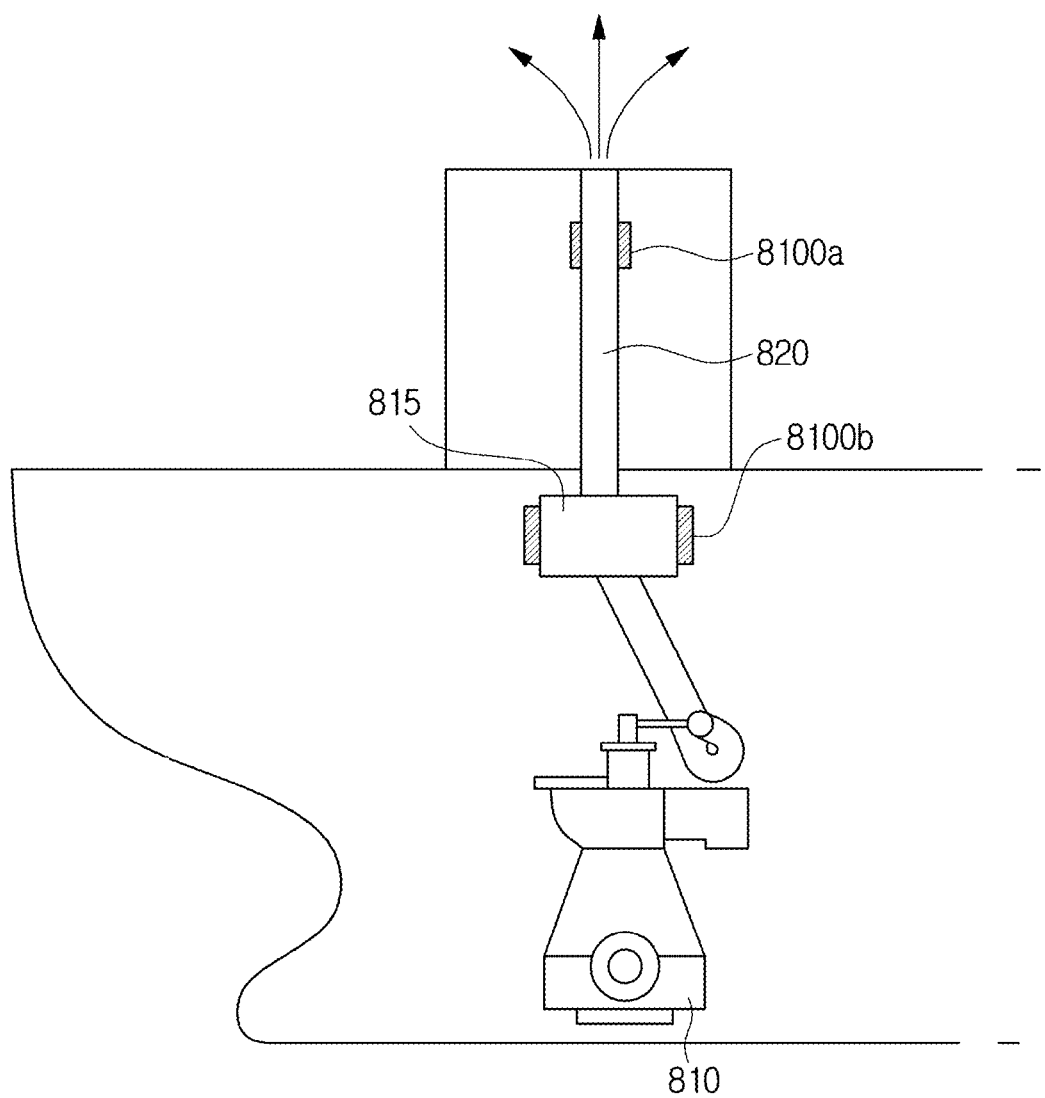
[FIG. 40]

【FIG. 41】
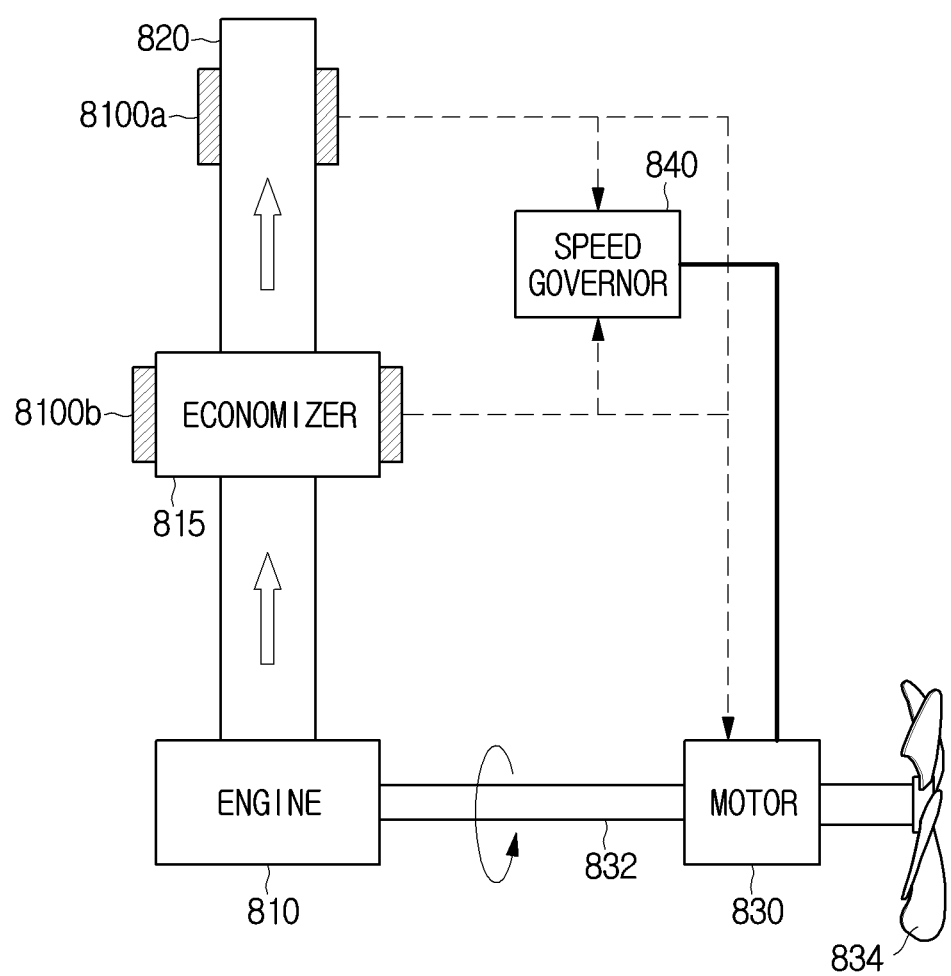

[FIG. 42]
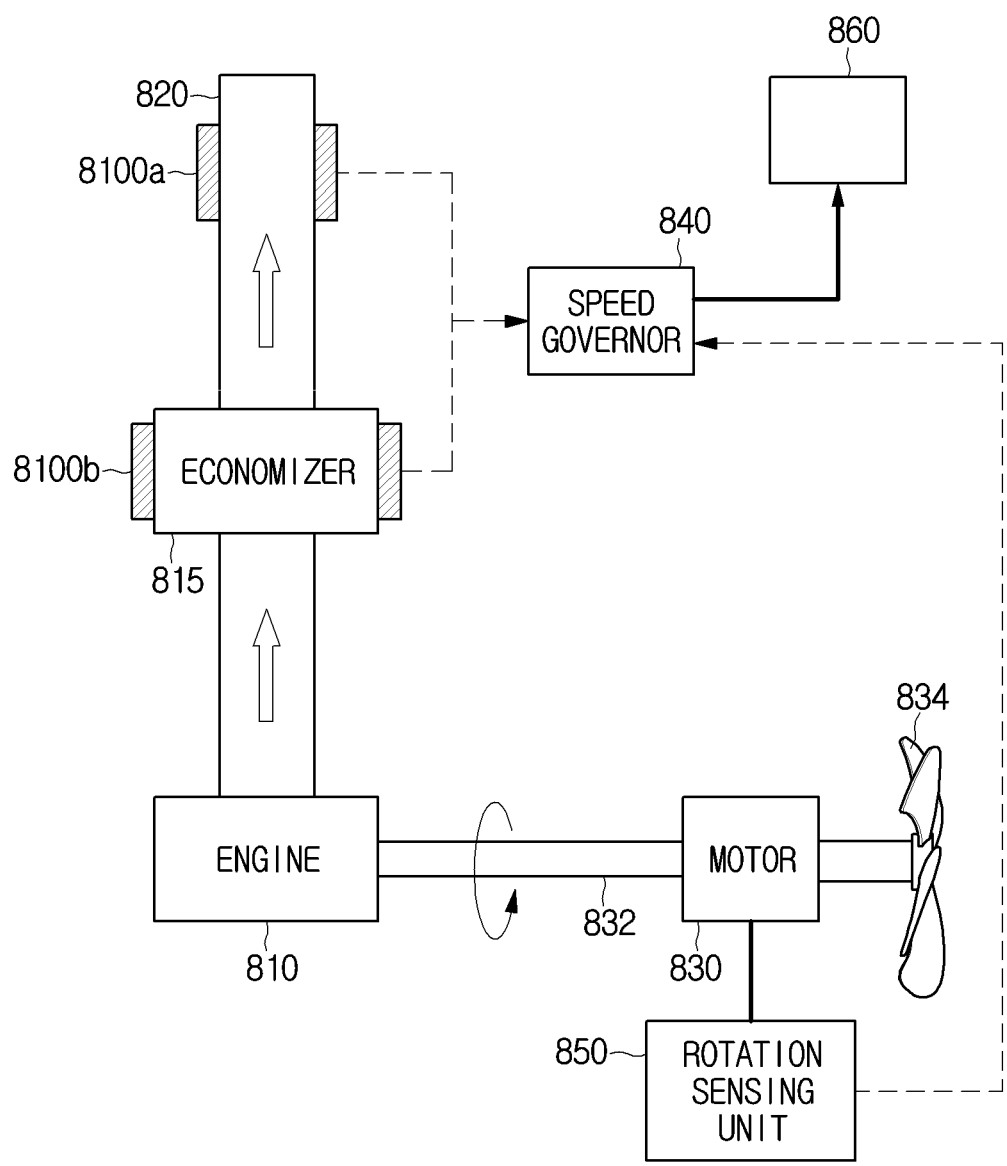

【FIG. 43】
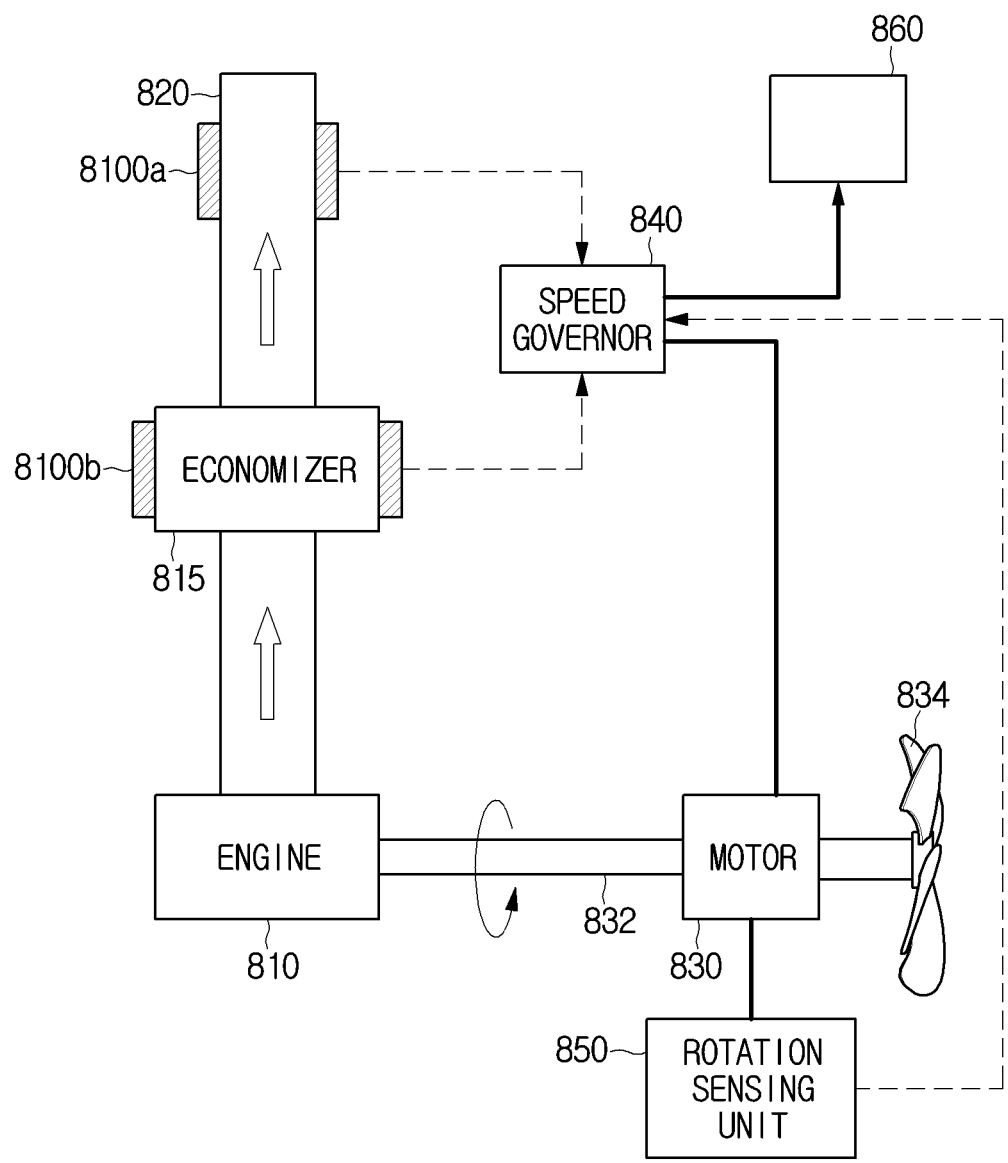

[FIG. 44]
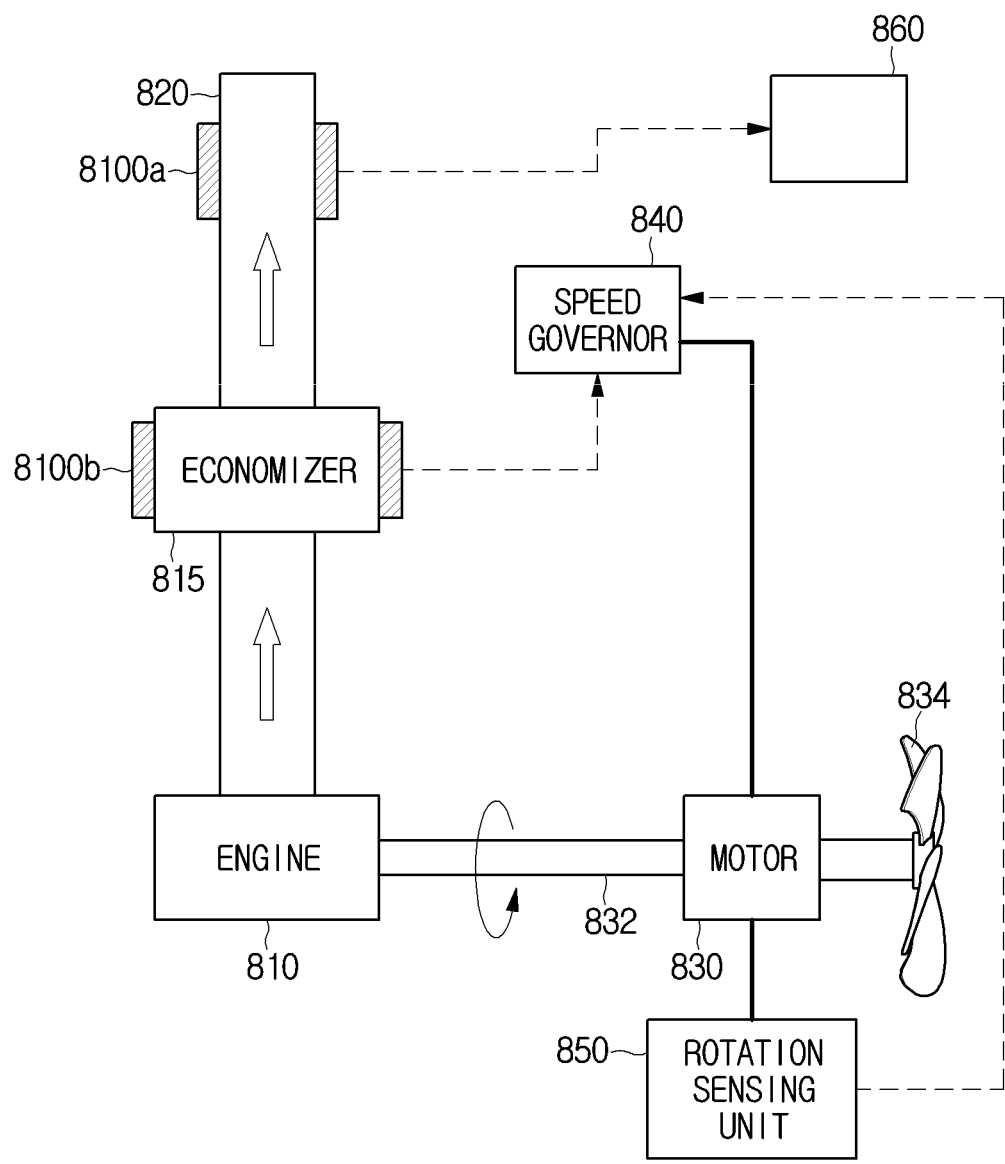

THERMOELECTRIC GENERATION APPARATUS, HEAT GENERATION APPARATUS FOR FUEL STORAGE TANKS, AND WASTE HEAT RECOVERY SYSTEM

CROSS-REFERENCE TO RELATED APPLICATION

This application is the U.S. National Stage of International Patent Application No. PCT/KR2015/008238 filed on Aug. 6, 2015, the disclosure of which is hereby incorporated in its entirety by reference.

TECHNICAL FIELD

The present disclosure relates to a thermoelectric generation apparatus, a heat generation apparatus for fuel storage tanks, and a waste heat recovery system.

BACKGROUND ART

Generally, a power generation system that produces electrical energy from thermal energy uses a method that converts thermal energy into dynamic energy that moves a piston or a turbine and then produces electrical energy using this dynamic energy. According to this method, since the complicated mechanical means must be constructed in the generator, the manufacturing cost is high and the transportation is difficult. For this reason, thermoelectric power generation technology that converts heat energy into electric energy has been devised.

A thermoelectric element used in thermoelectric power generation technology is a generic name of a device that utilizes various effects indicating the interaction of heat and electricity, and the thermoelectric effect can be divided into Seeback effect and Peltier effect.

The Seeback effect is a thermoelectric phenomenon in which current flows in a closed circuit connecting two metals or semiconductors when a temperature difference occurs between the two metals or semiconductors, and the Peltier effect, on the other hand, is a phenomenon in which one terminal absorbs heat and the other terminal generates heat depending on the current direction when current flows in two metals or semiconductors.

There is a need for research on various apparatuses or systems that effectively generate electric energy from thermal energy such as a temperature difference between two components or waste heat by applying this thermoelectric power generation technology.

DISCLOSURE OF INVENTION

Technical Problem

It is an aspect of the present disclosure to provide a thermoelectric generation apparatus, a heat generation apparatus for fuel storage tanks, and a waste heat recovering system capable of producing electric energy using a temperature difference between two components or waste heat and efficiently utilizing energy therefrom.

Technical Solution

In accordance with one aspect of the present disclosure, there may be provided a thermoelectric generation apparatus including a first piping through which a fluid flows, a second piping through which a cooling medium of a lower temperature than the fluid flows so as to radiate the heat of the fluid, a plurality of first radiating fins having one side in contact with air of a lower temperature than the fluid so as to radiate the heat of the fluid and the other side in contact with the second piping, and a thermoelectric generation module provided between the first piping and the second piping to produce electricity through a temperature difference between the first piping and the second piping.

The thermoelectric generation apparatus may further include one or more heat conducting plates to partition the second piping along a direction in which the cooling medium flows.

The thermoelectric generation apparatus may further include second radiating fins which are in contact with the heat conducting plates and protrude in the same direction as the protruding direction of the first radiating fins.

The second piping may have one of a single-layer structure and a multi-layer structure.

The second piping having the multi-layer structure may include a first layer in contact with the thermoelectric generation module and a second layer disposed between the first layer and the first radiating fins, and the cooling medium flowing out of the first layer may flows into the second layer.

The thermoelectric generation module may include a plurality of thermoelectric generation units, and the two adjacent thermoelectric generation units of the thermoelectric generation units may be connected to each other in series or in parallel.

The first piping may include a plurality of first unit pipes corresponding to the thermoelectric generation units, the second piping may include a plurality of second unit pipes corresponding to the thermoelectric generation units, the first unit pipes may be connected to each other, and the second unit pipes may be connected to each other.

In accordance with one aspect of the present disclosure, there may be provided a thermoelectric generation apparatus including first radiating fins connected to a side wall of a second piping through which a cooling medium having a lower temperature than a fluid flowing through a first piping flows, second radiating fins connected to one or more heat conducting plates for partitioning the second piping along a direction in which the cooling medium flows, and a thermoelectric generation module that produces electricity through a temperature difference between the cooling medium and the fluid.

When the cooling medium does not flow into the second piping, the first radiating fins and the second radiating fins may radiate the heat of the fluid into air, and the thermoelectric generation module may produce electricity through a temperature difference between the air and the fluid.

In accordance with one aspect of the present disclosure, there may be provided a heat generation apparatus for fuel storage tanks including a storage unit in which a fuel is stored, an engine unit receiving the fuel from the storage unit to provide a rotational force, a thermoelectric generation module producing electric power using the heat generated from the engine unit, and a heat generation unit receiving the electric power from the thermoelectric generation module to increase the temperature of the fuel.

The storage unit may include a first storage tank in which the fuel is supplied and stored from the outside, and a second storage tank provided between the first storage tank and the engine unit.

The storage unit may further include a connecting pipe through which the fuel is transferred from the first storage tank to the second storage tank, and the heat generation unit may surround the connecting pipe from the outside.

The thermoelectric generation module may be provided on a first flow path through which a fluid flows, on a second flow path through which exhaust gas discharged from the engine unit flows, and between the first flow path and the second flow path, and may include thermoelectric generating elements producing electric power by a different temperature between the fluid and the exhaust gas. The heat generation apparatus for fuel storage tanks may further include a steam generation unit connected to the thermoelectric generation module and to which the fluid having passed through the first flow path is supplied.

The heat generation unit may be installed at a lower portion of the storage unit and surround the storage unit.

The heat generation unit may include a first sheet, a plurality of heat generating elements stacked on the first sheet and disposed to be spaced apart from each other, first metal films stacked on the first sheet and intersecting and connecting with the plurality of heat generating elements, second metal films stacked on the first sheet and electrically connecting with the first metal films, and a second sheet stacked on the first sheet and covering the plurality of heat generating elements, the first metal films and the second metal films.

In accordance with one aspect of the present disclosure, there may be provided a waste heat recovery system including a plurality of thermoelectric generation modules producing electric power using the heat of an engine unit and having a plurality of thermoelectric generation units which are connected in parallel, and a first transformer connected with the thermoelectric generation modules in parallel.

The engine unit may include a first engine that provides a propulsion force to a marine structure, and a second engine that produces electric power and is connected with a second transformer converting the electric power, and the first transformer and the second transformer may be connected in parallel.

The engine unit may include a third engine and a fourth engine that produce electric power and are connected to each other in parallel, the plurality of thermoelectric generation modules may include a third thermoelectric generation module and a fourth thermoelectric generation module installed in the third engine and the fourth engine, respectively, and when the second engine or the third engine is stopped while the second engine and the third engine are operating at a first load, the fourth engine may be operated to produce electric power in the fourth engine and the fourth thermoelectric generation module.

When any one of the second engine, the third engine and the fourth engine is stopped while the second engine, the third engine and the fourth engine is operating at a second load, an engine that is in operation among the second engine, the third engine, or the fourth engine may be operated at a third load.

Advantageous Effects

A thermoelectric generation apparatus, a heat generation apparatus for fuel storage tanks, and a waste heat recovering system according to an embodiment of the present disclosure has an effect of improving the energy efficiency by easily and efficiently producing electric energy by a temperature difference between the components.

A thermoelectric generation apparatus, a heat generation apparatus for fuel storage tanks, and a waste heat recovering system according to an embodiment of the present disclosure has an effect of enabling efficient facility operation as electric energy is produced by using a temperature difference between the components or waste heat of the components.

A thermoelectric generation apparatus, a heat generation apparatus for fuel storage tanks, and a waste heat recovering system according to an embodiment of the present disclosure has an effect of supplying electric power to various facilities stably using the thermoelectric power generation technology.

BRIEF DESCRIPTION OF DRAWINGS

FIG. 1 is a perspective view illustrating a thermoelectric generation apparatus according to an embodiment of the present disclosure.

FIGS. 2 and 3 are perspective views illustrating an example of a thermoelectric element and a thermoelectric generation unit of a thermoelectric generation apparatus according to an embodiment of the present disclosure.

FIG. 4 is a perspective view illustrating a second piping of a thermoelectric generation apparatus according to an embodiment of the present disclosure.

FIGS. 5 and 6 are a front view and a side view illustrating a thermoelectric generation apparatus according to an embodiment of the present disclosure.

FIG. 7 is a perspective view illustrating a second piping having a multi-layer structure of a thermoelectric generation apparatus according to an embodiment of the present disclosure.

FIG. 8 is a perspective view illustrating a thermoelectric generation apparatus according to another embodiment of the present disclosure.

FIG. 9 is a perspective view illustrating a comparative example of a thermoelectric generation apparatus according to another embodiment of the present disclosure.

FIG. 10 is a view schematically illustrating a heat generation apparatus for fuel storage tanks according to an embodiment of the present disclosure.

FIG. 11 is a perspective view illustrating the thermoelectric generation module of FIG. 10 more specifically.

FIG. 12 is a view illustrating a process by which the heat generation apparatus for fuel storage tanks shown in FIG. 10 is operated.

FIG. 13 is a view illustrating a heat generation unit of a heat generation apparatus for fuel storage tanks according to another embodiment of the present disclosure.

FIG. 14 is an exploded perspective view illustrating the heat generation unit of FIG. 13 more specifically.

FIG. 15 is a schematic view illustrating a waste heat recovery system according to an embodiment of the present disclosure.

FIG. 16 is a schematic view illustrating thermoelectric generation units installed in a first engine shown in FIG. 15 in more detail.

FIG. 17 is a perspective view illustrating a thermoelectric generation unit installed in the gas receiver shown in FIG. 15 in more detail.

FIG. 18 is an algorithm for operating engines in accordance with the required power amount and the operation stoppage of the engines.

FIG. 19 is a view illustrating the configuration and operation of a discharge pipe back pressure reduction apparatus according to a first embodiment of the present disclosure.

FIG. 20 is a view illustrating the configuration and operation of a discharge pipe back pressure reduction apparatus according to a second embodiment of the present disclosure.

FIG. 21 is a view illustrating that exhaust gas flows through a main pipe in a discharge pipe back pressure reduction apparatus according to a third embodiment of the present disclosure.

FIG. 22 is a view illustrating that exhaust gas flows through a branch pipe to pass through a scrubber in a discharge pipe back pressure reduction apparatus according to a third embodiment of the present disclosure.

FIG. 23 is a view illustrating a supply aspect of electric energy in a case in which exhaust gas flows through a branch pipe to pass through a scrubber in a discharge pipe back pressure reduction apparatus according to a fourth embodiment of the present disclosure.

FIG. 24 is a view illustrating an aspect in which electric energy is simultaneously supplied to a thermoelectric generation module and an electric power supply unit when exhaust gas flows to a branch pipe and passes through a scrubber in a discharge pipe back pressure reduction apparatus according to a fifth embodiment of the present disclosure.

FIG. 25 is a view illustrating an outside air inflow portion of a ship.

FIG. 26 is a view illustrating each configuration and operation of an ice removal apparatus for an outside air inflow portion according to a first embodiment of the present disclosure.

FIG. 27 is a view illustrating the operation in a case where the number of revolutions of an engine is equal to or less than a reference value in an ice removal apparatus for an outside air inflow portion according to a second embodiment of the present disclosure.

FIG. 28 is a view illustrating the operation in a case where the number of revolutions of an engine is greater than a reference value in an ice removal apparatus for an outside air inflow portion according to a second embodiment of the present disclosure.

FIG. 29 is a view illustrating each configuration and operation of an ice removal apparatus for an outside air inflow portion according to a third embodiment of the present disclosure.

FIG. 30 is a view illustrating a bottom resistance reduction apparatus according to an embodiment of the present disclosure.

FIGS. 31 to 33 are views illustrating in detail a thermoelectric generation unit of a bottom resistance reduction apparatus according to an embodiment of the present disclosure.

FIG. 34 is a view illustrating a bottom resistance reduction apparatus according to another embodiment of the present disclosure.

FIG. 35 is a view illustrating in detail a cooling water thermoelectric generation unit of a bottom resistance reduction apparatus according to another embodiment of the present disclosure.

FIG. 36 is a view illustrating a turbocharger system of a marine structure according to an embodiment of the present disclosure.

FIG. 37 is a view illustrating how to operate the turbocharger system of a marine structure shown in FIG. 36.

FIG. 38 is a view illustrating a turbocharger system of a marine structure according to another embodiment of the present disclosure.

FIG. 39 is a view illustrating how to operate the turbocharger system of a marine structure shown in FIG. 38.

FIG. 40 is a view illustrating an engine of a ship and an exhaust gas discharge route.

FIG. 41 is a view illustrating each configuration and operation of a thrust auxiliary apparatus according to a first embodiment of the present disclosure.

FIG. 42 is a view illustrating the operation in a case where the number of revolutions of a motor is equal to or more than a reference value in a thrust auxiliary apparatus according to a second embodiment of the present disclosure.

FIG. 43 is a view illustrating another type of operation in a case where the number of revolutions of a motor is equal to or more than a reference value in a thrust auxiliary apparatus according to a second embodiment of the present disclosure.

FIG. 44 is a view disclosure each configuration and operation of a thrust auxiliary apparatus according to a third embodiment of the present disclosure.

MODE FOR INVENTION

Hereinafter, embodiments of the present disclosure will be described in detail with reference to the accompanying drawings. The following embodiments are provided to fully convey the spirit of the present disclosure to a person having ordinary skill in the art to which the present disclosure belongs. The present disclosure is not limited to the embodiments shown herein but may be embodied in other forms. The drawings are not intended to limit the scope of the present disclosure in any way, and the size of components may be exaggerated for clarity of illustration.

The terminology used herein is only for the purpose of describing particular embodiments and is not intended to be limiting of the present disclosure. In present disclosure, the singular forms "a" and "an" include plural referents unless the context clearly dictates otherwise. It should be understood that in this application, the terms "comprises" or "having", etc., are used to specify that there is a stated feature, figure, step, operation, element, part or combination thereof, but are used not to preclude the presence or addition of one or more other features, figures, steps, operations, elements, parts, or combinations thereof.

FIG. 1 is a perspective view illustrating a thermoelectric generation apparatus according to an embodiment of the present disclosure. Referring to FIG. 1, a thermoelectric generation apparatus according to an embodiment of the present disclosure includes a first piping 1100, a second piping 1110, first radiating fins 1120, and a thermoelectric generation module 1130.

A fluid may flow through the first piping 1100 and a cooling medium of a lower temperature than the fluid so as to radiate the heat of the fluid may flow through the second piping 1110.

One side of the plurality of first radiating fins 1120 may be in contact with air of a lower temperature than the fluid so as to radiate the heat of the fluid and the other side of the plurality of first radiating fins 1120 may be in contact with the second piping 1110.

The thermoelectric generation module 1130 may be provided between the first piping 1100 and the second piping 1110 to produce electricity through a temperature difference between the first piping 1100 and the second piping 1110.

That is, the thermoelectric generation apparatus according to an embodiment of the present disclosure may generate electricity through a temperature difference between the fluid and at least one of the cooling medium and air.

Further, the thermoelectric generation module 1130 included in the thermoelectric generation apparatus according to an embodiment of the present disclosure includes a plurality of thermoelectric generation units 1135, and the two adjacent thermoelectric generation units 1135 of the thermoelectric generation units 1135 may be connected to each other in series or in parallel.

Heat conducting plates 1140 and second radiating fins 1150 shown in FIG. 1 will be described in detail with reference to FIG. 4.

FIGS. 2 and 3 are perspective views illustrating an example of a thermoelectric element and a thermoelectric generation unit of a thermoelectric generation apparatus according to an embodiment of the present disclosure. Referring to FIG. 2, a thermoelectric element 1136 is a semiconductor made of an N-type element and a P-type element. When the heat of a first medium and a second medium having a temperature difference comes in contact with one side surface and the other side surface of the thermoelectric element 1136, the thermoelectric element 1136 can produce electricity through the Seeback effect.

As shown in FIG. 3, the thermoelectric generation unit 1135 is composed of a plurality of thermoelectric elements 1136, and the plurality of thermoelectric elements 1136 can be connected to each other in series or in parallel.

Accordingly, the thermoelectric generation apparatus according to an embodiment of the present disclosure can control the amount of electric power generated by connecting the plurality of thermoelectric generation unit 1135 included in the thermoelectric generation module 1130 in series or in parallel.

FIG. 4 is a perspective view illustrating a second piping of a thermoelectric generation apparatus according to an embodiment of the present disclosure. As shown in FIG. 4, the thermoelectric generation apparatus according to an embodiment of the present disclosure may further include one or more heat conducting plates 1140 and a plurality of second radiating fins 1150.

Herein, as shown in FIG. 6, the heat conducting plates 1140 may partition the second piping 1110 along the direction in which the cooling medium flows, and the second radiating fins 1150 are in contact with the heat conducting plates 1140 and may protrude in the same direction as the first radiating fins 1120.

The heat of air may be transferred to the second piping 1110 through the second radiating fins 1150 and the heat conducting plates 1140, and transferred to the thermoelectric generation module 1130 through the second piping 1110.

That is, the temperature of one side of the thermoelectric generation module 1130 in contact with the second piping 1110 may be determined by at least one of the cooling medium and the air. For example, if the cooling medium does not flow, the temperature at one side of the thermoelectric generation module 1130 may be determined by air.

In addition, if the cooling medium flows, since both the air and the cooling medium are involved in the transfer of heat, the temperature of one side of the thermoelectric generation module 1130 may be determined by the cooling medium and air. The other side of the thermoelectric generation module 1130 in contact with the first piping 1100 may be determined by the fluid.

FIGS. 5 and 6 are a front view and a side view illustrating a thermoelectric generation apparatus according to an embodiment of the present disclosure. As shown in FIGS. 5 and 6, the first radiating fins 1120 may be connected to a side wall 1160 of the second piping 1110 through which the cooling medium having a lower temperature than the fluid flowing through the first pipe 1100 flows, and the second radiating fins 1150 may be connected to one or more heat conducting plates 1140 that partition the second piping 1110 along the direction in which the cooling medium flows.

Herein, the thermoelectric generation module 1130 may generate electricity through the temperature difference between the cooling medium and the fluid.

Meanwhile, when the cooling medium does not flow due to a system error, the first radiating fins 1120 and the second radiating fins 1150 may discharge the heat of the fluid into the air.

That is, the heat of the fluid is transferred to the first radiating fins 1120 through the side wall 1160 of the second piping 1110 and is further transferred to the second radiating fins 1150 by the heat conducting plates 1140 to be discharged into the air.

Accordingly, in the thermoelectric generation apparatus according to an embodiment of the present disclosure, since the first heat radiating fins 1120 and the second heat radiating fins 1150 are connected to the side wall 1160 of the second piping and the heat conducting plates 1140 respectively, even if the cooling medium does not flow due to a system error or the like, the thermoelectric generation module 1130 may discharge the heat of the fluid flowing in the first piping 1100 into the air while producing electricity through the temperature difference between the air and the fluid.

The second piping 1110 of the thermoelectric generation apparatus according to an embodiment of the present disclosure may have one of a single-layer structure and a multi-layer structure.

FIG. 7 is a perspective view illustrating a second piping having a multi-layer structure of a thermoelectric generation apparatus according to an embodiment of the present disclosure. Referring to FIG. 7, the second piping 1110 having a multi-layer structure includes a first layer 1200 in contact with the thermoelectric generation module 1130, and a second layer 1210 disposed between the first layer 1200 and the first radiating fins 1200.

The cooling medium flowing through the second piping 1110 having a multi-layer structure flows out of the first layer 1200 and flows into the second layer 1210 or flows out of the second layer 1210 and flows into the first layer 1200.

That is, since the amount of the cooling medium flowing through the second piping 1110 having a multi-layer structure is greater than the amount of the cooling medium flowing through the second piping 1110 having a single-layer structure, a thermoelectric generation apparatus including the second piping 1110 having a multi-layer structure may produce more electric power.

FIG. 8 is a perspective view illustrating a thermoelectric generation apparatus according to another embodiment of the present disclosure. As shown in FIG. 8, the first piping 1100 may include a plurality of first unit pipes 1300 corresponding to the thermoelectric generation units 1135, and the second piping 1110 may include a plurality of second unit pipes 1310 corresponding to the thermoelectric generation units 1135.

Herein, the first unit pipes 1300 are connected to each other, and the second unit pipes 1310 are also connected to each other. The connection of the first unit pipes 1300 may be accomplished by various methods such as welding or bolting. The connection of the second unit pipes 1310 may also be accomplished by various methods such as welding or bolting.

Accordingly, the fluid may flow out of one first unit pipe 1300 and flow into another adjacent first unit pipe 1300, and the cooling medium may flow out of one second unit pipe 1310 and flow into another adjacent second unit pipe 1310.

In the thermoelectric generation apparatus according to another embodiment of the present disclosure, the thermoelectric generation unit 1135 may generate electricity through the temperature difference between the first unit pipe 1300 and the second unit pipe 1310, and the adjacent thermoelectric generation unit 1135 may be connected in series or in parallel.

Meanwhile, the thermoelectric generation units 1135 can be influenced by the temperature gradient. The temperature gradient is a temperature difference between the point where the cooling medium or the fluid is drawn in and the point where the cooling medium or the fluid is drawn. The smaller the temperature gradient, the better the quality of electricity produced in the thermoelectric generation units 1135.

Referring to the thermoelectric generation apparatus according to another embodiment of the present disclosure shown in FIG. 8 and a comparative example of a thermoelectric generation apparatus shown in FIG. 9, the temperature gradient between t1 and t2 shown in FIG. 8 may be smaller comparing the temperature gradient between T1 and T2 shown in FIG. 9.

That is, the temperature gradient between the inlet and outlet points of each of the first unit pipes 1300 or the second unit pipes 1310 may be smaller comparing the temperature gradient between the inlet and outlet points of each of a hot side pipe 1100' having a single body and a cool side pipe 1110' having a single body.

Accordingly, the plurality of thermoelectric generation units 1135 that generate electricity through the temperature difference between the first unit pipe 1300 and the second unit pipe 1310 may produce electricity with higher quality than a thermoelectric generation unit 1135' that generates electricity through the temperature difference between the hot side pipe 1100' and the cool side pipe 1110'.

The plurality of thermoelectric generation units 1135 may produce good quality electricity when connected in series or in parallel, and may control the amount of electric power produced according to a series or parallel connection manner thereby to produce electric power by an amount required.

The thermoelectric generation apparatus according to the embodiments of this disclosure may be installed in accordance with the environment because the length of the thermoelectric generation apparatus may be adjusted according to the quantity of the first unit pipes 1300, the second unit pipes 1310, and the thermoelectric generation units 1135 included in the thermoelectric generation apparatus. For example, the quantity of the first unit pipes 1300, the second unit pipes 1310, and the thermoelectric generation units 1135 which are installed may be varied depending on the size of the installation space.

FIG. 10 is a view schematically illustrating a heat generation apparatus for fuel storage tanks according to an embodiment of the present disclosure, and FIG. 11 is a perspective view illustrating a thermoelectric generation module shown in FIG. 10 more specifically. Referring to FIGS. 10 and 11, a heat generation apparatus 2100 for fuel storage tanks according to an embodiment of the present disclosure may include a storage unit 2110, an engine unit 2200, thermoelectric generation modules 2310, 2320 and 2330, and a heat generation unit 2400.

The storage unit 2110 may provide spaces in which fuel is stored. The fuel may be bunker-C oil. However, the fuel is not limited to bunker-C oil, but may be oil having high viscosity in petroleum. The storage unit 2110 may include a first storage tank 2111 and a second storage tank 2112.

The fuel may be supplied from the outside to the first storage tank 2111 and stored in the first storage tank 2111. The storage unit 2110 may further include a connecting pipe 2113 through which the fuel is transferred from the first storage tank 2111 to the second storage tank 2112. Accordingly, the second storage tank 2112 is connected to the first storage tank 2111 and may receive the fuel stored in the first storage tank 2111.

The second storage tank 2112 has a size smaller than that of the first storage tank 2111, and thus more easily regulates the temperature of the fuel than the first storage tank 2111.

The engine unit 2200 may receive the fuel from the storage unit 2110 and provide a rotational force. The engine unit 2200 may include a first engine 2210 and a second engine 2220. The first engine 2210 may provide a propulsion force to a ship and a marine structure through the rotational force, and the second engine 2220 may provide electric power necessary to a marine structure. A first supply pipe 2121 may be installed between the first engine 2210 and the second storage tank 2112. The fuel stored in the second storage tank 2112 may be supplied to the first engine 2210 via the first supply pipe 2121. In addition, a second supply pipe 2122 branched from the first supply pipe 2121 and connected to the second engine 2220 may be installed. However, unlike what is shown in the drawing, the second supply pipe 2122 may be connected directly between the second storage tank 2112 and the second engine 2220 without branching from the first supply pipe 2121.

The thermoelectric generation modules 2310, 2320 and 2330 may produce electric power using the heat generated in the engine unit 2200. The thermoelectric generation modules 2310, 2320 and 2330 may utilize not only the heat generated in the engine unit 2200 itself but also the heat of the exhaust gas generated by driving the engine unit 2200. The thermoelectric generation modules 2310, 2320 and 2330 may be installed in the engine unit 2200 or a path through which the exhaust gas discharged from the engine unit 2200 is moved. In addition, the thermoelectric generation modules 2310, 2320 and 2330 may be composed of a first thermoelectric generation module 2310, a second thermoelectric generation module 2320, and a third thermoelectric generation module 2330.

The first thermoelectric generation module 2310 is installed in the first engine 2210, and may include at least one first high temperature portion (not shown), at least one first low temperature portion (not shown), and at least one first semiconductor element (not shown). The first high temperature portion may be in contact with the heat generated from the engine unit 2200, the first low temperature portion may be in contact with the cooling water supplied to the engine unit 2200, and the first semiconductor element may be provided between the first high temperature portion and the first low temperature portion to produce electric power. The first semiconductor element may be generally a thermoelectric element that generates electricity using heat. Further, the first thermoelectric generation module 2210 may produce electric power according to a temperature difference between the engine unit 2200 and the cooling water. However, the first thermoelectric generation module 2210 is not limited thereto and may be variously configured to produce electric power using the heat of the engine unit 2200.

The second thermoelectric generation module 2320 may be installed in the second engine 2220, and may include at least one second high temperature portion (not shown), at least one second low temperature portion (not shown), and at least one second semiconductor element (not shown). Since the second thermoelectric generation module 2220 is similar with the first thermoelectric generation module 2210, a detailed description thereof will be omitted.

The exhaust gas generated in the first engine 2210 is transferred along a first exhaust pipe 2211, and the exhaust gas generated in the second engine 2220 is transferred along a second exhaust pipe 2221. The second exhaust pipe 2221 may be connected to the first exhaust pipe 2211. Also, a gas receiver 2230 which communicates with the first exhaust pipe 2211 may be installed.

The gas receiver 2230 may temporarily store the exhaust gas transferred along the first exhaust pipe 2211 or the second exhaust pipe 2221, and may reduce the vibration generated as the pressure of the exhaust gas transferred along the first exhaust pipe 2211 or the second exhaust pipe 2221 is increased and then decreased.

The third thermoelectric generation module 2330 may be installed in the gas receiver 2230, and may include at least one third high temperature portion (not shown), at least one third low temperature portion (not shown), and at least one thermoelectric element 2333. The thermoelectric element 2333 is provided between the third high temperature portion and the third low temperature portion.

The third thermoelectric generation module 2330 may further include a fluid supply unit 2260 which supplies a fluid to the third thermoelectric generation module 2330. The fluid may be sea water or fresh water converted from sea water. Further, the fluid may be cooling water for cooling the engine unit 2200.

The third high temperature portion may be in contact with the heat of the exhaust gas flowing along the gas receiver 2230, and the third low temperature portion may be in contact with the fluid. Accordingly, the thermoelectric element 2333 may be provided between the third high temperature portion and the third low temperature portion to produce electric power. That is, the thermoelectric element 2333 may produce electric power according to a temperature difference between the exhaust gas and the fluid.

The third thermoelectric generation module 2330 will be described in detail as follows with reference to FIG. 11. The third thermoelectric generation module 2330 may include one or more first flow paths 2331, one or more second flow paths 2332, and the one or more thermoelectric elements 2333.

A fluid may flow through the first flow paths 2331. The first flow paths 2331 may receive the fluid from the fluid supply unit 2260. The fluid is supplied to the first flow paths 2331 via a fluid supply line 2261 from the fluid supply unit 2260. Further, the first flow paths 2331 may communicate with the fluid supply line 2261.

The exhaust gas discharged from the engine unit 2200 may flow through the second flow paths 2332. The second flow paths 2332 may communicate with the first exhaust pipe 2211 or the second exhaust pipe 2221. The first flow paths 2331 and the second flow paths 2332 may be arranged alternately in the gas receiver 2230.

The flow direction L of the fluid flowing through the first flow paths 2331 may be substantially perpendicular to the flow direction G of the exhaust gas flowing through the second flow paths 2332. The first flow paths 2331 may be blocked on the routes through which the exhaust gas flows. That is, the first flow paths 2331 may block the flow of the exhaust gas. Likewise, the second flow paths 2332 may be blocked on the routes through which the fluid flows. That is, the second flow paths 2332 may block the flow of the fluid.

The thermoelectric elements 2333 is provided between the first flow paths 2331 and the second flow paths 2332, and may produce electric power due to a temperature difference between the fluid and the exhaust gas.

The heat generation apparatus 2100 for fuel storage tanks according to an embodiment of the present disclosure may further include a steam generation unit 2270. The steam generation unit 2270 is connected to the third thermoelectric generation unit 2330, and may receive the fluid passing through the first flow paths 2331. Since the steam generating unit 2270 produces steam by receiving the fluid passing through the first flow paths 2331, the energy required to produce the steam can be reduced.

The heat generation unit 2400 is installed in the storage unit 2110, and may increase the temperature of the fuel by receiving electric power from the thermoelectric generation modules 2310, 2320, and 2330. The electric power produced by the first thermoelectric generation module 2310 may be supplied to the heat generation unit 2400 along a first conducting wire 2312, the electric power produced by the second thermoelectric generation module 2320 may be supplied to the heat generation unit 2400 along a second conducting wire 2322, and the electric power produced by the third thermoelectric generation module 2330 may be supplied to the heat generation unit 2400 along a third conducting wire 2332. The heat generation unit 2400 is connected to the first thermoelectric generation module 2310, the second thermoelectric generation module 2320, and the third thermoelectric generation module 2330 in parallel, but, unlike what is shown, a series connection is also possible.

The heat generation unit 2400 may include a heating wire 2410. The heating wire 2410 may radiate heat by the electric power supplied from the thermoelectric generation modules 2310, 2320 and 2330.

As such, the heat generation apparatus 2100 for the fuel storage tanks according to the present embodiment may produce electric power using the heat generated by driving the engine unit 2200, and heat the fuel in the storage unit 2110 using the produced electric power, thereby increasing the fluidity of the fuel supplied to the engine unit 2200.

Further, the heat generation apparatus 2100 may produce electric power using the waste heat of the engine unit 2200, thereby reducing energy for operating the heat generation unit 2400.

In a case where the heat generation apparatus 2100 for the fuel storage tanks according to the present embodiment is applied to a marine structure, it becomes unnecessary to use a conventional configuration utilizing steam, thereby reducing the weight of a marine structure itself and enhancing the space utilization in the marine structure.

FIG. 12 is a view illustrating a process by which the heat generation apparatus for fuel storage tanks shown in FIG. 10 is operated.

First, the first thermoelectric generation module 2310 produces electric power using the heat of the first engine 2210. The electric power of the first thermoelectric generation module 2310 is supplied to the heat generation unit 2400 along the first conducting wire 2312.—①

The second thermoelectric generation module 2320 produces electric power using the heat of the second engine 2220. The electric power of the second thermoelectric generation module 2320 is supplied to the heat generation unit 2400 along the second conducting wire 2322.—②

The exhaust gas of the first engine 2210 is supplied to the gas receiver 2230 along the first exhaust pipe 2211. On the other hand, the exhaust gas stored in the gas receiver 2230 is used for thermoelectric generation and then discharged to the outside.—③

The exhaust gas of the second engine 2220 is supplied to the gas receiver 2230 along the second exhaust pipe 2221.—④

The exhaust gas supplied to the gas receiver 2230 is used to produce electric power of the third thermoelectric generation module 2330. That is, the third thermoelectric generation module 2330 may produce electric power by receiving the fluid from the fluid supply unit 2260 and by utilizing a temperature difference between the exhaust gas and the fluid.

The electric power of the third thermoelectric generation module 2330 is supplied to the heat generation unit 2400 along the third conducting wire 2332.—⑤

As such, the heat generation apparatus 2100 for the fuel storage tanks according to the present embodiment may produce electric power using the heat generated by the driving of the engine unit 2200, and operate the heat generation unit 2400 using the electric power, thereby reducing the energy used for the heat generation unit 2400.

Meanwhile, the heat generation unit 2400 increases the temperature of the fuel stored in the first storage tank 2111. The fuel stored in the first storage tank 2111 is transferred to the second storage tank 2112 along the connecting pipe 2113.—⑥

The fuel stored in the second storage tank 2112 is preheated by the heat generation unit 2400. Particularly, in a case where the fuel is a bunker-C oil, in order to transfer the bunker-C oil to the engine unit 2200, the heat generation unit 2400 is operated so that the temperature of the bunker-C oil in the second storage tank 2112 becomes approximately 45° C. to 50° C. However, the temperature of the bunker-C oil is not limited to this temperature range, and it is sufficient if the bunker-C oil has a temperature at which fluidity can be secured.

The fuel preheated in the second storage tank 2112 is supplied to the first engine 2210 along the first supply pipe 2121.—⑦

The fuel in the second storage tank 2112 is supplied to the second engine 2220 along the second supply pipe 2122.—⑧

As such, the heat generation apparatus 2100 for the fuel storage tanks according to the present embodiment has an advantage that a conventional configuration for using steam is not necessary because the heat generation apparatus 2100 uses the waste heat of the engine unit 2200 as electric power to preheat the fuel.

Further, the heat generation apparatus 2100 for the fuel storage tanks according to the present embodiment may produce electric power by using the waste heat of the engine unit 2200, thereby reducing energy for producing electric power itself.

Meanwhile, the fluid passing through the third thermoelectric generation module 2330 may be supplied to the steam generation unit 2270 through a steam supply line 2271. Accordingly, the energy necessary for the steam generation unit 2270 may be reduced.—⑨

FIG. 13 is a view illustrating a heat generation unit of a heat generation apparatus for fuel storage tanks according to another embodiment of the present disclosure. Since the components applied to the present embodiment are similar to those of the above-described embodiment, a heat generation unit will be mainly described.

Heat generation units 2401 may be installed at a lower portion of the first storage tank 2111 or the second storage tank 2112. The heat generation units 2401 may be formed to surround the lower portion of the first storage tank 2111 or the lower portion of the second storage tank 2112. Unlike the above-described embodiment, the heat generation units 2401 may be formed in a plate shape. Accordingly, the heat generation units 2401 have an advantage in that they may be additionally easily installed without replacing or structurally changing a conventional fuel storage tank.

Further, the heat generation units 2401 may be formed to surround the connecting pipe 2113 from the outside. Accordingly, it is possible to prevent the viscosity from increasing again in the process of transferring the fuel from the first storage tank 2111 to the second storage tank 2112.

FIG. 14 is an exploded perspective view illustrating the heat generation unit of FIG. 13 more specifically. Referring to FIG. 14, the heat generation unit 2401 may include a first sheet 2421, a plurality of heat generating elements 2422, first metal films 2423, second metal films 2424, and a second sheet 2425.

The first sheet 2421 may be made of a resin. The first sheet 2421 may be made of a synthetic resin or a natural resin. Further, the first sheet 2421 may be a resin having excellent thermal conductivity among the resins.

The plurality of heat generating elements 2422 may be stacked on the first sheet 2421. The plurality of heat generating elements 2422 may be arranged to be spaced apart from each other. Unlike the above-described embodiment, the heat generating elements 2422 may be made of carbon. The plurality of heat generating elements 2422 may be bonded to the first sheet 2421 and may be bonded using a paste made of carbon.

The first metal films 2423 are stacked on the first sheet 2421, and may be connected to the plurality of heat generating elements 2422 in an intersecting manner. The first metal films 2423 may intersect at both ends of the plurality of heat generating elements 2422. The length of the first metal films 2423 may correspond to a sum of a width of the plurality of heat generating elements 2422 and a spaced distance between the respective heat generating elements 2422. The material of the first metal films 2423 may be silver. Further, the first metal films 2423 may be formed of a thin film of silver to be attached to the first sheet 2421 or may be formed of a paste of silver to be adhered to the first sheet 2421. However, the material of the first metal films 2423 is not limited to silver, and it may be formed of a conductive metal having good thermal conductivity among metals.

The second metal films 2424 are in contact with the first metal films 2423 and are spaced apart from the heat generating element 2422. The second metal films 2424 may be stacked on the first metal films 2423. The second metal films 2424 may correspond to the length of the first metal films 2423 and the width of the second metal films 2424 may be smaller than the width of the first metal films 2423. The material of the second metal films 2424 may be copper. However, the material of the second metal films 2424 is not limited to copper, and may be a metal having good electrical conductivity. The second metal films 2424 may transmit electric power supplied from the thermoelectric generation modules 2310, 2320, and 2330 to the heat generating elements 2422 through the first metal films 2423.

The second sheet 2425 is stacked on the first sheet 2421 and may cover the plurality of heat generating elements 2422, the first metal films 2423, and the second metal films 2424. That is, the second sheet 2425 may protect the plurality of heat generating elements 2422, the first metal films 2423, and the second metal films 2424 from the outside together with the first sheet 2421.

FIG. 15 is a schematic view illustrating a waste heat recovery system according to an embodiment of the present disclosure, and FIG. 16 is a schematic view illustrating thermoelectric generation units installed in a first engine shown in FIG. 15 in more detail. Referring to FIGS. 15 and 16, a waste heat recovery system according to an embodiment of the present disclosure may include a plurality of thermoelectric generation modules 3200 that produce electric power using the heat of an engine unit 3100, and a first transformer 3310 connected in series with the plurality of thermoelectric generation modules 3200. Herein, the engine unit 3100 may include a first engine 3110, a second engine 3120, and a third engine 3130. The first engine 3110 may provide a propulsion force to a marine structure such as a ship, and the second engine 3120 and the third engine 3130 may provide electric power required by a marine structure. Further, the third engine 3130 may be operated when the second engine 3120 is stopped.

The plurality of thermoelectric generation modules 3200 may produce electric power using the heat generated from the engine unit 3100. The plurality of thermoelectric generation modules 3200 may use not only the heat generated from the engine unit 3100 itself, but also the heat of the exhaust gas generated by driving the engine unit 3100. The plurality of thermoelectric generation modules 3200 may be installed in the engine unit 3100 or on a path through which the exhaust gas discharged from the engine unit 3100 is moved. The thermoelectric generation modules 3200 may include a first thermoelectric generation module 3210, a second thermoelectric generation module 3220, a third thermoelectric generation module 3230, and a fourth thermoelectric generation module 3240.

The first thermoelectric generation module 3210 may be installed in the first engine 2210, and may include at least one first high temperature portion (not shown), at least one first low temperature portion (not shown), and at least one first semiconductor element (not shown). The first high temperature portion may be in contact with the heat generated from the first engine 3110, the first low temperature portion may be in contact with the cooling water supplied to the first engine 3110, and the first semiconductor element may be provided between the first high temperature portion and the first low temperature portion to produce electric power. The first semiconductor element may be generally a thermoelectric element that produces electric power using heat. Further, the first thermoelectric generation module 3210 may produce electric power according to a temperature difference between the first engine 3100 and the cooling water. However, the first thermoelectric generation module 3210 is not limited thereto and may be variously configured to produce electric power using the heat of the first engine 3110.

The second thermoelectric generation module 3220 may be installed in the second engine 3210, and may include at least one second high temperature portion (not shown), at least one second low temperature portion (not shown), and at least one second semiconductor element (not shown). Since the second thermoelectric generation module 3220 is similar with the first thermoelectric generation module 3210, a detailed description thereof will be omitted.

Meanwhile, the exhaust gas generated in the first engine 3110 is transferred along a first exhaust pipe 3111, and the exhaust gas generated in the second engine 3120 is transferred along a second exhaust pipe 3121. The second exhaust pipe 3121 may be connected to the first exhaust pipe 3111. The exhaust gas generated in the third engine 3130 is transferred along a third exhaust pipe 3131, and the third exhaust pipe 3131 may be connected to the first exhaust pipe 3111. Further, a gas receiver 3150 which communicates with the first exhaust pipe 3111 may be installed.

The gas receiver 3150 may temporarily store the exhaust gas transferred along the first exhaust pipe 3111, the second exhaust pipe 3121 or the third exhaust pipe 3131, and may reduce the vibration generated as the pressure of the transferred exhaust gas is increased and then decreased.

The gas receiver thermoelectric generation module 3250 may be installed in the gas receiver 3210, and may include at least one high temperature portion (not shown), at least one low temperature portion (not shown), and at least one thermoelectric element 3253 (FIG. 17). The thermoelectric element 3253 is provided between the high temperature portion and the low temperature portion.

The gas receiver thermoelectric generation module 3250 may further include a fluid supply unit (not shown) which supplies a fluid to the gas receiver thermoelectric generation module 3250. The fluid may be sea water or fresh water converted from seawater. Further, the fluid may be cooling water for cooling the engine unit 3100.

The high temperature portion may be in contact with the heat of the exhaust gas flowing along the gas receiver 3150, and the low temperature portion may be in contact with the fluid. Accordingly, the thermoelectric element 3243 may be provided between the high temperature portion and the low temperature portion to produce electric power. That is, the gas receiver thermoelectric generation module 3250 may produce electric power according to a temperature difference between the exhaust gas and the fluid.

Further, the thermoelectric generation module 3200 may be installed in a device for generating waste heat such as a silencer or an organic Rankine cycle (ORC) installed on the first exhaust pipe 3111 although not shown in the drawings.

The first transformer 3310 may be connected in parallel with the plurality of thermoelectric generation modules 3200. The electric power of the first thermoelectric generation module 3210 may be transferred to the first transformer 3310 along the first conducting wire 3211, the electric power of the second thermoelectric generation module 3220 may be transferred to the first transformer 3310 along the second conducting wire 3221, the electric power of the third thermoelectric generation module 3230 may be transferred to the first transformer 3310 along the third conducting wire 3231, and the electric power of the gas receiver thermoelectric generation module 3250 may be transferred to the first transformer 3310 along the fourth conducting wire 3241.

The first transformer 3310 may convert the voltage of the electric power supplied from the plurality of thermoelectric generation modules 3200. For example, the first transformer 3310 may increase the voltage of the electric power supplied from the plurality of thermoelectric generation modules 3200 to 440V. Further, the first transformer 3310 may convert the DC voltage of the plurality of thermoelectric generation modules 3200 into an AC voltage.

As such, the waste heat recovery system according to an embodiment of the present disclosure may produce electric power using heat generated by driving the engine unit 3100.

Further, since the plurality of thermoelectric generation modules 3200 are connected in series to the first transformer 3310, even if any one of the plurality of thermoelectric generation modules 3200 is stopped, it is possible to prevent the electric power in a marine structure from dropping rapidly. That is, the waste heat recovery system according to the present embodiment may prevent cessation of the entire electric power in a marine structure due to a rapid electric power decrease of the plurality of thermoelectric generation modules 3200.

The waste heat recovery system according to the present embodiment may further include a second transformer 3320. The second transformer 3320 may be connected in series with the second engine 3120 or the third engine 3130.

Further, the first transformer 3310 and the second transformer 3320 may be connected in parallel. Accordingly, in a case where the electric power supplied through the first transformer 3310 drops rapidly, the electric power supplied through the second transformer 3320 may be increased to prevent shutdown of the electric power in the marine structure.

Referring to FIG. 16, the first thermoelectric generation module 3210 applied to the waste heat recovery system according to the present embodiment may include a plurality of thermoelectric generation units 3213, 3214 and 3215 connected in parallel. Since the first thermoelectric generation module 3210 includes the plurality of thermoelectric generation units 3213, 3214, and 3215 connected in parallel to each other, it is possible to maintain a constant voltage even if any one of the plurality of thermoelectric generation units 3213, 3214, and 3215 fails. Like the first thermoelectric generation module 3210, the second thermoelectric generation module 3220, the third thermoelectric generation module 3230 or the fourth thermoelectric generation module 3240 also includes a plurality of thermoelectric generation units.

Further, each of the plurality of thermoelectric generation units 3213, 3214, and 3215 may include a plurality of thermoelectric elements (not shown) connected in series. Accordingly, the thermoelectric generation units 3213, 3214, and 3215 may produce a voltage required in a marine structure, for example, a voltage of 440V.

FIG. 17 is a perspective view illustrating a thermoelectric generation unit installed in the gas receiver shown in FIG. 15 in more detail. The gas receiver thermoelectric generation module 3250 may include one or more first flow paths 3251, one or more second flow paths 3252, and one or more thermoelectric elements 3253.

A fluid may flow through the first flow paths 3251. Herein, the fluid may be sea water or fresh water converted from sea water. Further, the fluid may be cooling water for cooling the engine unit 3100.

The exhaust gas discharged from the engine unit 3100 may flow through the second flow paths 3252. The second flow paths 3252 may communicate with the first exhaust pipe 3111, the second exhaust pipe 3121 or the third exhaust pipe 3131. The first flow paths 3251 and the second flow paths 3252 may be arranged alternately in the gas receiver 3150.

The flow direction L of the fluid flowing through the first flow paths 3251 may be substantially perpendicular to the flow direction G of the exhaust gas flowing through the second flow paths 3252. The first flow paths 3251 may be blocked on the routes through which the exhaust gas flows. That is, the first flow paths 3251 may block the flow of the exhaust gas. Likewise, the second flow paths 3252 may be blocked on the routes through which the fluid flows. That is, the second flow paths 3252 may block the flow of the fluid.

The thermoelectric elements 3253 are provided between the first flow paths 3251 and the second flow paths 3252, and may produce electric power due to a temperature difference between the fluid and the exhaust gas.

FIG. 18 is an algorithm for operating engines in accordance with the required power amount of a marine structure and the operation stoppage of the engines.

The engine unit 3100 may further include a fourth engine 3140. Like the second engine 3120 or the third engine 3130, the fourth engine 3140 may provide electric power necessary for a marine structure. The fourth engine 3140 may be connected in parallel to the second engine 3120 and the third engine 3130, respectively. The fourth engine 3140 may be also connected to the second transformer 3320.

The plurality of thermoelectric generation modules 3200 may include the fourth thermoelectric generation module 3240. The fourth thermoelectric generation module 3240 may be installed in the fourth engine 3140 to produce electric power using the heat of the fourth engine 3140. Since the fourth thermoelectric generation module 3240 is similar to the second thermoelectric generation module 3220 or the third thermoelectric generation module 3230, a detailed description thereof will be omitted.

The amount of electric power necessary for the marine structure may be the sum 3× of the amounts of electric power produced by the second engine 3120, the third engine 3130, the first thermoelectric generation module 3210, the second thermoelectric generation module 3220, the third thermoelectric generation module 3230, and the gas receiver thermoelectric generation module 3250.

In a case where the amount of electric power required by the marine structure is satisfied by the sum 3× of the electric power amounts, the second engine 3120 and the third engine 3130 may be operated at a first load, for example, 80% load.

As shown in FIG. 18, when the operation of the second engine 3120 is stopped, the fourth engine 3140 may be operated. The fourth engine 3140 produces electric power according to the operation of the fourth engine 3140 and the fourth thermoelectric generation module 3240 installed in the fourth engine 3134 may also produce electric power.

That is, the electric power produced by third engine 3130, the fourth engine 3140, the first thermoelectric generation module 3210, the third thermoelectric generation module 3230, the fourth thermoelectric generation module 3240, and the gas receiver thermoelectric generation module 3250 may be supplied to a marine structure.

Similarly, when the operation of the third engine 3130 is stopped, the fourth engine 3140 may be operated. The fourth engine 3140 produces electric power according to the operation of the fourth engine 3140 and the fourth thermoelectric generation module 3240 installed in the fourth engine 3134 may also produce electric power.

That is, the electric power produced by the second engine 3120, the fourth engine 3140, the first thermoelectric generation module 3210, the second thermoelectric generation module 3220, the fourth thermoelectric generation module 3240, and the gas receiver thermoelectric generation module 3250 may be supplied to a marine structure.

As such, the waste heat recovery system according to the present embodiment may replace the amount of electric power produced by the second engine 3120 or the third engine 3130 and the amount of electric power produced by the second thermoelectric generation module 3220 or the third thermoelectric generation module 3230 with the amount of electricity generated by the fourth engine 3140 and the fourth thermoelectric generation module 3240 by activating the fourth engine 3140 when the second engine 3120 or the third engine 3130 is stopped. Further, the waste heat recovery system according to the present embodiment may prevent the generation of a trouble in the electric power supply of the entire marine structure due to the rapid drop of the amount of electric power produced by the second thermoelectric generation module 3220 or the third thermoelectric generation module 3230.

Meanwhile, in a case where the amount of electric power required by the marine structure is greater than the sum 3× of the electric power amounts, the electric power produced by the second engine 3120, the third engine 3130, the fourth engine 3140, the first thermoelectric generation module 3210, the second thermoelectric generation module 3220, the third thermoelectric generation module 3230, the fourth thermoelectric generation module 3240, and the gas receiver thermoelectric generation module 3250 may be supplied to the marine structure.

At this time, the second engine 3120, the third engine 3130 and the fourth engine 3140 may be operated at a second load, for example, 60% load.

Also, in a case where the operation of any one of the second engine 3120, the third engine 3130 and the fourth engine 3140 is stopped, the engine in operation may be operated at a third load, for example, 100% load.

In a case where the operation of the second engine 3120 is stopped, the electric power produced by the third engine 3130, the fourth engine 3140, the first thermoelectric generation module 3210, the third thermoelectric generation module 3230, the fourth thermoelectric generation module 3240, and the gas receiver thermoelectric generation module 3250 may be supplied to the marine structure.

In a case where the operation of the third engine 3130 is stopped, the electric power produced by the second engine 3120, the fourth engine 3140, the first thermoelectric generation module 3210, the second thermoelectric generation module 3220, the fourth thermoelectric generation module 3240, and the gas receiver thermoelectric generation module 3250 may be supplied to the marine structure.

In a case where the operation of the fourth engine 3140 is stopped, the electric power produced by the second engine 3120, the third engine 3130, the first thermoelectric generation module 3210, the second thermoelectric generation module 3220, the third thermoelectric generation module 3230, and the gas receiver thermoelectric generation module 3250 may be supplied to the marine structure.

As such, the waste heat recovery system of a marine structure according to the present embodiment may prevent the electric power supply in the marine structure from dropping rapidly by regulating the load of the second engine 3120, the third engine 3130 and the fourth engine 3140 in a case where the electric power production ceases depending on the deactivation of the second engine 3120, the third engine 3130 or the fourth engine 3140 in the process of producing electric power using the plurality of thermoelectric generation modules.

FIG. 19 is a view illustrating the configuration and operation of a discharge pipe back pressure reduction apparatus according to a first embodiment of the present disclosure.

As shown in FIG. 19, the exhaust gas generated from an engine 410 of a ship is discharged to the outside through an exhaust gas discharge pipe 420 provided with a scrubber 440. As such, various waste heat generating sources may be included between the exhaust gas discharge routes from the engine 410.

In the case of the present disclosure, a thermoelectric generation module 4100 having one or more thermoelectric elements is provided in the waste heat generating source, through which waste heat is converted into electric energy.

In FIG. 19, the thermoelectric generation module 4100 is provided in the exhaust gas discharge pipe 420 to recover waste heat, but is not limited thereto. The waste heat generating sources may include at least one of various components such as an economizer (not shown) and the engine 410 in addition to the exhaust gas discharge pipe 420.

Meanwhile, in the case of the present embodiment, a blowing fan 430 rotatably provided in the exhaust gas discharge pipe 420 and reducing the back pressure of the exhaust gas discharge pipe 420 is provided. The blowing fan 430 may selectively receive the electric energy generated by the thermoelectric generation module 4100 described above.

That is, since the present disclosure may generate electric energy using the waste heat of a ship, the energy consumption is minimized and the back pressure of the exhaust gas discharge pipe 420 is reduced by rotating the blowing fan 430 according to the situation.

Hereinafter, other embodiments of the present disclosure will be described in order.

FIG. 20 is a view illustrating the configuration and operation of a discharge pipe back pressure reduction apparatus according to a second embodiment of the present disclosure.

A second embodiment of the present disclosure shown in FIG. 20 is configured in the same manner as the first embodiment described above as a whole, but differs from the first embodiment in that a plurality of the waste heat generating sources are provided and the thermoelectric modules 4100a, 4100b, and 4100c are provided in the plurality of waste heat generating sources, respectively.

Specifically, in this embodiment, an engine, the exhaust gas discharge pipe 420, and an economizer 450 are provided, and thermoelectric generation modules 4100a, 4100b, and 4100c are provided in each of them. Each of the thermoelectric generation modules 4100a, 4100b, and 4100c supplies the generated electric energy to the blowing fan 430 side.

As such, the present disclosure may be provided in a form in which the thermoelectric generation modules 4100a. 4100b, and 4100c are provided in a plurality of waste heat generating sources.

FIG. 21 is a view illustrating that exhaust gas flows through a main pipe in a discharge pipe back pressure reduction apparatus according to a third embodiment of the present disclosure.

In the case of a third embodiment of the present disclosure shown in FIG. 21, the thermoelectric generation module 4100 is provided in the exhaust gas discharge pipe 420. The exhaust gas discharge pipe 420 includes a main pipe 420a, and a branch pipe 420b branching from the main pipe 420a and communicating with the main pipe 420a at one side and the other side. The scrubber 440 is provided in the branch pipe 420b. The exhaust gas discharge pipe 420 may be provided with an on-off valve 424 for selectively opening and closing the main pipe 420a and the branch pipe 420b.

Of course, the present disclosure is not limited thereto, and the scrubber 440 may be provided in the branch pipe 420b or may be provided in the main pipe 420a. The reason why the exhaust gas discharge pipe 420 has the branch pipe 420b and the scrubber 440 is to discharge the exhaust gas in accordance with the environmental regulations of the ship operating area.

That is, when navigating an area adopting the Tier II criteria, the exhaust gas may be discharged without using the scrubber 440. Accordingly, in this case, the branch pipe 420b may be closed by operating the on-off valve 424, and the exhaust gas may be discharged only through the main pipe 420a. That is, since the exhaust gas does not pass through the scrubber 440, the energy consumption for operating the scrubber 440 may be reduced, and the back pressure in the exhaust gas discharge pipe 420 may be further reduced.

Also in this embodiment, the electric energy generated by the thermoelectric generation module 4100 may be used to drive the blowing fan 430.

FIG. 22 is a view illustrating that exhaust gas flows through the branch pipe 420*b* to pass through the scrubber 440 in a discharge pipe back pressure reduction apparatus according to a third embodiment of the present disclosure.

In the case of FIG. 22 where a ship navigates to an area adopting Tier III criteria, a part of the main pipe 420*a* may be closed by operating the on-off valve 424, and the exhaust gas may be exhausted via the branch pipe 420*a*. That is, in such a case, since the exhaust gas passes through the scrubber 440, the harmful substances contained in the exhaust gas may be reduced and discharged according to the environmental standard.

At this time, the scrubber 440 may be connected to a fresh water supply unit 442 to receive clean water for reducing harmful substances.

FIG. 23 is a view illustrating a supply aspect of electric energy in a case in which exhaust gas flows through the branch pipe 420*b* to pass through the scrubber 440 in a discharge pipe back pressure reduction apparatus according to a fourth embodiment of the present disclosure.

A fourth embodiment shown in FIG. 23 is the same as the third embodiment shown in FIG. 22 described above in that the exhaust gas flows into the branch pipe 420*b* to pass through the scrubber 440, but differs from the third embodiment in that the electric energy generated through the thermoelectric generation module 4100 is supplied to the fresh water supply unit 442 side.

In the present embodiment, an electric power supply unit 460 using a power source in a ship is further provided, and the blowing fan 430 receives electric energy through the electric power supply unit 460.

Although not shown in the drawing, a controller (not shown) for checking the amount of electric energy generated in the thermoelectric generation module 4100 and distributing and supplying the generated electric energy and the electric energy from the electric power supply unit 460 to the blowing fan 430 or the fresh water supply unit 442, may be further provided.

As such, the thermoelectric generation module 4100 may supply the generated electric energy to either the blowing fan 430 or the fresh water supply unit 442 of the scrubber 440, and in this case, the electric power supply unit 460 may supply electric energy to the other one of the blowing fan 430 or the fresh water supply unit 442 of the scrubber 440.

That is, in this embodiment, the thermoelectric generation module 4100 supplies electric energy to the fresh water supply unit 442, and the electric power supply unit 460 supplies electric energy to the blowing fan 430, but, conversely, the thermoelectric generation module 4100 may supply electric energy to the blowing fan 430, and the electric power supply unit 460 may supply electric energy to the fresh water supply unit 442.

FIG. 24 is a view illustrating a fifth embodiment of the present disclosure. A discharge pipe back pressure reduction apparatus according to a fifth embodiment is the same as the fourth embodiment shown in FIG. 23 described above in that the exhaust gas flows into the branch pipe 420*b* to pass through the scrubber 440, but may simultaneously supply the electric energy generated through the thermoelectric generation module 4100 to the blowing fan 430 and the fresh water supply unit 442.

In the present embodiment, the electric power supply unit 460 using a power source in a ship is further provided, and in a case where the amount of electric energy generated in the thermoelectric generation module 4100 is insufficient to drive both the blowing fan 430 and the fresh water supply unit 442, electric power may be supplied to at least one of the blowing fan 430 and the fresh water supply unit 442, which is insufficient in electric power, through the electric power supply unit 460 as much as the amount of electric power insufficient.

FIG. 25 is a view illustrating an outside air inflow portion of a ship.

As shown in FIG. 25, a ship 51 is provided with an outside air inflow portion 530 for inflowing outside air. When the ship 51 sails in a low-temperature environment such as the polar region, freezing occurs in the outside air inflow portion 530.

The exhaust gas generated from an engine 510 of the ship 51 is discharged to the outside through an exhaust gas discharge pipe 520. As such, various waste heat generating sources may be included between the exhaust gas discharge routes from the engine 510.

In the case of the present disclosure, a thermoelectric generation module 5100 having one or more thermoelectric elements is provided in the waste heat generating source, through which waste heat is converted into electric energy. At this time, the thermoelectric generation module 5100 may produce electric power according to a temperature difference between the waste heat and the outside air inflowing through the outside air inflow portion 530.

In FIG. 25, the thermoelectric generation module 5100 is provided in the exhaust gas discharge pipe 520 to recover waste heat, but is not limited thereto. The waste heat generating sources may include at least one of various components such as the engine 510, the exhaust gas discharge pipe 520, and an economizer (not shown).

Hereinafter, the present embodiment in which the thermoelectric generation module 5100 is provided on the exhaust gas discharge pipe 520 will be described.

An ice removal apparatus for an outside air inflow portion according to the present disclosure includes an ice removal module for removing ice generated in the outer air inflow portion 530 of the ship 51 by using the electric energy generated from the thermoelectric generation module 5100. The ice removal module may be implemented in various forms. Hereinafter, specific embodiments will be described.

FIG. 26 is a view illustrating each configuration and operation of an ice removal apparatus for an outside air inflow portion according to a first embodiment of the present disclosure.

As shown in FIG. 26, the ice removal module of an ice removal apparatus for an outside air inflow portion according to a first embodiment of the present disclosure includes a heating coil 532 provided with the outside air inflow portion 530, and a heating unit 5120 for heating air using the electric energy generated from the thermoelectric generation module 5100.

The heating coil 532 is installed in the outside air inflow portion 530 to eliminate freezing occurring in the outside air inflow portion 530 of the ship 51 using the electric energy generated from the thermoelectric generation module 5100.

The ice removal module further includes a blowing unit 5130 for blowing the heated air to the outside air inflow portion 530. The blowing unit 5130 heats the air using the electric energy generated from the thermoelectric generation module 5100 and blows the heated air to the outside air inflow portion 530.

Further, the ice removal module may further include a compressing unit 5110 for compressing outside air and supplying the compressed air to the heating unit 5120.

As such, according to this embodiment, the freezing of the outside air inflow portion 530 may be removed by using the heating coil 532 and a blowing fan 5132 provided in the blowing unit 5130. At this time, the thermoelectric generation module 5100 may generate electric energy using the waste heat of the exhaust gas discharge pipe 520, and supply the electric energy to each component side of the ice removal module.

That is, the present disclosure is capable of generating electric energy by using waste heat of a ship, thereby minimizing energy consumption.

FIG. 27 is a view illustrating the operation in a case where the number of revolutions of an engine is equal to or less than a reference value in an ice removal apparatus for an outside air inflow portion according to a second embodiment of the present disclosure.

A second embodiment of the present disclosure shown in FIG. 27 has the same components as those of the first embodiment described above, but differs from the first embodiment in that a controller 5200 is further provided and the waste heat generating source includes the engine 510.

The controller 5200 senses the number of revolutions of the engine 510 of the ship and controls the ice removal module according to the number of revolutions of the engine 510.

The controller 5200 senses the number of revolutions of the engine 510 of the ship and supplies electric energy to the heating unit 5120 and the heating coil 532 when the number of revolutions of the engine 510 is greater than a reference value, and supplies electric energy to the heating coil 532 when the number of revolutions of the engine 510 is not more than the reference value.

FIG. 27 shows a case where the number of revolutions of the engine 510 is not more than the reference value. Specifically, the controller 5200 senses the number of revolutions of the engine 510 and compares the number of revolutions with the reference value, and determines that the amount of waste heat is not sufficient when the number of revolutions of the engine 510 is not more than the reference value and does not supply the electric energy to the blowing unit 5130, the heating unit 5120, and the compressing unit 5110 to only operate the heating coil 532.

That is, according to this embodiment, the controller 5200 is capable of predicting the amount of electric energy generated by the amount of waste heat and supplying the electric energy appropriately.

However, the above is only one example, and it is also possible to operate other components of the ice removal apparatus in place of the heating coil 532.

FIG. 28 is a view illustrating the operation in a case where the number of revolutions of the engine 510 is greater than a reference value in an ice removal apparatus for an outside air inflow portion according to a second embodiment of the present disclosure.

As shown in FIG. 28, the controller 5200 senses the number of revolutions of the engine 510 and compares the number of revolutions with the reference value, and determines that the amount of waste heat is sufficient when the number of revolutions of the engine 510 is greater than the reference value and supplies the electric energy to the blowing unit 5130, the heating unit 5120, and the compressing unit 5110 as well as the heating coil 532.

FIG. 29 is a view illustrating each configuration and operation of an ice removal apparatus for an outside air inflow portion according to a third embodiment of the present disclosure.

A third embodiment of the present disclosure shown in FIG. 29 further includes a current regulation unit 5300 for rectifying the electric energy generated from the thermoelectric generation module 5100.

In such a case, it is possible to adjust the current to flow constantly through the current regulation unit 5300, and supply it to each component of the ice removal apparatus. That is, the present embodiment has an advantage in that a stable electric power can be maintained by providing the current regulation unit 5300.

FIG. 30 is a view illustrating a bottom resistance reduction apparatus according to an embodiment of the present disclosure. As shown in FIG. 30, a bottom resistance reduction apparatus according to the present disclosure includes a thermoelectric generation unit 6200, a first compressor 6210, an air tank 6230, an injector 6240, and a controller 6650.

The thermoelectric generation unit 6200 may generate electric power using waste heat generated in an engine.

In a case where the engine is an engine 6100, the thermoelectric generation unit 6200 may vary electric power generation amount according to the variation amount of the exhaust gas discharged from the engine 6100.

That is, as more air and fuel are supplied to the engine 6100, the load of the engine 6100 is increased. Accordingly, since the amount of exhaust gas discharged from the engine 6100 is increased and the waste heat is increased, the amount of electric power generated from the thermoelectric generation unit 6200 may be increased.

On the other hand, if the load of the engine 6100 is reduced, the amount of exhaust gas discharged from the engine 6100 is decreased and the waste heat is decreased. Accordingly, the amount of electric power generated from the thermoelectric generation unit 6200 may be decreased.

Further, the larger a temperature difference between the waste heat of exhaust gas and a first cooling medium, the greater the amount of electric power generated from the thermoelectric generation unit 6200.

As shown in FIG. 30, the first cooling medium may flow through a first refrigerant line 6500, a first refrigerant pump 6510 may move the first cooling medium flowing through the first refrigerant line 6500, and the first refrigerant pump 6510 may be driven by a motor 6311.

The first cooling medium may be sea water or fresh water. Of course, the first cooling medium is not necessarily limited thereto, and may be an atmospheric air or a separately manufactured cooling oil.

Since the first compressor 6210 compresses air using the electric power generated by the thermoelectric generation unit 6200, no additional electric power consumption occurs.

The first compressor 6210 may be driven by a motor 6310.

Meanwhile, a conversion unit 6300 may convert the frequency of electricity supplied to the motor 6310 of the first compressor 6210 according to the electricity generated by the thermoelectric generation unit 6200.

The conversion unit 6300 is disposed between the thermoelectric generation unit 6200 and the first compressor 6210 and may receive the electricity generated by the thermoelectric generation unit 6200 and supply the electricity to the motor 6310 of the first compressor 6210.

For example, the conversion unit 6300 may increase the frequency of electricity supplied to the motor 6310 of the first compressor 6210 when the amount of electricity generated by the thermoelectric generation unit 6200 increases. Accordingly, the number of revolution of the motor 6310 increases according to the frequency of the supplied electricity, so that the amount of air compressed in the first compressor 6210 may be increased.

The air tank 6230 may store the air compressed in the first compressor 6210.

The injector 6240 may receive at least one of the compressed air generated in the first compressor 6210 and the compressed air stored in the air tank 6230, and may inject the compressed air toward the bottom of the ship to reduce frictional resistance between a hull and sea water.

As such, the air compressed in the first compressor 6210 may be supplied to at least one of the air tank 6230 and the injector 6240, and the controller 6650 may determine a transferring route of the air compressed in the first compressor 6210 according to the amount of electricity generated in the thermoelectric generation unit 6200.

The bottom resistance reduction apparatus according to the present disclosure may further include a second compressor 6220.

The second compressor 6220 may receive an external electric power and compress air. For example, the second compressor 6220 may receive electricity from a generator or a battery provided in a ship, or compress air by the rotational force supplied by the engine 6100 or the like provided separately from a main engine.

That is, the amount of air compressed in the second compressor 6220 is not proportional to the variation amount of the exhaust gas discharged from the engine 6100, and may be constant according to an external electric power.

The air compressed in the second compressor 6220 may be stored in the air tank 6230 together with the air compressed in the first compressor 6210.

The bottom resistance reduction apparatus according to the present disclosure may further include a compressed air pipe 6410, a first pipe 6420, a second pipe 6410, and a direction regulation valve 6440 in order to transfer the air compressed in the first compressor 6210 to the air tank 6230 or the injector 6240.

The compressed air pipe 6410 may provide a flow path through which the air compressed in the first compressor 6210 is transferred, The first pipe 6420 may be branched from the compressed air pipe 6410 and connected to the injector 6240, and the second pipe 6430 may be branched from the compressed air pipe 6410 and connected to the air tank 6230.

The direction regulation valve 6440 may be installed at a point where the compressed air pipe 6410 is branched to the first pipe 6420 and the second pipe 6430 and regulate a route of the compressed air so that the compressed air passes through either the first pipe 6420 or the second pipe 6430.

At this time, the controller 6650 may control the opening/closing direction of the direction regulation valve 6440.

For example, when the amount of exhaust gas discharged from the engine 6100 is reduced, the amount of air compressed in the first compressor 6210 may be small because the amount of electricity generated from the thermoelectric generation unit 6200 is small.

At this time, the air compressed in the first compressor 6210 may be transferred to the air tank 6230 by regulating the opening and closing of the direction regulation valve 6440 through the controller 6650. The air compressed in the second compressor 6220 and the air compressed in the first compressor 6210 is stored in the air tank 6230, and the injector 6240 may inject the compressed air supplied from the air tank 6230 toward the bottom.

Conversely, since the amount of electricity generated from the thermoelectric generation unit 6200 is large when the amount of exhaust gas discharged from the engine 6100 increases, the amount of air compressed by the first compressor 6210 may be larger than when the amount of exhaust gas discharged from the engine 6100 is small.

At this time, the air compressed in the first compressor 6210 may be transferred to the injector 6240 by regulating the opening and closing of the direction regulation valve 6440 through the controller 6650. The injector 6240 may inject the compressed air supplied from the first compressor 6210 and the compressed air supplied from the air tank 6230 toward the bottom.

Accordingly, in the bottom resistance reduction apparatus according to an embodiment of the present disclosure, the amount of air bubbles generated by the injector 6240 may be proportional to the amount of change in exhaust gas discharged from the engine 6100.

As shown in FIG. 31, the thermoelectric generation unit 6200 may be provided in an exhaust receiver 6630 on an exhaust flow path 6530 through which the exhaust gas flows.

Generally, the exhaust gas discharged from the engine 6100 is discharged through an exhaust valve, and the exhaust gas discharged from the exhaust valve is collected in the exhaust receiver 6630 and then discharged. Accordingly, the thermoelectric generation unit 6200 may be provided in the exhaust receiver 6630 in which the exhaust gas is collected.

As shown in FIG. 32, when the first refrigerant line 6500 surrounds the exhaust flow path 6530, one surface of the thermoelectric generation unit 6200 may be in contact with the exhaust flow path 6530, and the other surface of the thermoelectric generation unit 6200 may be in contact with the first cooling medium flowing through the first refrigerant line 6500.

Alternatively, as shown in FIG. 33, the exhaust flow path 6530 may be provided so as to surround the first refrigerant line 6500, and thus one surface of the thermoelectric generation unit 6200 may be in contact with the exhaust gas flowing through the exhaust flow path 6530, and the other surface of the thermoelectric generation unit 6200 may be in contact with the first refrigerant line 6500.

That is, the thermoelectric generation unit 6200 may produce electricity through a temperature difference between the waste heat of the exhaust gas and the first cooling medium contacting one surface and the other surface thereof, respectively.

The arrangement of the thermoelectric generation unit 6200 in the exhaust receiver 6630 is merely an example, and is not limited thereto. That is, the thermoelectric generation unit 6200 may be provided at another position on the exhaust flow path 6530.

According to the bottom resistance reduction apparatus according to an embodiment of the present disclosure, when the waste heat of the engine 6100 increases, the amount of electricity generated by the thermoelectric generation unit 6200 is increased without a separate controller. Accordingly, the amount of air compressed in the first compressor 6210 is increased, so that the amount of air bubbles injected to the bottom of a ship increases.

Since the frictional resistance to the bottom of a ship is reduced as the amount of air bubbles increases, the propulsion efficiency of the ship is increased.

FIG. 34 is a view illustrating a bottom resistance reduction apparatus according to another embodiment of the present disclosure. As shown in FIG. 34, a bottom resistance reduction apparatus according to another embodiment of the present disclosure may include a thermoelectric generation unit 6200, a cooling water thermoelectric generation unit

6600, the first compressor 6210, the second compressor 6220, the air tank 6230, the injector 6240, and the controller 6650.

The thermoelectric generation unit 6200, the first compressor 6210, the second compressor 6220, the air tank 6230, the injector 6240, and the controller 6650 are the same as or substantially similar to those of the above-described embodiment, and thus detailed description thereof will be omitted.

The cooling water thermoelectric generation unit 6600 will be described in detail with reference to FIG. 35.

The bottom resistance reduction apparatus according to another embodiment of the present disclosure may further include the first refrigerant pump 6510 provided on the first refrigerant line 6500 through which the first cooling medium flows to move the first cooling medium, and a second refrigerant pump 6620 provided on a second refrigerant line 6610 through which a second cooling medium flows to move the second cooling medium.

The first refrigerant line 6500 and the first refrigerant pump 6510 are the same as or substantially similar with those of the embodiment described above, and the second cooling medium is also same as or substantially similar with the first cooling medium of the embodiment described above, and thus a detailed description thereof will be omitted.

FIG. 35 is a view illustrating in detail a cooling water thermoelectric generation unit of a bottom resistance reduction apparatus according to another embodiment of the present disclosure. As shown in FIG. 35, one side surface of the cooling water thermoelectric generation unit 6600 may be arranged to exchange heat with a cooling water line 6630 through which the cooling water flows, and the other side surface may be arranged to exchange heat with the second refrigerant line 6610.

That is, the cooling water thermoelectric generation unit 6600 may produce electricity through a temperature difference between the cooling water for cooling the engine 6100 and the second cooling medium.

The electricity produced from the thermoelectric generation unit 6200 and the cooling water thermoelectric generation unit 6600 of the bottom resistance reduction apparatus according to another embodiment of the present disclosure may be changed according to the variation amount of the exhaust gas discharged from the engine 6100.

As explained in the embodiment described above, the load of the engine 6100 is related to the air and fuel supplied to the engine 6100. Accordingly, as the load of the engine 6100 increases, the amount of exhaust gas discharged from the engine 6100 increases, and thus the waste heat increases.

Since the thermoelectric generation unit 6200 and the cooling water thermoelectric generation unit 6600 produce electricity using the waste heat of the engine 6100, when the amount of exhaust gas discharged from the engine 6100 increases, the amount of electricity produced may increases.

Conversely, when the amount of exhaust gas discharged from the engine 6100 decreases, the amount of electricity produced from the thermoelectric generation unit 6200 and the cooling water thermoelectric generation unit 6600 may decreases.

As shown in FIG. 34, a conversion unit 6640 of the bottom resistance reduction apparatus according to another embodiment of the present disclosure may receive the electricity produced from the thermoelectric generation unit 6200 and the cooling water thermoelectric generation unit 6600, and convert the frequency of electricity supplied to at least one of the motors 6310, 6311, and 6312 for driving the first refrigerant pump 6510, the second refrigerant pump 6620, and the first compressor 6210.

The conversion unit 6640 may increase the frequency of electricity supplied to supplied to at least one of the motors 6310, 6311, and 6312 for driving the first refrigerant pump 6510, the second refrigerant pump 6620, and the first compressor 6210 when the amount of electricity generated from the thermoelectric generation unit 6200 and the cooling water thermoelectric generation unit 6600 increases.

That is, if the frequency of electricity supplied is high, the number of revolutions of the motor 6311 for driving the first refrigerant pump 6510 and the motor 6312 for driving the second refrigerant pump 6620 may be increased, and thus the moving speed of the first cooling medium and the second cooling medium may be increased, and if the number of revolutions of the motor 6310 for driving the first compressor 6210 is increased, the amount of air compressed in the first compressor 6210 may be increased.

Conversely, if the amount of electricity produced from the thermoelectric generation unit 6200 and the cooling water thermoelectric generation unit 6600 is decreased, the frequency of electricity supplied to the motor 6311 for driving the first refrigerant pump 6510 and the motor 6312 for driving the second refrigerant pump 6620, and the motor 6310 for driving the first compressor 6210 may be decreased.

That is, if the frequency of electricity supplied is low, the moving speed of the first cooling medium and the second cooling medium transferred by the first refrigerant pump 6510 and the second refrigerant pump 6620 may be increased, and the amount of air compressed in the first compressor 6210 may be also decreased.

Accordingly, according to the bottom resistance reduction apparatus according to another embodiment, no additional power consumption for driving the first refrigerant pump 6510, the second refrigerant pump 6620, and the first compressor 6210 is generated by supplying the electricity produced by the thermoelectric generation unit 6200 and the cooling water thermoelectric generation unit 6600 to at least one of the first refrigerant pump 6510, the second refrigerant pump 6620, and the first compressor 6210.

Further, since the amount of electricity supplied to the motor 6310 of the first compressor 6210 from the thermoelectric generation unit 6200 and the cooling water thermoelectric generation unit 6600 is proportional to the waste heat, the amount of air compressed in the first compressor 6210 is also proportional to the waste heat.

Accordingly, if the amount of air bubbles injected by the injector 6240 increases in proportion to the waste heat of the engine 6100, the amount of air bubbles may increase, and the waste heat decreases, the amount of air bubbles may decrease.

FIG. 36 is a view illustrating a turbocharger system of a marine structure according to an embodiment of the present disclosure. Referring to FIG. 36, a turbocharger system 7100 of a marine structure according to an embodiment of the present disclosure may include a turbine 7310, a compressor 7320, thermoelectric generation units 7210 and 7220, and a driving unit 7350.

The turbine 7310 may be connected to an exhaust pipe 730 through the exhaust gas discharged from an engine 720 flows. The turbine 7310 may be rotated by the exhaust gas flowing through the exhaust pipe 730. That is, the turbine 7310 may provide a first power using the exhaust gas of the engine 720.

The compressor 7320 may supply the air compressed by the first power of the turbine 7310 to the engine 720. In addition, an air supply unit 750 for supplying external air to the compressor 7320 may be installed. An air line 7360 is installed between the air supply unit 750 and the compressor 7320, and the air supplied from the air supply unit 750 may be transferred to the compressor 7320 along the air line 7360.

The output of the engine 720 may be increased by supplying compressed air to the engine 720 according to the operation of the turbine 7310 and the compressor 7320.

The thermoelectric generation units 7210 and 7220 may convert the heat energy generated by driving the engine 720 into electric energy. The thermoelectric generation units 7210 and 7220 may include a first thermoelectric generation unit 7210 and a second thermoelectric generation unit 7220.

The first thermoelectric generation unit 7210 is installed in the engine 720, and may include at least one first high temperature portion (not shown), at least one first low temperature portion (not shown), and at least one first semiconductor element (not shown). The first high temperature portion may be in contact with the heat generated from the engine 720, the first low temperature portion may be in contact with the cooling water supplied to the engine 720, and the first semiconductor element may be provided between the first high temperature portion and the first low temperature portion to produce electric power. That is, the first thermoelectric generation unit 7210 may produce electric power according to a temperature difference between the engine 720 and the cooling water. However, the first thermoelectric generation unit 7210 is not limited thereto and may be variously configured to produce electric power using the heat of the engine 720.

The second thermoelectric generation unit 7220 is installed on the exhaust pipe 730, and may include at least one second high temperature portion (not shown), at least one second low temperature portion (not shown), and at least one second semiconductor element (not shown). The second high temperature portion may be in contact with the heat of the exhaust gas flowing along the exhaust pipe 730, the second low temperature portion may be in contact with the cooling water supplied to the engine 720, and the second semiconductor element may be provided between the second high temperature portion and the second low temperature portion to produce electric power. That is, the second thermoelectric generation unit 7220 may produce electric power according to a temperature difference between the exhaust gas and the cooling water. However, the second thermoelectric generation unit 7220 is not limited thereto and may be variously configured to produce electric power using the heat of the exhaust gas.

Further, the second thermoelectric generation unit 7220 may be installed in a gas receiver 7400 installed on the exhaust pipe 730. The gas receiver 7400 may temporarily store the exhaust gas discharged along the exhaust pipe 730, and may reduce increase/decrease width of the pressure of the exhaust pipe 730. The second thermoelectric generation unit 7220 may convert the increased heat as the exhaust gas is stored in the gas receiver 7400 into electric power.

The driving unit 7350 may be driven by the electric power of the thermoelectric generation units 7210 and 7220. The driving unit 7350 may provide a second power using the electric power generated by the thermoelectric generation units 7210 and 7220. The driving unit 7350 may include a rotating shaft 7355 extending from a rotating shaft of the turbine 7310. Accordingly, the compressor 7320 may be operated by the rotation of the driving unit 7350.

A first conducting wire 7212 and a second conducting wire 7222 through which current flows may be installed between the driving unit 7350 and the first thermoelectric generation unit 7210, and between the driving unit 7350 and the second thermoelectric generation unit 7220, respectively. Accordingly, the driving unit 7350 may receive the electric power produced from the thermoelectric generation units 7210 and 7220.

The driving unit 7350 may include a current regulator (not shown) and a DC motor (not shown). The current regulator may maintain the current supplied from the thermoelectric generation units 7210 and 7220 at a constant value and supply the current to the DC motor.

Further, the driving unit 7350 an inverter (not shown) and a AC motor (not shown). The inverter may convert the direct current supplied from the thermoelectric generation units 7210 and 7220 into an alternating current and supply the alternating current to the AC motor.

Accordingly, the compressor 7320 may compress air using the first power or the second power. That is, the compressor 7320 receives the rotational force of the turbine 7310 and simultaneously receives the rotational force of the driving unit 7350 so that the compressed air can be supplied to the engine 720 via a compression line 7370.

As such, the turbocharger system 7100 of a marine structure according to the present embodiment can increase the amount of compressed air supplied to the engine 720 by adding the rotational force of the driving unit 7350 to the rotational force of the turbine 7310.

Further, the turbocharger system 7100 can improve the energy efficiency in a marine structure using the heat or exhaust gas generated by driving the engine 720 as energy for operating the driving unit 7350.

Meanwhile, the driving unit 7350 may rotate according to the amount of electric power produced from the thermoelectric generation units 7210 and 7220. The electric power generated by the thermoelectric generation units 7210 and 7220 may vary depending on the load of the engine 720. That is, in a case where the load of the engine 720 is high, the electric power generation in the first thermoelectric generation unit 7210 may be increased because the heat generated in the engine 720 increases, and the electric power generation in the second thermoelectric generation unit 7220 may be increased because the amount of exhaust gas generated in the engine 720 increases. In addition, the amount of compressed air supplied to the engine 720 may be determined according to the load of the engine 720. That is, in a case where the load of the engine 720 is high, the amount of compressed air required in the engine 720 is increased. Accordingly, the compressor 7320 may increase the amount of the compressed air and supply the compressed air to the engine 720 due to the increased rotational force of the driving unit 7350.

FIG. 37 is a view illustrating how to operate the turbocharger system of a marine structure shown in FIG. 36.

First, the exhaust gas generated in the engine 720 is discharged to the outside through the exhaust pipe 730.—①

At this time, the turbine 7310 is connected to the exhaust pipe 730. The turbine 7310 is rotated by the flow of the exhaust gas transferred through the exhaust pipe 730. Accordingly, the rotational force of the turbine 7310 is transmitted to the compressor 7320, and the compressor 7320 can compress air.

The exhaust gas that has passed through the turbine 7310 is temporarily stored in the gas receiver 7400.

Meanwhile, the thermoelectric generation units 7210 and 7220 provided in the engine 720 or the gas receiver 7400 produce electric power using the heat of the engine 720 or the heat of the exhaust gas. The produced power is transmitted to the driving unit 7350 along the first conducting wire 7212 or the second conducting wire 7222.

Next, the air supply unit 750 supplies air to the compressor 7320 through the air line 7360.—②

The compressor 7320 can compress air by adding the rotational force of the driving unit 7350 to the rotational force of the turbine 7310. The compressed air is transferred to the engine 720 along the compression line 7370.—③

As such, the turbocharger system 7100 of a marine structure according to the present disclosure can improve the energy efficiency of the engine 720 by increasing the amount of compressed air using the electric power produced through the heat or exhaust gas of the engine 720.

FIG. 38 is a view illustrating a turbocharger system of a marine structure according to another embodiment of the present disclosure. Other components not described in this embodiment are substantially similar to those of the above-described embodiment, and thus description thereof will be omitted. Referring to FIG. 38, a turbocharger system 7101 of a marine structure according to the present disclosure may include a plurality of turbines 7311, 7312 and 7313, a plurality of compressors 7321, 7322 and 7323, and a plurality of driving units 7351, 7352 and 7353.

The plurality of turbines 7311, 7312 and 7313 may include the first turbine 7311, the second turbine 7312 and the third turbine 7313 along the routes through which the exhaust gas are discharged.

The exhaust gas flows into the first turbine 7311 through a first connecting pipe 731 communicating with the exhaust pipe 730. The exhaust gas flows into the second turbine 7312 through a second connecting pipe 732 communicating with the exhaust pipe 730. The exhaust gas flows into the third turbine 7313 through a third connecting pipe 733 communicating with the exhaust pipe 730.

The second connecting pipe 732 communicates with the first connecting pipe 731 so that the exhaust gas that has passed through the second turbine 7312 flows into the first turbine 7311. The third connecting pipe 733 communicates with the second connecting pipe 732 so that the exhaust gas that has passed through the third turbine 7313 flows into the second turbine 7312.

A first valve 7510 for controlling the transfer of exhaust gas between the first turbine 7311 and the second turbine 7312 may be installed between the first turbine 7311 and the second turbine 7312. The first valve 7510 may be installed at a connection point where the first connecting pipe 731 and the second connecting pipe 732 are connected. The first valve 7510 may be a three way valve. The first valve 7510 may control the exhaust gas that has passed through the second turbine 7312 so as to allow or block the flow of the exhaust gas into the first turbine 7311.

A second valve 7520 for controlling the transfer of exhaust gas between the second turbine 7312 and the third turbine 7313 may be installed between the second turbine 7312 and the third turbine 7313. The second valve 7520 may be installed at a connection point where the second connecting pipe 732 and the third connecting pipe 733 are connected. Like a first valve 7510, the second valve 7520 may be a three way valve. The second valve 7520 may control the exhaust gas that has passed through the third turbine 7313 so as allow or block the flow of the exhaust gas into the second turbine 7312.

As such, the turbocharger system 7101 of a marine structure according to the present disclosure may selectively operate the first turbine 7311, the second turbine 7312 and the third turbine 7313 according to the load of the engine 720. If the load of the engine 720 is less than a first threshold value, by operating the first valve 7510 and the second valve 7520, the exhaust gas may flow into only the first turbine 7311. At this time, the first threshold value may be 30%. Accordingly, when the load of the engine 720 is small and thus the discharge amount of the exhaust gas is small, the second turbine 7312 and the third turbine 7313 may be prevented from resisting discharge of exhaust gas.

Further, if the load of the engine 720 is less than a second threshold value, the exhaust gas may flow into the first turbine 7311 and the second turbine 7312 by opening the first valve 7510 and closing the second valve 7520. At this time, the second threshold value may be 60%. Accordingly, the third turbine 7313 may be prevented from resisting discharge of exhaust gas.

As such, the turbocharger system 7101 of a marine structure according to the present disclosure may selectively operate the first turbine 7311, the second turbine 7312 and the third turbine 7313 according to the load of the engine 720 by opening and closing the first valve 7510 and the second valve 7520.

The plurality of compressors 7321, 7322 and 7323 may include the first compressor 7321, the second compressor 7322 and the third compressor 7323 so as to correspond to the first turbine 7311, the second turbine 7312 and the third turbine 7313, respectively.

The first compressor 7321 may receive external air along the air line 7360 communicating with the air supply unit 750. The first compressor 7321 may compress air by the rotational force of the first turbine 7311. The air compressed by the first compressor 7321 may be supplied to the engine 720 or transferred to the second compressor 7322.

The second compressor 7322 may receive the compressed air from the first compressor 7321. The second compressor 7322 may further compress the compressed air by the rotational force of the second turbine 7312. The air compressed by the second compressor 7322 may be supplied to the engine 720 or transferred to the third compressor 7323.

The third compressor 7323 may receive the compressed air from the second compressor 7322. The third compressor 7323 may further compress the compressed air by the rotational force of the third turbine 7313. The air compressed by the third compressor 7323 may be supplied to the engine 720.

Meanwhile, the turbocharger system 7101 of a marine structure according to the present embodiment may further include heat exchangers 7381, 7382 and 7383 installed on the routes through which the compressed air is supplied to the engine 720.

The heat exchangers 7381, 7382 and 7383 may include the first heat exchanger 7381, the second heat exchanger 7382, and the third heat exchanger 7383 into which the compressed air having passed through the first compressor 7321, the second compressor 7322 and the third compressor 7323 flow, respectively.

The first heat exchanger 7381, the second heat exchanger 7382, and the third heat exchanger 7383 may lower the temperature of the compressed air, and may be in contact with the cooling water supplied to the engine 720 although not shown in the drawing. The first heat exchanger 7381, the second heat exchanger 7382, and the third heat exchanger 7383 may lower the temperature of the compressed air by exchanging heat between the compressed air and the cooling water.

The first heat exchanger 7381 may receive the compressed air along a first compressed air line 7361 connected to the first compressor 7321. The second heat exchanger 7382 may receive the compressed air along a second compressed air line 7362 connected to the second compressor 7322. The third heat exchanger 7381 may receive the compressed air along a third compressed air line 7363 connected to the third compressor 7323.

As such, the turbocharger system 7101 of a marine structure according to the present disclosure may improve the efficiency of the engine 720 by lowering the temperature of the compressed air supplied to the engine 720 through the first heat exchanger 7381, the second heat exchanger 7382, and the third heat exchanger 7383.

Further, a third valve 7530 for controlling the transfer of air between the first compressor 7321 and the second compressor 7322 may be provided. The third valve 7530 may selectively supply the compressed air having passed through the first compressor 7321 and the first heat exchanger 7381 to the engine 720 or the second compressor 7322.

Further, a fourth valve 7540 for controlling the transfer of air between the second compressor 7322 and the third compressor 7323 may be provided. The fourth valve 7540 may selectively supply the compressed air having passed through the second compressor 7322 and the second heat exchanger 7382 to the engine 720 or the third compressor 7323.

As such, the turbocharger system 7101 of a marine structure according to the present disclosure may selectively operate the first compressor 7321, the second compressor 7322 and the third compressor 7323 according to the load of the engine 720. That is, if the load of the engine 720 is less than the first threshold value, by operating the third valve 7530 and the fourth valve 7540, the air compressed by passing through the first compressor 7321 may be supplied to the engine 720 without passing through the second compressor 7322 and the third compressor 7323. That is, when only the first turbine 7311 is operated, only the first compressor 7321 corresponding to the first turbine 7311 may be operated.

Further, if the load of the engine 720 is less than the second threshold value, by opening the third valve 7530 and closing the fourth valve 7540, the air compressed by passing through the first compressor 7321 may be supplied to the engine 720 via the second compressor 7322 without passing through the third compressor 7323. That is, the second compressor 7322 corresponding to the second turbine 7312 may be operated.

Further, the first valve 7510 and the third valve 7530 may be opened and closed in the same manner, and the second valve 7520 and the fourth valve 7540 may be opened and closed in the same manner.

As such, the turbocharger system 7101 of a marine structure according to the present disclosure may selectively operate the first compressor 7321, the second compressor 7322 and the third compressor 7323 according to the load of the engine 720 by opening and closing the third valve 7530 and the fourth valve 7540.

Meanwhile, a driving mean applied to the turbocharger system 7101 of a marine structure according to the present disclosure may include the first driving unit 7351, the second driving unit 7352, and the third driving unit 7353 so as to correspond to the first compressor 7321, the second compressor 7322, and the third compressor 7323.

The electric power generated by the thermoelectric generation units 7210 and 7220 may vary depending on the load of the engine 720. That is, in a case where the load of the engine 720 is high, the electric power generation in the first thermoelectric generation unit 7210 may be increased because the heat generated in the engine 720 increases, and the electric power generation in the second thermoelectric generation unit 7220 may be increased because the amount of exhaust gas generated in the engine 720 increases.

Further, the thermoelectric generation units 7210 and 7220 may supply the electric power generated according to the load of the engine 720 to the first driving unit 7351, the second driving unit 7352 or the third driving unit 7353, respectively.

The first conducting wire 7212 and the second conducting wire 7222 through which current flows may be installed between the first driving unit 7351 and the first thermoelectric generation unit 7210, and between the first driving unit 7351 and the second thermoelectric generation unit 7220, respectively. A third conducting wire 7224 connecting from the first conducting wire 7212 and the second conducting wire 7222 to the second driving unit 7352 may be provided. In addition, a fourth conducting wire 7226 connecting from the third conducting wire 7224 to the third driving unit 7353 may be provided.

Further, a first switch 7131 may be installed on the third conducting wire 7224. The first switch 7131 may close the third conducting wire 7224 when the load of the engine 720 is less than the first threshold value. The second switch 7232 may be also installed on the fourth conducting wire 7226. The second switch 7232 may close the fourth conducting wire 7226 when the load of the engine 720 is less than the first threshold value. That is, the first switch 7131 may be opened and closed in the same manner as the first valve 7510 and the third valve 7530, and the second switch 7232 may be opened and closed in the same manner as the second valve 7520 and the fourth valve 7540.

As such, the turbocharger system 7101 of a marine structure according to the present disclosure may supply the electric power generated from the thermoelectric generation units 7210 and 7220 to the first driving unit 7351, the second driving unit 7352, and the third driving unit 7353, respectively, by operating the first switch 7131 and the second switch 7232 according to the load of the engine 720. That is, the turbocharger system 7101 may supply compressed air to the engine 720 efficiently by selectively operating the first compressor 7321, the second compressor 7322 and the third compressor 7323 according to the amount of electric power generated from the thermoelectric generation units 7210 and 7220.

FIG. 39 is a view illustrating how to operate the turbocharger system of a marine structure shown in FIG. 38.

First, the exhaust gas generated from the engine 720 may be discharged to the outside through the exhaust pipe 730. At this time, the exhaust gas generated from the engine 720 flows into the first turbine 7311 via the first branch pipe 731 branched from the exhaust pipe 730. The exhaust gas introduced into the first turbine 7311 may rotate the first turbine 7311. If the load of the engine 720 is less than the first threshold value, the first valve 7510 and the second valve 7520 are operated so that the exhaust gas does not pass through the second turbine 7312 and the third turbine 7313.—①

Meanwhile, if the load of the engine 720 is less than the second threshold value, the first valve 7510 and the second valve 7520 are operated so that the exhaust gas does not pass through the third turbine 7313 and is supplied to the second turbine 7312. That is, the exhaust gas generated from the engine 720 flows into the second turbine 7312 via the second branch pipe 732 branched from the exhaust pipe 730. The exhaust gas introduced into the second turbine 7312 may rotate the second turbine 7312. The exhaust gas that has passed through the second turbine 7312 flows into the first turbine 7311 again.—②

Meanwhile, if the load of the engine 720 is more than the second threshold value, the first valve 7510 and the second valve 7520 are operated so that the exhaust gas is supplied to the third turbine 7313. That is, the exhaust gas generated from the engine 720 flows into the third turbine 7313 via the third branch pipe 733 branched from the exhaust pipe 730. The exhaust gas introduced into the third turbine 7313 may rotate the third turbine 7313. The exhaust gas that has passed through the third turbine 7313 flows into the second turbine 7312 again.—③

Also, the air supply unit 750 supplies air to the first compressor 7321 through the air line 7360.—④

The first compressor 7321 may compress air by the rotational force of the first turbine 7311. The compressed air may be passed through the first heat exchanger 7381 along the first compressed air line 7361 and then transferred to the engine 720 along an engine line 7374. Herein, if the load of the engine 720 is less than the first threshold value, the third valve 7530 and the fourth valve 7540 are operated so that the compressed air does not flow into the second compressor 7322 and the third compressor 7323.—⑤

Further, if the load of the engine 720 is less than the second threshold value, the air compressed in the first compressor 7321 may flow into the second compressor 7322 by opening the third valve 7530 and closing the fourth valve 7540. The air compressed by the second compressor 7322 may be transferred to the engine 720 through the second compressed air line 7362 and the engine line 7374.—⑥

Further, if the load of the engine 720 is more than the second threshold value, the air compressed in the second compressor 7322 may flow into the third compressor 7323 by operating the fourth valve 7540. The air compressed by the third compressor 7323 may be transferred to the engine 720 through the third compressed air line 7363 and the engine line 7374.—⑦

Meanwhile, the electric power produced in the thermoelectric generation units 7210 and 7220 is transferred to the first driving unit 7351 along the first conducting wire 7212 or the second conducting wire 7222.

At this time, if the load of the engine 720 is less than the first threshold value, the third conducting wire 7224 is short-circuited by operating the first switch 7131. Accordingly, the electric power produced in the thermoelectric generation units 7210 and 7220 is not supplied to the second driving unit 7352 and the third driving unit 7353. That is, the electric power produced in the thermoelectric generation units 7210 and 7220 drives the first driving unit 7351 and thus only the first compressor 7321 produces compressed air.

Further, if the load of the engine 720 is less than the second threshold value, the fourth conducting wire 7226 is short-circuited by operating the second switch 7232. Accordingly, the electric power produced in the thermoelectric generation units 7210 and 7220 is supplied to the first driving unit 7351 and the second driving unit 7352. That is, the first compressor 7321 and the second compressor 7322 are operated by the first driving unit 7351 and the second driving unit 7352 and thus compressed air may be supplied to the engine 720.

Finally, if the load of the engine 720 is more than the second threshold value, the second switch 7232 is operated to connect the fourth conducting wire 7226. Accordingly, the electric power produced in the thermoelectric generation units 7210 and 7220 is supplied to the first driving unit 7351, the second driving unit 7352 and the third driving unit 7353.

As such, the turbocharger system 7101 of a marine structure according to the present embodiment may control the second driving unit 7352 and the third driving unit 7353, respectively, and thus may use the electric power generated in the thermoelectric generation units 7210 and 7220 efficiently.

FIG. 40 is a view illustrating an engine of a ship and an exhaust gas discharge route.

As shown in FIG. 40, the exhaust gas generated in an engine 810 of a ship 81 is discharged to the outside through the exhaust pipe 820, and thus various waste heat generating sources may be provided between the exhaust gas discharge paths from the engine 810.

In a case of this disclosure, thermoelectric generation modules 8100*a* and 8100*b* having one or more thermoelectric elements are provided on the waste heat source generating source, to convert waste heat into electric energy.

The thermoelectric generation modules 8100*a* and 8100*b*, which generate electricity through a temperature difference between the heating mediums, may be provided on a waste heat generating source existing between the engine 810 of the ship 81 and an exhaust gas discharge route.

One side of the thermoelectric generation modules 8100*a* and 8100*b* may be in contact with the waste heat generating source and the other side of the thermoelectric generation modules 8100*a* and 8100*b* may be in contact with a heat medium transfer unit (not shown) through which a heat medium having a temperature difference from the waste heat generating source flows.

A heat medium having a temperature difference from the waste heat generating source may be sea water, fresh water or the outside air of a ship, but is not limited thereto.

FIG. 40 shows that the thermoelectric generation modules 8100*a* and 8100*b* are provided on an exhaust gas discharge pipe 820 and an economizer 815 to recover waste heat, but the present invention is not limited thereto, and the waste heat generating source may include at least one of various components such as an engine 810 besides the exhaust gas discharge pipe 820 and the economizer 815.

In the following embodiment, the thermoelectric generation modules 8100*a* and 8100*b* are provided on the exhaust gas discharge pipe 820 and the economizer 815.

Meanwhile, a thrust auxiliary apparatus of the present disclosure includes a governor for applying additional power to a motor that rotates the crankshaft of the engine 810 using the electric energy generated from the thermoelectric generation module 8100.

Hereinafter, specific embodiments thereto will be described.

FIG. 41 is a view illustrating each configuration and operation of a thrust auxiliary apparatus according to a first embodiment of the present disclosure.

As shown in FIG. 41, a thrust auxiliary apparatus according to a first embodiment of the present disclosure includes the thermoelectric generation module 8100*a* provided on the exhaust gas discharge pipe 820, the thermoelectric generation module 8100*b* provided on the economizer 815, and a speed governor 840.

That is, the exhaust gas generated in the engine 810 flows to and is discharged from the exhaust gas discharge pipe 820, and the economizer 815 using waste heat of the exhaust gas in this process is provided. Further, each of the thermoelectric generation modules 8100*a* and 8100*b* generates electric energy using the waste heat generated in the economizer 815 and the exhaust gas discharge pipe 820, and supplies the electric energy to the speed governor 840.

The speed governor 840 receives the electrical energy generated from the thermoelectric generation modules 8100a and 8100b and provides additional power to the engine 810. For example, the speed governor 840 applies the electric energy generated from the thermoelectric generation modules 8100a and 8100b to a motor 830 that rotates a crankshaft 832 of the engine 810, and the motor 830 generates additional power to be transmitted to a propeller 834 that generates a propulsion force on a ship.

That is, the present disclosure has the advantage of minimizing the consumption of energy and assisting an additional thrust of the ship depending on the situation because the electric energy may be generated using the waste heat of the ship.

The present invention also has the advantage that when an additional thrust is applied, the number of revolutions of the engine 810 increases, and thus the amount of waste heat and the generation amount of electric energy generated is further increased, and the amount of thrust that can be supplied is also increased.

FIG. 42 is a view illustrating the operation in a case where the number of revolutions of a motor is equal to or more than a reference value in a thrust auxiliary apparatus according to a second embodiment of the present disclosure.

In a case of a second embodiment of the present disclosure shown in FIG. 42, a rotation sensing unit 850 for sensing the number of revolutions of the motor 830 is further provided. That is, in the present embodiment, the speed governor 840 may apply an additional power to the motor 830 so as to correspond to the sensing result of the rotation sensing unit 850.

The reason for doing this is to utilize the electrical energy generated through the thermoelectric generation modules 8100a and 8100b for other components when a separate thrust is not required for the ship, and is to match the number of revolutions of the crankshaft 832 with the number of revolutions of the motor 830.

The present embodiment shows a case where the number of revolutions of the motor 830 is equal to or greater than a reference value by the rotation sensing unit 850, which indicates a situation in which auxiliary thrust is not required. The speed governor 840 may compare the number of revolutions of the motor 830 inputted from the rotation sensing unit 850 with the reference value, and supply the electrical energy generated by the thermoelectric generation modules 8100a and 8100b to other component 860 provided in the ship when the number of revolutions of the motor 830 is equal to or greater than the reference value. The other component 860 may be composed of various electric devices provided in the ship.

Accordingly, the speed governor 840 may stop the supply of electric energy to the motor 830.

FIG. 43 is a view illustrating another type of operation in a case where the number of revolutions of a motor is equal to or more than a reference value in a thrust auxiliary apparatus according to a second embodiment of the present disclosure.

FIG. 43 shows a case where the number of revolutions of the motor 830 is equal to or greater than a reference value by the rotation sensing unit 850, which is the same as in FIG. 42, but in this situation, the speed governor 840 may supply only a part of the electric energy generated from the thermoelectric generation modules 8100a and 8100b to the motor 830, and supply the remaining electric energy to the other component 860 provided in the ship.

That is, in the case of FIG. 43, only a small amount of thrust is generated, and the remaining electric energy may be utilized for other components. This may be selectively performed according to the number of revolutions of the motor 830.

FIG. 44 is a view disclosure each configuration and operation of a thrust auxiliary apparatus according to a third embodiment of the present disclosure.

A third embodiment of the present disclosure shown in FIG. 44 is the same as the embodiments described above in that the thermoelectric generation modules 8100a and 8100b are provided on the exhaust gas discharge pipe 820 and the economizer 815, respectively.

However, the present embodiment differs from the above-described embodiments in that the thermoelectric generation module 8100b provided on the economizer 815 supplies electric energy to the speed governor 840 and the thermoelectric generation module 8100a provided on the exhaust gas discharge pipe 820 supplies electric energy to the other component 860 in a ship.

That is, as in the present embodiment, some parts of the thermoelectric generation modules 8100a and 8100b provided on the plurality of waste heat generating sources may transmit electric energy to the speed governor 840, and the remaining parts of the thermoelectric power generation modules 8100a and 8100b provided on the plurality of waste heat generating sources may transmit electrical energy to other components provided in the ship.

It will be apparent to those skilled in the art that the present disclosure may be embodied in other specific forms without departing from the spirit or scope of the disclosure as defined in the appended claims. Therefore, the above-described embodiments are to be considered as illustrative rather than restrictive, and the present disclosure is not limited to the above description, but may be modified within the scope of the appended claims and equivalents thereof.

The invention claimed is:
1. A waste heat recovery system comprising:
a plurality of thermoelectric generators configured to produce electric power using the heat of a plurality of engines and having a plurality of thermoelectric generation units which are connected in parallel;
a first transformer connected with the thermoelectric generators in series, the first transformer configured to convert the electric power produced by the thermoelectric generators; and
a second transformer connected with the first transformer in parallel and connected with one or more of the thermoelectric generators in series, the second transformer configured to convert the electric power produced by the one or more of the thermoelectric generators,
wherein the plurality of engines comprise a first engine configured to provide a propulsion force to a marine structure, and a second engine configured to produce electric power and connected with the second transformer, and a third engine and a fourth engine configured to produce electric power and connected to each other in parallel, and
wherein at least one of the second engine, the third engine, and the fourth engine is connected to both of the first transformer and the second transformer, and another of the second engine, the third engine, and the fourth engine is connected only to the second transformer.
2. The waste heat recovery system according to claim 1, wherein the plurality of thermoelectric generators comprise a first thermoelectric generator and a second thermoelectric generator installed in the third engine and the fourth engine, respectively, and wherein the fourth engine is configured to produce electric power in the fourth engine and the second thermoelectric generator when the second engine or the third engine operating at a first load is stopped.

3. The waste heat recovery system according to claim 2, wherein an engine that is in operation among the second engine, the third engine, or the fourth engine is configured to operate at a second load when any one of the second engine, the third engine and the fourth engine operating at a third load less than the second load is stopped.

4. The waste heat recovery system according to claim 1, wherein the waste heat recovery system comprises:

a gas receiver for temporarily storing exhaust gas generated from the engine; and a gas receiving thermoelectric generator installed inside the gas receiver.

5. The waste heat recovery system according to claim 4, wherein the gas receiving thermoelectric generator comtrises:

a first flow path which cooling water flows;

a second flow path which exhausts gas flows; and a thermoelectric element disposed between the first flow path and the second flow path to produce electric power by a temperature difference between the cooling water and the exhaust gas, wherein the first flow path and the second flow path are arranged such that the flow direction of the cooling water flowing through the first flow path and the flow direction of the exhaust gas flowing through the second flow path are perpendicular to each other.

* * * * *